(12) United States Patent  
Yamazaki et al.

(10) Patent No.: US 8,183,067 B2  
(45) Date of Patent: May 22, 2012

(54) METHOD FOR MANUFACTURING DISPLAY DEVICE INCLUDING LASER IRRADIATION AND SELECTIVE REMOVING OF A LIGHT ABSORBER LAYER

(75) Inventors: Shunpei Yamazaki, Tokyo (JP); Koichiro Tanaka, Kanagawa (JP); Hironobu Shoji, Tokyo (JP); Ikuko Kawamata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 734 days.

(21) Appl. No.: 11/881,233

(22) Filed: Jul. 26, 2007

(65) Prior Publication Data

US 2008/0182349 A1   Jul. 31, 2008

(30) Foreign Application Priority Data

Jul. 28, 2006   (JP) ................................ 2006-205711

(51) Int. Cl.
  *H01L 21/00* (2006.01)
  *H01L 21/44* (2006.01)
(52) U.S. Cl. .......................................... 438/29; 438/675
(58) Field of Classification Search .................... 438/29, 438/675; 257/E21.001
  See application file for complete search history.

(56) References Cited

U.S. PATENT DOCUMENTS

| | | | |
|---|---|---|---|
| 4,594,471 A | 6/1986 | Yamazaki | |
| 4,603,470 A | 8/1986 | Yamazaki | |
| 4,752,455 A | 6/1988 | Mayer | |
| 4,861,964 A | 8/1989 | Sinohara | |
| 4,895,735 A | 1/1990 | Cook | |
| 4,970,196 A | 11/1990 | Kim et al. | |
| 4,987,006 A | 1/1991 | Williams et al. | |
| 5,035,202 A | 7/1991 | Nishikawa et al. | |
| 5,171,650 A | 12/1992 | Ellis et al. | |
| 5,173,441 A | 12/1992 | Yu et al. | |
| 5,292,559 A | 3/1994 | Joyce, Jr. et al. | |
| 5,292,686 A * | 3/1994 | Riley et al. | 438/605 |

(Continued)

FOREIGN PATENT DOCUMENTS

JP   2000-133636   5/2000

(Continued)

OTHER PUBLICATIONS

"Statistical Process Control", http://en.wikipedia.org/wiki/Statistical_process_control. See Appendix of Rejection.*

*Primary Examiner* — William M. Brewster  
(74) *Attorney, Agent, or Firm* — Husch Blackwell LLP

(57) ABSTRACT

A display device which can be manufactured with improved material use efficiency and through a simplified manufacturing process, and a manufacturing technique thereof. A light-absorbing layer is formed, an insulating layer is formed over the light-absorbing layer, the light-absorbing layer and the insulating layer are selectively irradiated with laser light to remove an irradiated region of the insulating layer so that a first opening is formed in the insulating layer, and the light-absorbing layer is selectively removed by using the insulating layer having the first opening as a mask so that a second opening is formed in the insulating layer and the light-absorbing layer. A conductive film is formed in the second opening to be in contact with the light-absorbing layer, thereby electrically connecting to the light-absorbing layer with the insulating layer interposed therebetween.

35 Claims, 39 Drawing Sheets

U.S. PATENT DOCUMENTS

| | | | |
|---|---|---|---|
| 5,313,043 | A | 5/1994 | Yamagishi |
| 5,373,627 | A | 12/1994 | Grebe |
| 5,480,097 | A | 1/1996 | Carter, Jr. et al. |
| 5,501,938 | A | 3/1996 | Ellis et al. |
| 5,567,336 | A | 10/1996 | Tatah |
| 5,587,822 | A | 12/1996 | Lee |
| 5,683,601 | A | 11/1997 | Tatah |
| 5,708,252 | A | 1/1998 | Shinohara et al. |
| 5,712,206 | A | 1/1998 | Chen |
| 5,935,462 | A | 8/1999 | Tatah |
| 5,958,268 | A | 9/1999 | Engelsberg et al. |
| 6,048,588 | A | 4/2000 | Engelsberg |
| 6,149,988 | A | 11/2000 | Shinohara et al. |
| 6,159,832 | A | 12/2000 | Mayer |
| 6,177,151 | B1 | 1/2001 | Chrisey et al. |
| 6,261,856 | B1 | 7/2001 | Shinohara et al. |
| 6,335,151 | B1 | 1/2002 | Ausschnitt et al. |
| 6,396,147 | B1 * | 5/2002 | Adachi et al. ............... 257/758 |
| 6,462,723 | B1 | 10/2002 | Yamazaki et al. |
| 6,597,509 | B2 | 7/2003 | Takakuwa |
| 6,600,534 | B1 | 7/2003 | Tanaka et al. |
| 6,603,453 | B2 | 8/2003 | Yamazaki et al. |
| 6,690,081 | B2 | 2/2004 | Bakir et al. |
| 6,726,517 | B2 | 4/2004 | Yamada et al. |
| 6,762,124 | B2 | 7/2004 | Kian et al. |
| 6,878,608 | B2 | 4/2005 | Brofman et al. |
| 6,887,804 | B2 | 5/2005 | Sun et al. |
| 6,960,787 | B2 | 11/2005 | Yamazaki et al. |
| 6,962,837 | B2 | 11/2005 | Yamazaki |
| 6,964,887 | B2 | 11/2005 | Akagawa |
| 7,062,849 | B2 | 6/2006 | Ohashi et al. |
| 7,176,069 | B2 | 2/2007 | Yamazaki et al. |
| 7,187,495 | B2 | 3/2007 | Shimizu |
| 7,199,516 | B2 | 4/2007 | Seo et al. |
| 7,202,155 | B2 | 4/2007 | Fukuchi |
| 7,226,819 | B2 | 6/2007 | Maekawa et al. |
| 7,233,439 | B2 | 6/2007 | Shimizu |
| 7,247,882 | B2 | 7/2007 | Yamazaki et al. |
| 7,354,798 | B2 | 4/2008 | Pogge et al. |
| 7,377,656 | B2 | 5/2008 | Nojima et al. |
| 7,542,301 | B1 | 6/2009 | Liong et al. |
| 7,732,334 | B2 | 6/2010 | Morisue et al. |
| 2002/0056838 | A1 | 5/2002 | Ogawa |
| 2002/0089628 | A1 | 7/2002 | Jang et al. |
| 2002/0127844 | A1 | 9/2002 | Grill et al. |
| 2002/0141067 | A1 | 10/2002 | Takakuwa et al. |
| 2002/0158337 | A1 | 10/2002 | Babich et al. |
| 2003/0001832 | A1 | 1/2003 | Yamazaki et al. |
| 2003/0048399 | A1 | 3/2003 | Okumura |
| 2003/0063210 | A1 | 4/2003 | Tsuboi |
| 2004/0012071 | A1 | 1/2004 | Ido et al. |
| 2004/0048415 | A1 * | 3/2004 | Horie ............................ 438/106 |
| 2004/0080481 | A1 | 4/2004 | Yamazaki et al. |
| 2004/0262768 | A1 | 12/2004 | Cho et al. |
| 2005/0043186 | A1 | 2/2005 | Maekawa et al. |
| 2005/0083571 | A1 | 4/2005 | Shimizu |
| 2005/0083572 | A1 | 4/2005 | Shimizu |
| 2005/0158929 | A1 | 7/2005 | Yamazaki et al. |
| 2005/0185382 | A1 | 8/2005 | Ooi et al. |
| 2005/0275049 | A1 * | 12/2005 | Kirby et al. ................... 257/433 |
| 2006/0017153 | A1 | 1/2006 | Choi |
| 2006/0028622 | A1 | 2/2006 | Nojima et al. |
| 2006/0030152 | A1 | 2/2006 | Yoshimura et al. |
| 2006/0046336 | A1 | 3/2006 | Shoji et al. |
| 2006/0049156 | A1 * | 3/2006 | Mulloy et al. ........... 219/121.71 |
| 2006/0099747 | A1 | 5/2006 | Park |
| 2006/0158482 | A1 | 7/2006 | Nakamura et al. |
| 2006/0214156 | A1 | 9/2006 | Pan et al. |
| 2006/0223242 | A1 | 10/2006 | Daubenspeck et al. |
| 2006/0258122 | A1 | 11/2006 | Whitefield et al. |
| 2006/0270175 | A1 | 11/2006 | Aoki et al. |
| 2007/0007515 | A1 | 1/2007 | Suh et al. |
| 2007/0023860 | A1 | 2/2007 | Kim et al. |
| 2007/0051952 | A1 | 3/2007 | Yamazaki et al. |
| 2007/0085938 | A1 | 4/2007 | Yamazaki et al. |
| 2007/0117280 | A1 | 5/2007 | Lee et al. |
| 2008/0026543 | A1 | 1/2008 | Miyairi et al. |
| 2008/0042288 | A1 | 2/2008 | Yamazaki et al. |
| 2008/0044744 | A1 | 2/2008 | Yamazaki et al. |
| 2008/0050851 | A1 | 2/2008 | Tanaka et al. |
| 2008/0057618 | A1 | 3/2008 | Honda et al. |
| 2008/0057632 | A1 | 3/2008 | Arai et al. |
| 2008/0057718 | A1 | 3/2008 | Omata et al. |
| 2008/0099877 | A1 | 5/2008 | Daubenspeck et al. |
| 2008/0227232 | A1 | 9/2008 | Yamazaki et al. |
| 2009/0040400 | A1 | 2/2009 | Nakagawa et al. |
| 2009/0152743 | A1 | 6/2009 | Jomaa et al. |
| 2010/0060553 | A1 | 3/2010 | Zimmerman et al. |

FOREIGN PATENT DOCUMENTS

| | | |
|---|---|---|
| JP | 2000-252609 | 9/2000 |
| JP | 2002-164591 | 6/2002 |
| JP | 2004-286466 | 10/2004 |

* cited by examiner

FIG. 12A
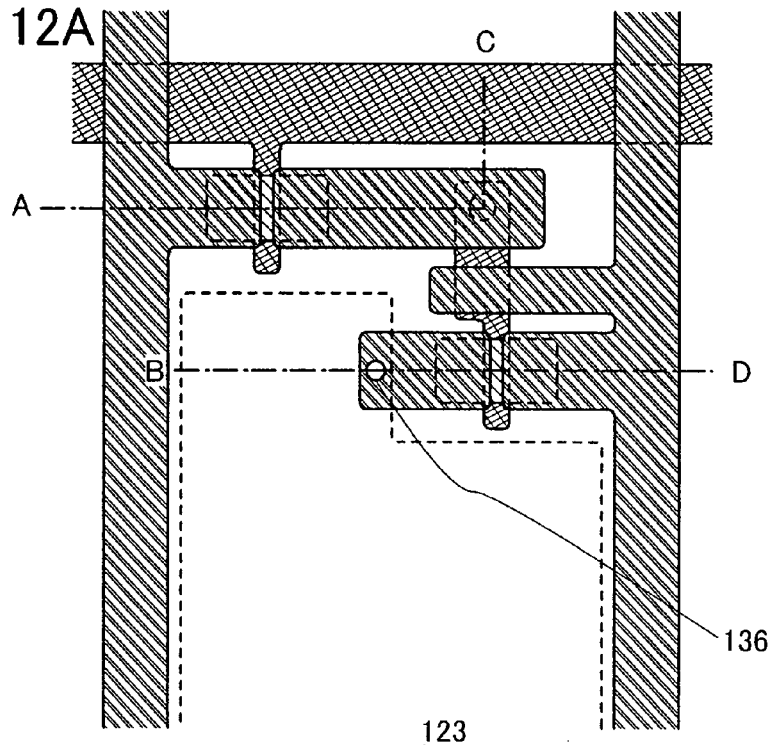
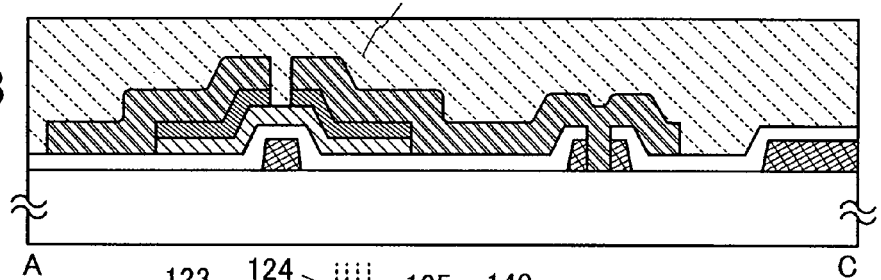
FIG. 12B
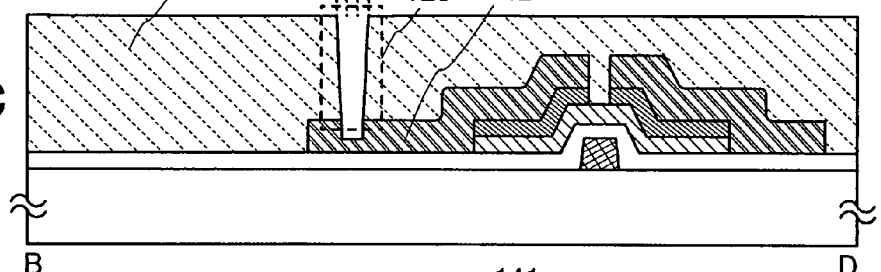
FIG. 12C
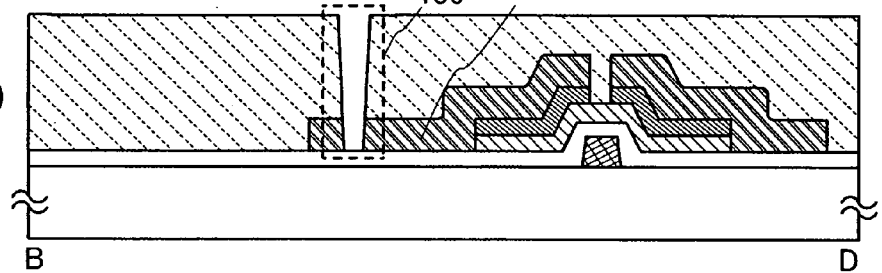
FIG. 12D

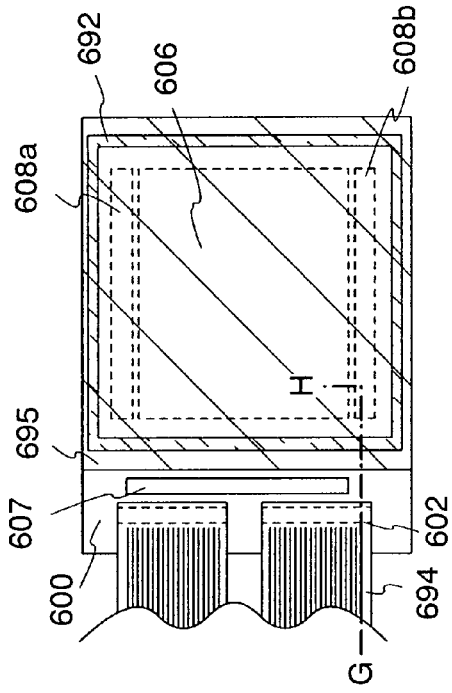
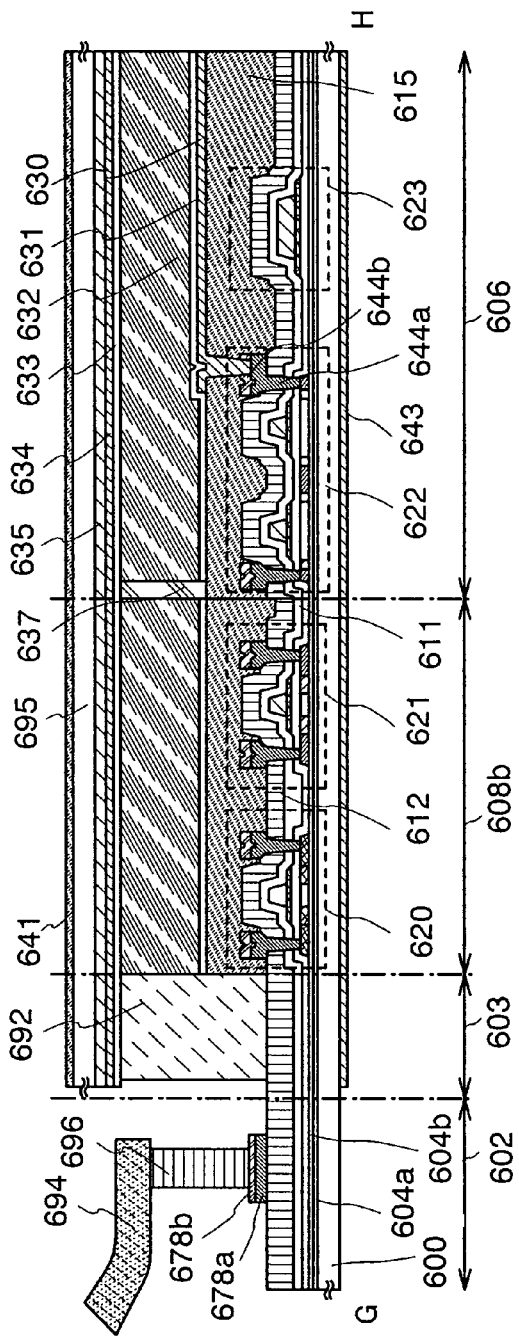
FIG. 19A
FIG. 19B

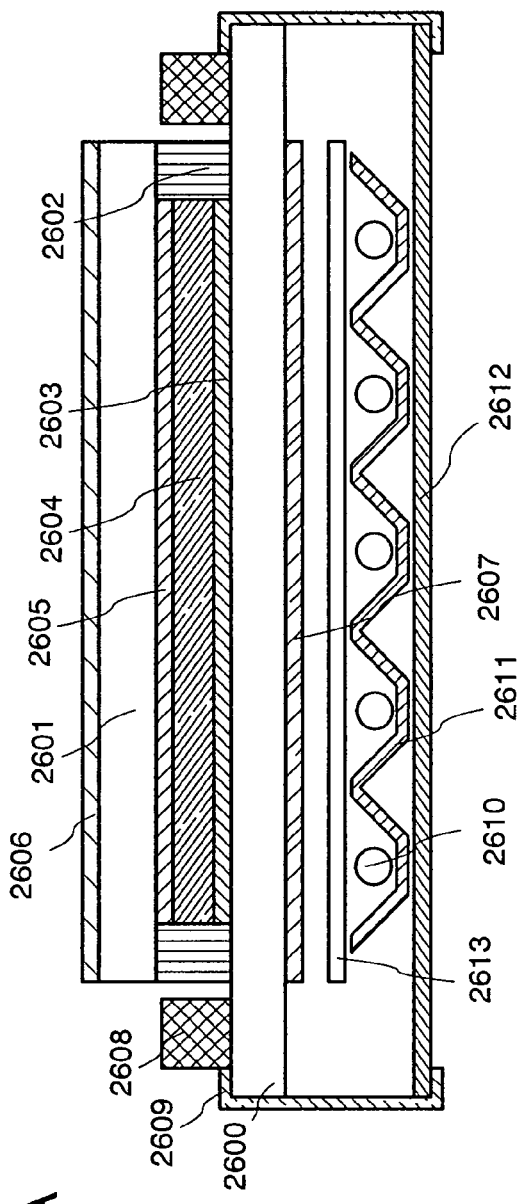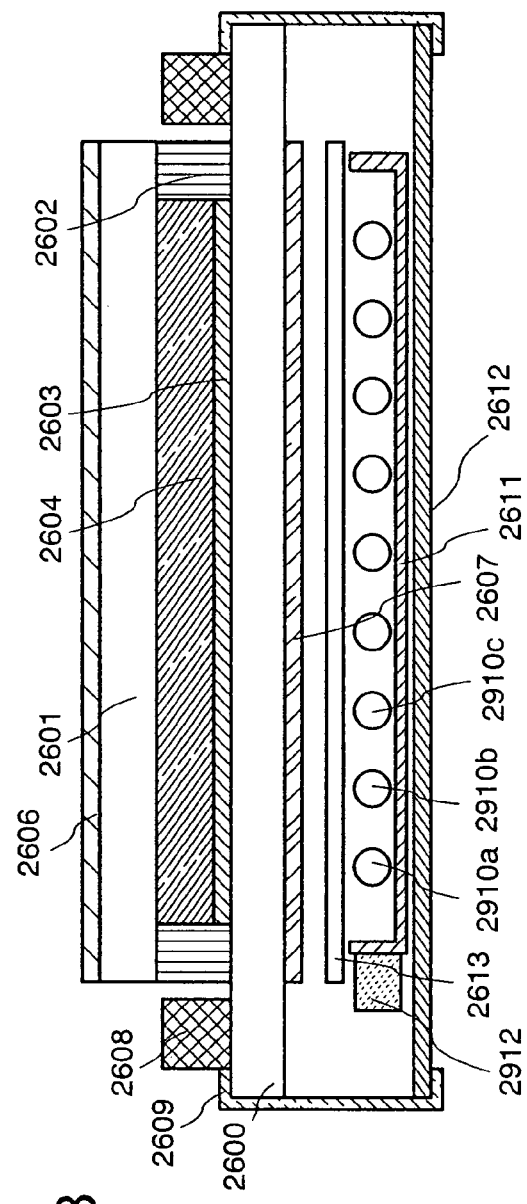
FIG. 20A
FIG. 20B 8500
8501
8502

METHOD FOR MANUFACTURING DISPLAY DEVICE INCLUDING LASER IRRADIATION AND SELECTIVE REMOVING OF A LIGHT ABSORBER LAYER

BACKGROUND OF THE INVENTION

1. Field of the Invention

The present invention relates to a method for manufacturing a display device having a stacked-layer structure of thin films, and specifically relates to a process of forming an opening in a thin film in a process of manufacturing a display device.

2. Description of the Related Art

Each of a thin film transistor (hereinafter also referred to as a "TFT") and an electronic circuit using the thin film transistor is manufactured as follows: various thin films such as a semiconductor film, an insulating film, and a conductive film are stacked over a substrate, and a predetermined pattern is formed by a photolithography technique as appropriate. The photolithography technique is a technique in which a pattern of a circuit or the like which is formed of a material which does not transmit light over a transparent flat plate, a so-called photomask, is transferred to a substrate, by using light. It has been widely used in a process of manufacturing a semiconductor integrated circuit or the like.

A conventional manufacturing process using the photolithography technique requires multiple steps including exposure, development, baking, and peeling only for treating a mask pattern formed of a photosensitive organic resin material called a photoresist. Therefore, the manufacturing cost is inevitably increased as the number of the photolithography processes is increased. In order to solve such a problem, it has been attempted to manufacture a TFT with a smaller frequency of photolithography processes (Reference 1: Japanese Published Patent Application No. 2000-133636). In Reference 1, after a resist mask formed by a photolithography process is used once, it is swelled to expand volume and then used again as a resist mask having a different shape.

SUMMARY OF THE INVENTION

It is an object of the present invention to provide a technique which is capable of manufacturing a TFT, and an electronic circuit and a display device using the TFT at low cost with a high yield even over a large substrate having a side of 1 meter or longer, in which the frequency of photolithography processes is reduced in a manufacturing process to simplify the manufacturing process.

In the present invention, in the case where thin films (each of which is a conductive layer or a semiconductor layer) which are stacked with an insulating layer interposed therebetween are electrically connected to each other, an opening (a so-called contact hole) is formed in the insulating layer. In the present invention, the opening (contact hole) in which the thin films provided with the insulating layer interposed therebetween are electrically connected to each other is formed by a plurality of steps. First, without forming a mask layer over the insulating layer, a first opening is selectively formed by laser light irradiation in the insulating layer (or the insulating layer and a light-absorbing layer). The light-absorbing layer is removed using the insulating layer (or the insulating layer and the light-absorbing layer) having the first opening as a mask, so that a second opening is formed in the light-absorbing layer and the insulating layer.

After a light-absorbing layer having a function of absorbing irradiated light is formed and an insulating layer is stacked over the light-absorbing layer, a region of the stacked layer of the light-absorbing layer and the insulating layer, in which a first opening is to be formed, is selectively irradiated with laser light from an insulating layer side. Although the laser light is transmitted through the insulating layer, it is absorbed in the light-absorbing layer. The light-absorbing layer is heated by energy of absorbed laser light and damages the insulating layer stacked thereover. At this time, the light-absorbing layer may also be removed by ablation with the laser light. Accordingly, a first opening is formed in the insulating layer (or the light-absorbing layer and the insulating layer), thereby exposing part of the light-absorbing layer below the insulating layer on a side wall and a bottom surface (or only on the side wall) of the first opening.

Next, with using the insulating layer (or the light-absorbing layer and the insulating layer) having the first opening as a mask, the light-absorbing layer which is exposed on the bottom surface of the first opening is removed, so that a second opening is formed in the light-absorbing layer and the insulating layer. In the case where any other conductive layer or semiconductor layer is formed below the light-absorbing layer, the stacked conductive layer or semiconductor layer may be selectively removed using the light-absorbing layer and the insulating layer having the second opening as a mask, so that an opening may be formed.

In the case where the light-absorbing layer is formed using a conductive material or a semiconductor material and a conductive film is formed in the second opening to be in contact with the exposed light-absorbing layer, the light-absorbing layer and the conductive film can be electrically connected to each other with the insulating layer interposed therebetween. That is, in the present invention, opening formation in the stacked layer of the light-absorbing layer which functions as a conductive layer or a semiconductor layer and the insulating layer is performed by at least a step of forming the first opening by irradiating the light-absorbing layer with laser light to evaporate the insulating layer (or the insulating layer and the light-absorbing layer) by laser ablation, and a step of forming the second opening by selectively removing the light-absorbing layer (or a film below the light-absorbing layer) with use of the insulating layer having the first opening as a mask.

Since the first opening can be selectively formed by laser light and the second opening can be formed using the insulating layer having the first opening as the mask, it is not necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not heated substantially since heating is performed for a short period of time and instantaneously.

Further, a conductive layer, a semiconductor layer, or the like used in processing a thin film into a desired pattern is selectively formed to have a desired shape without using a photolithography process. A light-absorbing film such as a conductive film or a semiconductor film is formed over a light-transmitting transposing substrate and the light-absorbing film corresponding to a laser light irradiated region is transposed to a transposed substrate by irradiating the transporting substrate side with laser light, thereby forming the light-absorbing film with a desired shape (pattern). In this specification, the substrate over which the light-absorbing film such as the conductive film or the semiconductor film is formed and which is irradiated with laser light in the first step is referred to as the transposing substrate, and the substrate over which the light-absorbing film such as the conductive film or the semiconductor film is selectively formed finally is referred to as the transposed substrate. Since the light-absorbing film such as the conductive film or the semiconductor film can be selectively formed to have a desired shape without using a photolithography process, the manufacturing process can be simplified and cost can be reduced, for example.

According to one feature of a method for manufacturing a display device of the present invention, a light-absorbing layer is formed, an insulating layer is formed over the light-absorbing layer, the light-absorbing layer and the insulating layer are selectively irradiated with laser light to remove an irradiated region of the insulating layer so that a first opening is formed in the insulating layer, the light-absorbing layer is selectively removed using the insulating layer having the first opening as a mask so that a second opening is formed in the insulating layer and the light-absorbing layer, and a conductive layer is formed in the second opening to be in contact with the light-absorbing layer.

According to one feature of a method for manufacturing a display device of the present invention, a first conductive layer is formed, a light-absorbing layer is formed over the first conductive layer, an insulating layer is formed over the light-absorbing layer, the light-absorbing layer and the insulating layer are selectively irradiated with laser light to remove an irradiated region of the insulating layer so that a first opening is formed in the insulating layer, the light-absorbing layer is selectively removed using the insulating layer having the first opening as a mask so that a second opening is formed in the insulating layer and the light-absorbing layer to reach the first conductive layer, and a second conductive layer is formed in the second opening to be in contact with the light-absorbing layer and the first conductive layer.

According to one feature of a method for manufacturing a display device of the present invention, a first conductive layer is formed, a light-absorbing layer is formed over the first conductive layer, an insulating layer is formed over the light-absorbing layer, the light-absorbing layer and the insulating layer are selectively irradiated with laser light to remove an irradiated region of the insulating layer so that a first opening is formed in the insulating layer, the light-absorbing layer and the first conductive layer are selectively removed using the insulating layer having the first opening as a mask so that a second opening is formed in the insulating layer, the light-absorbing layer, and the first conductive layer, and a second conductive layer is formed in the second opening to be in contact with the light-absorbing layer and the first conductive layer.

According to one feature of a method for manufacturing a display device of the present invention, a light-absorbing layer is formed, an insulating layer is formed over the light-absorbing layer, the light-absorbing layer and the insulating layer are selectively irradiated with laser light to remove part of an irradiated region of the light-absorbing layer and an irradiated region of the insulating layer so that a first opening is formed in the light-absorbing layer and the insulating layer, the light-absorbing layer is selectively removed using the insulating layer having the first opening as a mask so that a second opening is formed in the insulating layer and the light-absorbing layer, and a conductive layer is formed in the second opening to be in contact with the light-absorbing layer.

According to one feature of a method for manufacturing a display device of the present invention, a first conductive layer is formed, a light-absorbing layer is formed over the first conductive layer, an insulating layer is formed over the light-absorbing layer, the light-absorbing layer and the insulating layer are selectively irradiated with laser light to remove part of an irradiated region of the light-absorbing layer and an irradiated region of the insulating layer so that a first opening is formed in the light-absorbing layer and the insulating layer, the light-absorbing layer is selectively removed using the insulating layer having the first opening as a mask so that a second opening is formed in the insulating layer and the light-absorbing layer to reach the first conductive layer, and a second conductive layer is formed in the second opening to be in contact with the light-absorbing layer and the first conductive layer.

According to one feature of a method for manufacturing a display device of the present invention, a first conductive layer is formed, a light-absorbing layer is formed over the first conductive layer, an insulating layer is formed over the light-absorbing layer, the light-absorbing layer and the insulating layer are selectively irradiated with laser light to remove part of an irradiated region of the light-absorbing layer and an irradiated region of the insulating layer so that a first opening is formed in the light-absorbing layer and the insulating layer, the light-absorbing layer and the first conductive layer are selectively removed using the insulating layer having the first opening as a mask so that a second opening is formed in the insulating layer, the light-absorbing layer, and the first conductive layer, and a second conductive layer is formed in the second opening to be in contact with the light-absorbing layer and the first conductive layer.

According to one feature of a method for manufacturing a display device of the present invention, a first conductive layer is formed, a light-absorbing layer is formed over the first conductive layer, an insulating layer is formed over the light-absorbing layer, the light-absorbing layer and the insulating layer are selectively irradiated with laser light to remove an irradiated region of the light-absorbing layer and an irradiated region of the insulating layer so that a first opening is formed in the light-absorbing layer and the insulating layer, the first conductive layer is selectively removed using the light-absorbing layer and the insulating layer having the first opening as a mask so that a second opening is formed in the insulating layer, the light-absorbing layer, and the first conductive layer, and a second conductive layer is formed in the second opening to be in contact with the light-absorbing layer and the first conductive layer.

In the above-described structure, etching for forming the second opening may be performed by both of or either one of wet etching and dry etching, and may be performed plural times.

The light-absorbing layer formed as described above absorbs irradiated laser light, and a conductive material and a semiconductor material can be used. The light-absorbing layer can be used as any conductive layer or semiconductor layer included in the display device. For example, as the conductive layer, it can be used for a wiring layer, a gate electrode layer, a source electrode layer, a drain electrode layer, a pixel electrode layer, or the like.

In the above-described structure, a conductive material may be used as the light-absorbing layer. For example, one or a plurality of kinds of chromium, tantalum, silver, molybdenum, nickel, titanium, cobalt, copper, and aluminum can be used. Alternatively, a semiconductor material may be used as the light-absorbing layer. For example, an inorganic semiconductor material such as silicon, germanium, silicon germanium, gallium arsenide, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. The light-absorbing layer may also be added with hydrogen or an inert gas (e.g., helium (He), argon (Ar), krypton (Kr), neon (Ne), or xenon (Xe)). The insulating layer in which the opening is formed can be formed using a material which transmits laser light, such as a light-transmitting inorganic insulating material or an organic resin.

The present invention can also be applied to a display device that is a device having a display function, and the display device using the present invention includes the following: a light-emitting display device in which a light-emitting element including a layer containing an organic material, an inorganic material, or a mixture of an organic material and an inorganic material, which exhibits light emission called electroluminescence (hereinafter also refereed to as EL), between electrodes is connected to a TFT; a liquid crystal display device using a liquid crystal element containing a liquid crystal material as a display element; and the like. In the present invention, a display device means a device including a display element (e.g., a liquid crystal element or a light-emitting element). Note that the display device may also mean a main body of a display panel in which a plurality of pixels including display elements such as liquid crystal elements or EL elements and a peripheral driver circuit for driving the pixels are formed over a substrate. Further, the display device may include one provided with a flexible printed circuit (FPC) or a printed wiring board (PWB) (e.g., an IC, a resistor, a capacitor, an inductor, or a transistor). Further, the display device may include an optical sheet such as a polarizing plate or a retardation film. Further, a backlight (including a light guide plate, a prism sheet, a diffusion sheet, a reflection sheet, a light source such as an LED or a cold-cathode tube, or the like) may be included.

Note that the display element or the display device can employ various modes and include various elements. For example, a display medium of which contrast is changed by an electric/magnetic effect can be used, such as an EL element (e.g., an organic EL element, an inorganic EL element, or an EL element containing an organic material and an inorganic material), an electron discharging element, a liquid crystal element, an electron ink, a grating light valve (GLV), a plasma display panel (PDP), a digital micromirror device (DMD), a piezoelectric ceramic display, or a carbon nanotube. Note that the display device using the EL element includes an EL display; the display device using the electron discharging element includes a field emission display (FED), a surface-conduction electron-emitter display (SED), and the like; the display device using the liquid crystal element includes a liquid crystal display, a transmissive liquid crystal display, a semi-transmissive liquid crystal display, and a reflective liquid crystal display; and the display device using the electron ink includes electronic paper.

Further, by using the present invention, a device including a circuit including a semiconductor element (e.g., a transistor, a memory element, or a diode) or a semiconductor device such as a chip including a processor circuit can be manufactured. Note that in the present invention, a semiconductor device means a device which can function by utilizing semiconductor characteristics.

By the present invention, components such as a wiring included in a display device or the like and a contact hole for electrically connecting them with an insulating layer interposed therebetween can be formed with a complicated photolithography process reduced. Accordingly, a display device can be manufactured through a simplified process, so that loss of materials and the cost can be reduced. Therefore, high performance and highly reliable display devices can be manufactured with a high yield.

BRIEF DESCRIPTION OF THE DRAWINGS

FIGS. 12A to 12D are diagrams showing a method for manufacturing a display device of the present invention.

FIGS. 19A and 19B are diagrams showing a display device of the present invention.

FIGS. 20A and 20B are cross-sectional diagrams each showing a structural example of a display module of the present invention.

DETAILED DESCRIPTION OF THE INVENTION

Figure 1A:
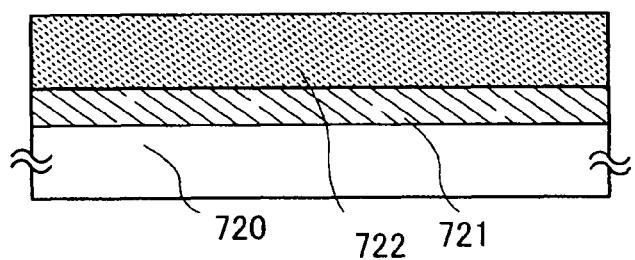
FIGS. 1A to 1E are schematic diagrams showing the present invention.

Although the present invention will be fully described by way of embodiment modes with reference to the accompanying drawings, it is to be understood that various changes and modifications will be apparent to those skilled in the art. Therefore, unless such changes and modifications depart from the spirit and scope of the present invention, they should be construed as being included therein. Note that in structures of the present invention described below, the same portions or portions having similar functions are denoted by the same reference symbols in common through the drawings, and repetitive description thereof is omitted.

Embodiment Mode 1

In this embodiment mode, a method for forming a contact hole in order to manufacture a display device at low cost through a highly reliable, more simplified process is described with reference to FIGS. 1A to 1E and 2A to 2E.

In the present invention, in the case where thin films (each of which is a conductive layer or a semiconductor layer) which are stacked with an insulating layer interposed therebetween are electrically connected to each other, an opening (a so-called contact hole) is formed in the insulating layer. In the present invention, the opening (contact hole) through which the thin films provided with the insulating layer interposed therebetween are electrically connected to each other is formed by a plurality of steps. First, without forming a mask layer over the insulating layer, a first opening is selectively formed by laser light irradiation in the insulating layer (or the insulating layer and a light-absorbing layer). The light-absorbing layer is removed using the insulating layer (or the insulating layer and the light-absorbing layer) having the first opening as a mask, so that a second opening is formed in the light-absorbing layer and the insulating layer.

After a light-absorbing layer having a function of absorbing irradiated light is formed and an insulating layer is stacked over the light-absorbing layer, a region of the stacked layer of the light-absorbing layer and the insulating layer, in which a first opening is to be formed, is selectively irradiated with laser light from an insulating layer side. Although the laser light is transmitted through the insulating layer, it is absorbed in the light-absorbing layer. The light-absorbing layer is heated by energy of absorbed laser light and damages the insulating layer stacked thereover. At this time, the light-absorbing layer may also be removed by ablation with the laser light. Accordingly, a first opening is formed in the insulating layer (or the light-absorbing layer and the insulating layer), thereby exposing part of the light-absorbing layer below the insulating layer on a side wall and a bottom surface (or only on the side wall) of the first opening.

Next, with using the insulating layer (or the light-absorbing layer and the insulating layer) having the first opening as a mask, the light-absorbing layer which is exposed on the bottom surface of the first opening is removed, so that a second opening is formed in the light-absorbing layer and the insulating layer. In the case where any other conductive layer or semiconductor layer is formed below the light-absorbing layer, the stacked conductive layer or semiconductor layer may be selectively removed using the light-absorbing layer and the insulating layer having the second opening as a mask, so that an opening may be formed.

In the case where the light-absorbing layer is formed using a conductive material or a semiconductor material and a conductive film is formed in the second opening to be in contact with the exposed light-absorbing layer, the light-absorbing layer and the conductive film can be electrically connected to each other with the insulating layer interposed therebetween. That is, in the present invention, opening formation in the stacked layer of the light-absorbing layer which functions as a conductive layer or a semiconductor layer and the insulating layer is performed by at least a step of forming the first opening by irradiating the light-absorbing layer with laser light to evaporate the insulating layer (or the insulating layer and the light-absorbing layer) by laser ablation, and a step of forming the second opening by selectively removing the light-absorbing layer (or a film below the light-absorbing layer) with use of the insulating layer having the first opening as a mask.

Since the first opening can be selectively formed by laser light and the second opening can be formed using the insulating layer having the first opening as the mask, it is not necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not heated substantially since heating is performed for a short period of time and instantaneously.

Specific description is made with reference to FIGS. 1A to 1E. In this embodiment mode, as shown in FIGS. 1A to 1E, a light-absorbing layer 721 and an insulating layer 722 are formed over a substrate 720. In this embodiment mode, a conductive material is used as the light-absorbing layer 721, thereby functioning as a conductive layer. In this embodiment mode, chromium is used as the light-absorbing layer 721.

Figure 1B:
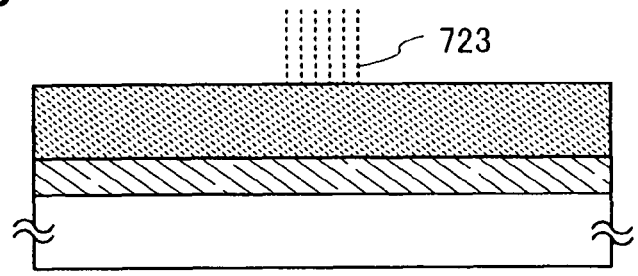
Figure 1C:
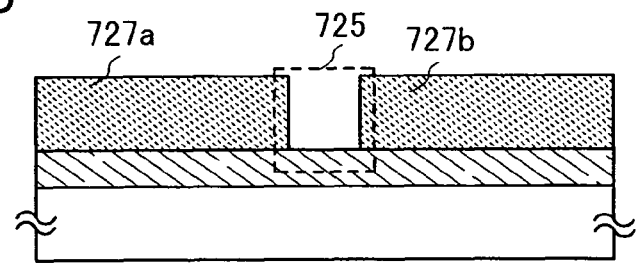
Figure 1D:
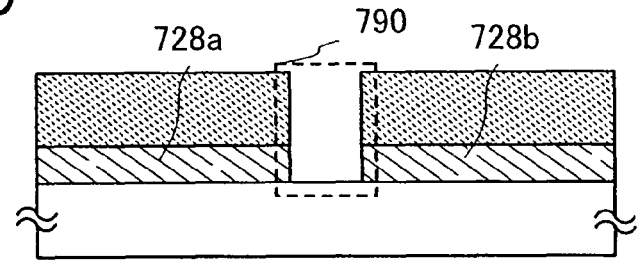
Figure 1E:
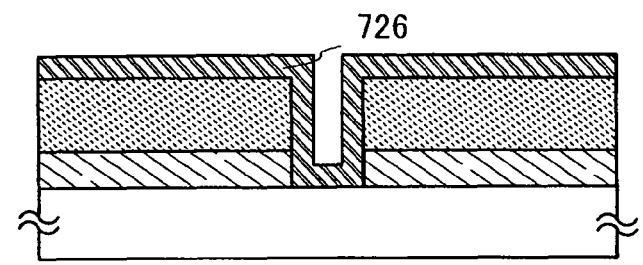

As shown in FIG. 1B, the light-absorbing layer 721 is selectively irradiated with laser light 723 from an insulating layer 722 side, and the insulating layer 722 above an irradiated region of the light-absorbing layer 721 is removed by the irradiated energy so that a first opening 725 can be formed. The insulating layer 722 is separated into insulating layers 727a and 727b (see FIG. 1C).

Next, the light-absorbing layer 721 is removed by etching using the insulating layers 727a and 727b as masks so that a second opening 790 is formed. The light-absorbing layer 721 is separated into light-absorbing layers 728a and 728b (see FIG. 1D). A conductive film 726 is formed in the second opening 790 where the light-absorbing layers 728a and 728b and the substrate 720 are exposed, so that the light-absorbing layers 728a and 728b and the conductive film 726 can be electrically connected to each other (see FIG. 1E).

Figure 30:
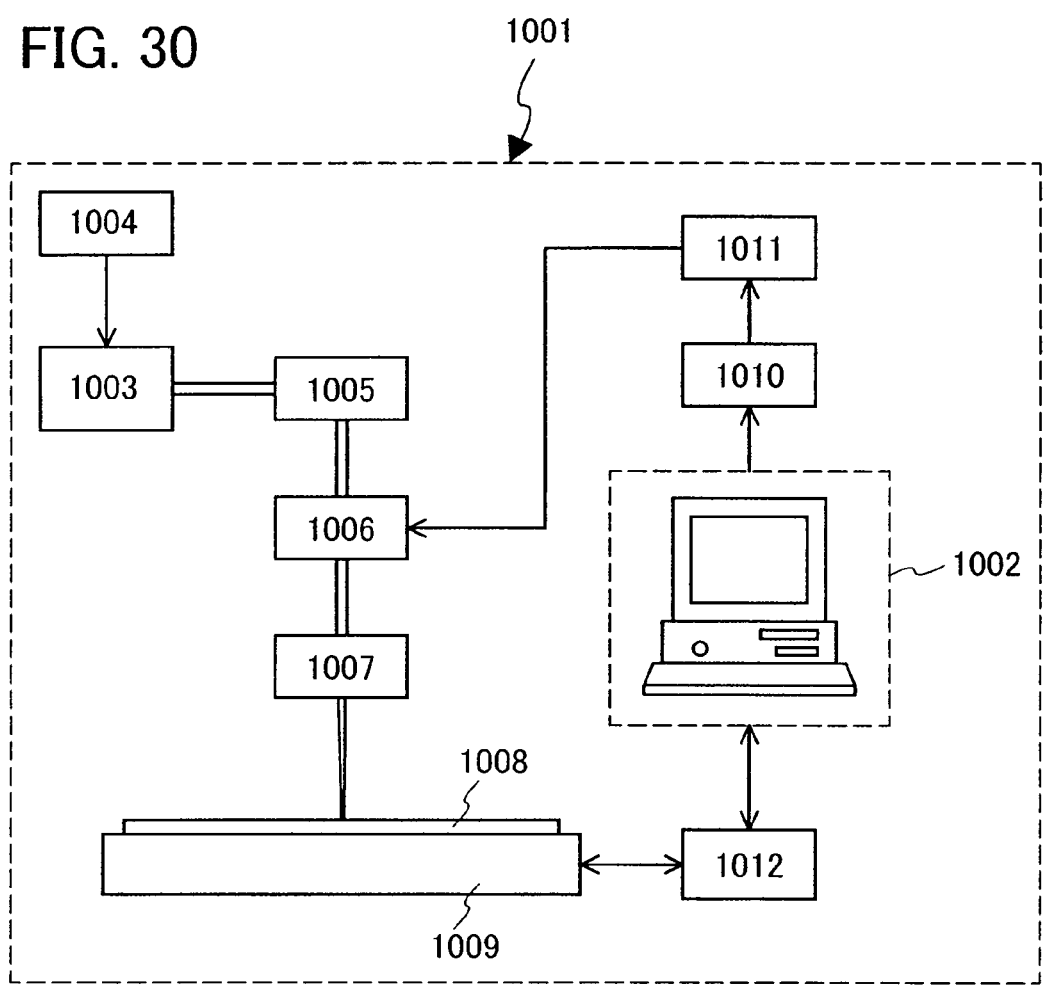
FIG. 30 is a diagram showing a structure of a laser direct writing system applicable to the present invention.

A laser beam writing system for irradiating a processing region with laser light (also called a laser beam) is described with reference to FIG. 30. In this embodiment mode, a laser beam direct writing system is used because the processing region is directly irradiated with a laser beam. As shown in FIG. 30, a laser beam direct writing system 1001 includes the following: a personal computer (hereinafter referred to as a PC) 1002 for carrying out various kinds of controls upon irradiation with a laser beam; a laser oscillator 1003 for outputting a laser beam; a power source 1004 of the laser oscillator 1003; an optical system (an ND filter) 1005 for attenuating a laser beam; an acousto-optic modulator (AOM) 1006 for modulating the intensity of a laser beam; an optical system 1007 including a lens for enlarging or reducing a cross section of a laser beam, a mirror for changing a light path, and the like; a substrate transfer mechanism 1009 having an X stage and a Y stage; a D/A converter 1010 for converting control data outputted from the PC from digital data to analog data; a driver 1011 for controlling the acousto-optic modulator 1006 depending on an analog voltage outputted from the D/A converter; and a driver 1012 for outputting a driving signal for driving the substrate transfer mechanism 1009.

As the laser oscillator 1003, a laser oscillator that is capable of emitting ultraviolet light, visible light, or infrared light can be used. The following laser oscillators can be used: an excimer laser oscillator such as KrF, ArF, XeCl, or Xe; a gas laser oscillator such as He, He—Cd, Ar, He—Ne, or HF; a solid-state laser oscillator using a crystal such as YAG, GdVO$_4$, YVO$_4$, YLF, or YAlO$_3$ doped with Cr, Nd, Er, Ho, Ce, Co, Ti, or Tm; and a semiconductor laser oscillator such as GaN, GaAs, GaAlAs, or InGaAsP. Note that, in the case of the solid-state laser oscillator, any one of first to fifth harmonics is preferably used. In order to adjust the shape or path of a laser beam emitted from the laser oscillator, an optical system including a shutter, a reflector such as a mirror or a half mirror, a cylindrical lens, a convex lens, and the like may be provided.

Further, the repetition rate of laser light of pulsed oscillation may be 0.5 MHz or more, which is extremely higher than the conventional repetition rate which is the repetition rate from several tens to several hundreds Hz, for performing laser crystallization. A pulsed laser having a pulse width on the order of picoseconds, or on the order of femtoseconds ($10^{-15}$ seconds) can also be used.

Further, the irradiation with laser light may also be performed in an inert gas atmosphere of a rare gas, nitrogen, or the like. The irradiation with laser light may also be performed under reduced pressure.

Next, treatment for modifying quality of a film with the laser beam direct writing system is described. When a substrate 1008 is put on the substrate transfer mechanism 1009, the PC 1002 detects a position of a marker that is marked on the substrate, with a camera (not shown). The PC 1002 generates transfer data for transferring the substrate transfer mechanism 1009 based on the positional data of the detected marker and data for a lithography pattern which is inputted in advance in the PC. After that, by controlling the amount of output light for the acousto-optic modulator 1006 with the driver 1011 in the PC 1002, a laser beam outputted from the laser oscillator 1003 is attenuated by the optical system 1005, and is adjusted to a predetermined amount by the acousto-optic modulator 1006. On the other hand, a laser beam outputted from the acousto-optic modulator 1006 changes its light path and beam shape in the optical system 1007. After that, the laser beam is condensed by the lens, and a base film formed over the substrate is irradiated with the condensed laser beam, whereby the treatment for modifying film quality is performed. At this time, the substrate transfer mechanism 1009 is controlled to be transferred in X and Y directions in accordance with the transfer data generated by the PC 1002. As a result, a predetermined portion is irradiated with the laser beam, so that treatment for modifying film quality is performed.

The shorter the wavelength of the laser beam is, the shorter in diameter the laser beam can be condensed. Therefore, in order to process a region with a minute width, a short wavelength laser beam is preferably used.

Further, the spot shape of the laser beam on the film surface is processed to have a dotted, circular, elliptic, rectangular, or linear (exactly, a narrow rectangular) shape by the optical system.

Further, although FIG. 30 shows an example of the system in which a front surface of the substrate is irradiated with a laser beam to be exposed, a laser beam writing system in which a back surface of the substrate is irradiated with a laser beam to be exposed may also be used by changing the optical system and the substrate transfer system as appropriate.

Note that, although the substrate is selectively irradiated with the laser beam while being transferred here, the present invention is not limited thereto. Irradiation with the laser beam can be performed while scanning the laser beam in the X- and Y-axis directions. In this case, a polygon mirror or a galvanometer mirror is preferably used for the optical system 1007.

The light-absorbing layer 721 can be formed by an evaporation method, a sputtering method, a PVD (Physical Vapor Deposition) method, a CVD (Chemical Vapor Deposition) method such as a low-pressure CVD (LPCVD) method or a plasma CVD method, or the like. Further, a method by which a component can be transferred or drawn to be a desired pattern, such as various printing methods (a method for forming a component to be a desired pattern, e.g., screen (mimeograph) printing, offset (planograph) printing, relief printing, or gravure (intaglio) printing), a dispenser method, a selective-coating method, or the like can also be used.

As the light-absorbing layer 721, one or a plurality of kinks of chromium, molybdenum, nickel, titanium, cobalt, copper, tungsten, and aluminum can be used. Further, a semiconductor material can also be used as the light-absorbing layer 721. For example, an inorganic semiconductor material such as silicon, germanium, silicon germanium, arsenic gallium, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Further, hydrogen or an inert gas (e.g., helium (He), argon (Ar), krypton (Kr), neon (Ne), or xenon (Xe)) may also be added to the light-absorbing layer.

In the present invention, the light-absorbing layer is formed using a material having a function of absorbing irradiated light. In the opening through which conductive thin films are connected to each other, the light-absorbing layer which is interposed in a stacked layer of the thin films is necessarily to be conductive. The light-absorbing layer is, therefore, preferably formed using a conductive material, a semiconductor material, or the like. In the case where the light-absorbing layer is removed at the opening by laser irradiation and subsequent etching so that the thin film below the light-absorbing layer is exposed, the light-absorbing layer is not necessarily to be conductive. As the light-absorbing layer, an organic material, an inorganic material, a substance including both an organic material and an inorganic material, or the like can be used; a material having an absorption band corresponding to a wavelength of laser light used may be selected. Further, a conductive material such as a metal or an insulating material such as an organic resin may also be used. As the inorganic material, iron, gold, copper, silicon, germanium, or the like can be used. As the organic material, plastic such as polyimide and acrylic, a pigment, or the like can be used. As the pigment, carbon black, a black resin of a colorant type, or the like can also be used.

FIGS. 1A to 1E show the example in which only the insulating layer 722 is removed by irradiation with the laser beam 723 to form the first opening 725 in the insulating layer 722, and the second opening 790 is formed by subsequent etching until the substrate 720 is exposed in the light-absorbing layer below the insulating layer. An example in which a first opening is formed by laser irradiation not only in an insulating layer but also in part of a light-absorbing layer is shown in FIGS. 2A to 2E.

FIGS. 2A to 2E show an example where laser ablation is performed to only an upper portion of a light-absorbing layer below an insulating layer by laser light, in which the light-absorbing layer is left at a bottom of an opening. As shown in FIGS. 2A to 2E, a light-absorbing layer 711 and an insulating layer 712 are formed over a substrate 710. In this embodiment mode, a conductive material is used as the light-absorbing layer 711, thereby functioning as a conductive layer. In this embodiment mode, chromium is used as the light-absorbing layer 711.

Figure 2A:
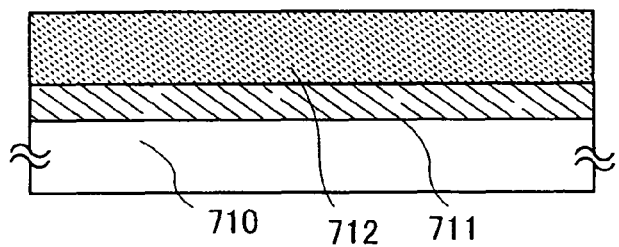
FIGS. 2A to 2E are schematic diagrams showing the present invention.
Figure 2B:
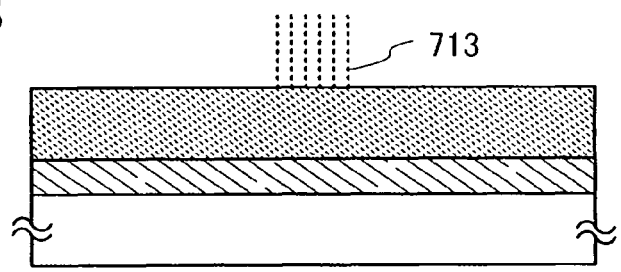
Figure 2C:
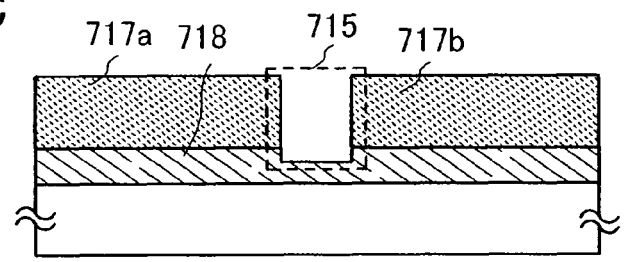
Figure 2D:
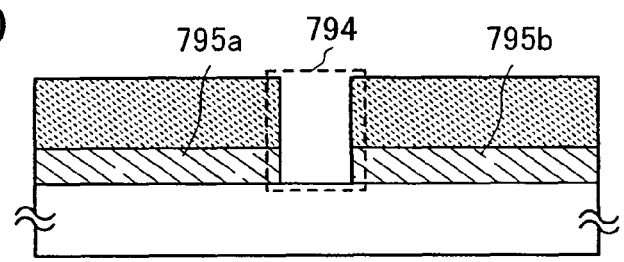
Figure 2E:
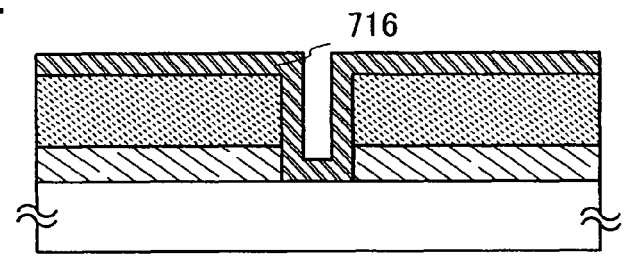

As shown in FIG. 2B, the light-absorbing layer 711 is selectively irradiated with laser light 713 from an insulating layer 712 side. By irradiated energy, an irradiated region of the light-absorbing layer 711 is partially evaporated and the insulating layer 712 above the irradiated region of the light-absorbing layer 711 is removed. In this way, a first opening 715 can be formed. The light-absorbing layer 711 is processed into a light-absorbing layer 718, and the insulating layer 712 is separated into insulating layers 717a and 717b (see FIG. 2C).

Next, the light-absorbing layer 718 is removed by etching using the insulating layers 717a and 717b as masks, so that a second opening 794 reaching the substrate 710 is formed. The light-absorbing layer 718 is separated into light-absorbing layers 795a and 795b (see FIG. 2D). A conductive film 716 is formed in the second opening 794 where the light-absorbing layers 795a and 795b and the substrate 710 are exposed, so that the light-absorbing layers 795a and 795b and the conductive film 716 can be electrically connected to each other (see FIG. 2E).

Further, each of the first and second openings which function as contact holes is not limited to a shape in which a side surface is perpendicular to a bottom surface, and may also have a shape in which a side of the side surface of the opening is tapered. For example, the opening may also have a mortar shape, in which the side surface of the opening is tapered toward the bottom surface thereof. Further, the taper angle may also be different in the first and second openings.

In this manner, in the opening provided in the insulating layer, the light-absorbing layer below the insulating layer and the conductive layer over the insulating layer are electrically connected to each other. The size and shape of the opening formed in the insulating layer can be controlled by laser light irradiation conditions (e.g., energy intensity and irradiation period of time) and properties of materials for the insulating layer and the conductive layer (e.g., thermal conductivity, melting point, and boiling point).

The size of the opening with respect to an irradiated region determined by the diameter of laser light depends on the energy amount of the laser light. When the energy of laser light is as large as enough, the energy reaches the periphery of the irradiated region, so that an opening which is larger than the irradiated region with the laser light is formed in the insulating layer. To the contrary, when the energy of laser light is small, an opening which has almost the same size as the irradiated region is formed in the insulating layer.

As described above, by controlling the energy of the laser light, the size of the opening formed in the insulating layer can be controlled as appropriate.

The etching process can employ either dry etching or wet etching. As an etching gas, a fluorine-based or chlorine-based gas such as $CF_4$, $NF_3$, $Cl_2$, or $BCl_3$ can be used, and an inert gas such as He or Ar may also be added as appropriate.

After the opening is formed by laser light irradiation, the conductive material or the insulating material which remains around the opening (a residue in the portion where the conductive layer or the insulating layer is removed) may be washed with a liquid to be removed. In this case, a non-reactive substance such as water may be used for washing, or a chemical solution such as an etchant which reacts with (dissolves) the insulating layer may be used. With an etchant, the opening is over-etched, and dust and the like are removed, so that the surface is more planarized. Further, the opening can also be widened.

Since the first opening can be selectively formed by laser light and the second opening can be formed using the insulating layer having the first opening as the mask, it is not necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the first opening which is formed by the laser light irradiation, as a mask, the conductive light-absorbing layer (or the conductive layer stacked below the light-absorbing layer) can be exposed in the second opening.

As described above, an opening (a contact hole) which electrically connects conductive layers can be formed in an insulating layer by laser light irradiation without forming a mask layer using a complicated photolithography process.

Accordingly, by manufacturing a display device according to the present invention, the manufacturing process can be simplified, so that loss of materials and the cost can be reduced. Therefore, display devices can be manufactured with a high yield.

Embodiment Mode 2

In this embodiment mode, a method for forming a contact hole in order to manufacture a display device at low cost through a highly reliable, more simplified process is described with reference to FIGS. 34A to 34E, 35A to 35E, 36A to 36E, 37A to 37E, 38A to 38E, and 39A to 39E.

In this embodiment mode, an example in which the stacked layer of the light-absorbing layer and the conductive layer is electrically connected to the conductive film with the insulating layer interposed therebetween in Embodiment Mode 1 is described.

Specific description is made with reference to FIGS. 34A to 34E. In this embodiment mode, as shown in FIGS. 34A to 34E, a conductive layer 739, a light-absorbing layer 731, and an insulating layer 732 are formed over a substrate 730 (see FIG. 34A). In this embodiment mode, a conductive material is used as the light-absorbing layer 731, thereby functioning as a conductive layer. Further, a material which absorbs laser light may be used as the conductive layer 739, thereby functioning as a light-absorbing layer.

The conductive layer 739 and the light-absorbing layer 731 are stacked. In this embodiment mode, a low-melting point metal (chromium in this embodiment mode) that is relatively easily evaporated is used for the light-absorbing layer 731, and a high-melting point metal (tungsten in this embodiment mode) that is not easily evaporated compared to the light-absorbing layer 731 is used for the conductive layer 739. Further, a semiconductor layer may be used as the conductive layer 739.

Figure 34A:
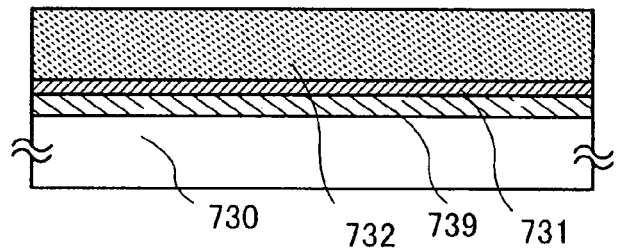
FIGS. 34A to 34E are schematic diagrams showing the present invention.
Figure 34B:
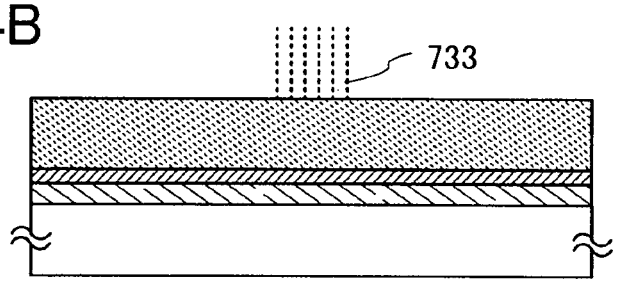
Figure 34C:
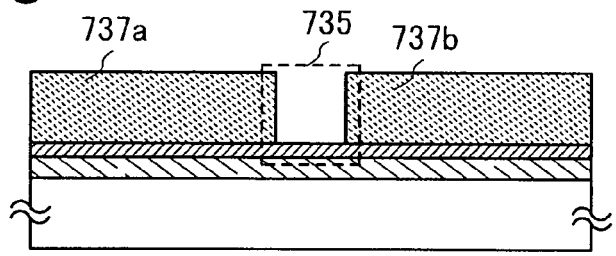
Figure 34D:
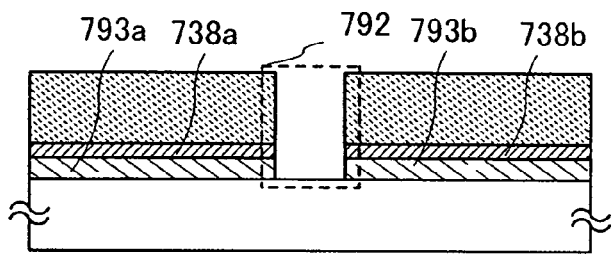
Figure 34E:
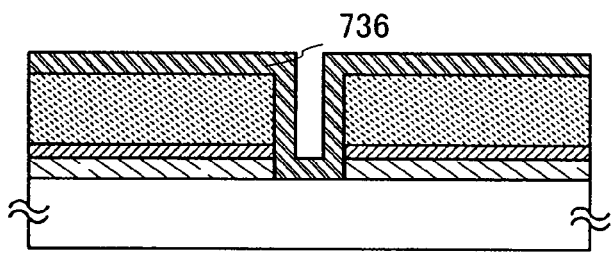

As shown in FIG. 34B, the light-absorbing layer 731 is selectively irradiated with laser light 733 from an insulating layer 732 side. The insulating layer 732 above the irradiated region of the light-absorbing layer 731 is removed by the irradiated energy so that a first opening 735 reaching the light-absorbing layer 731 can be formed. The insulating layer 732 is separated into insulating layers 737a and 737b (see FIG. 34C).

Next, the light-absorbing layer 731 and the conductive layer 739 are removed by etching using the insulating layers 737a and 737b as masks so that a second opening 792 is formed. The light-absorbing layer 731 is separated into light-absorbing layers 738a and 738b, and the conductive layer 739 is separated into conductive layers 793a and 793b (see FIG. 34D). A conductive film 736 is formed in the second opening 792 where the light-absorbing layers 738a and 738b, the conductive layers 793a and 793b, and the substrate 730 are exposed, so that the light-absorbing layers 738a and 738b, the conductive layers 793a and 793b, and the conductive film 736 can be electrically connected to one another (see FIG. 34E).

The etching for forming the second opening 792 may be performed by both of or either one of wet etching and dry etching, and may be performed plural times. Further, the etching of the light-absorbing layer 731 and the etching of the conductive layer 739 may be performed either by the same step or by different steps.

FIGS. 34A to 34E show the example in which the second opening is formed by selectively etching the light-absorbing layer and the conductive layer which are stacked, using the insulating layer having the first opening as the mask. The depth of the second opening can be set as appropriate by controlling the etching condition with respect to the light-absorbing layer and the conductive layer (the semiconductor layer) which are stacked below the insulating layer.

An example in which a second opening is formed only in a light-absorbing layer is shown in FIGS. 35A to 35E. As shown in FIGS. 35A to 35E, a conductive layer 709, a light-absorbing layer 701, and an insulating layer 702 are formed over a substrate 700 (see FIG. 35A). In this embodiment mode, a conductive material is used as the light-absorbing layer 701, thereby functioning as a conductive layer. Further, a material which absorbs laser light may be used as the conductive layer 709, thereby functioning as a light-absorbing layer.

The conductive layer 709 and the light-absorbing layer 701 are stacked. In this embodiment mode, a low-melting point metal (chromium in this embodiment mode) that is relatively easily evaporated is used for the light-absorbing layer 701, and a high-melting point metal (molybdenum in this embodiment mode) that is not easily evaporated compared to the light-absorbing layer 701 is used for the conductive layer 709. Further, a semiconductor layer may be used as each of the light-absorbing layer 701 and the conductive layer 739.

Figure 35A:
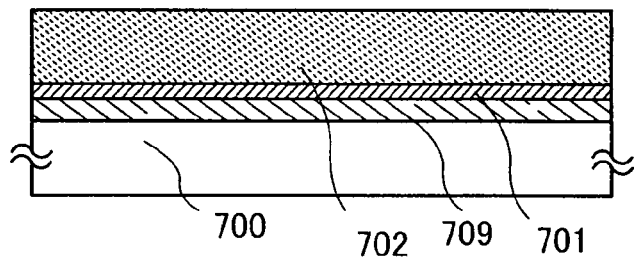
FIGS. 35A to 35E are schematic diagrams showing the present invention.
Figure 35B:
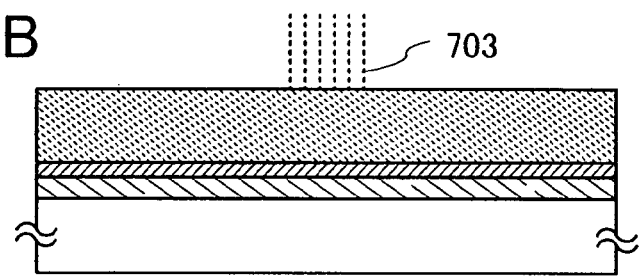
Figure 35C:
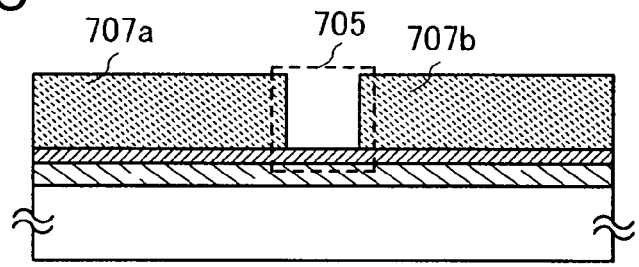
Figure 35D:
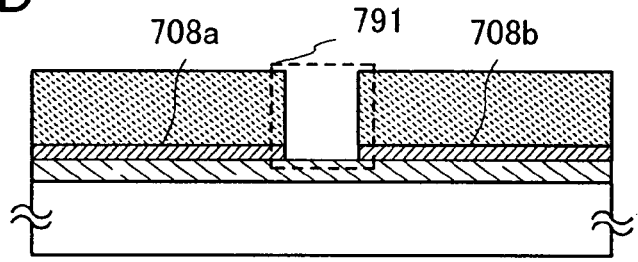
Figure 35E:
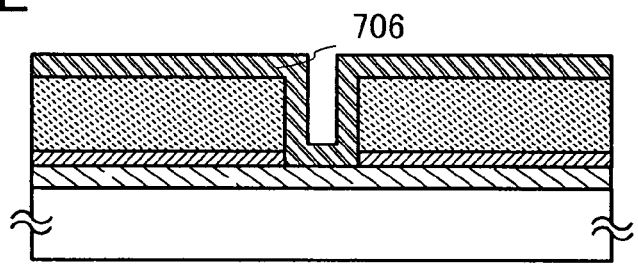

As shown in FIG. 35B, the light-absorbing layer 701 is selectively irradiated with laser light 703 from an insulating layer 702 side. The insulating layer 702 above an irradiated region of the light-absorbing layer 701 is removed by the irradiated energy so that a first opening 705 reaching the light-absorbing layer 701 can be formed. The insulating layer 702 is separated into insulating layers 707a and 707b (see FIG. 35C).

Next, the light-absorbing layer 701 is removed by etching using the insulating layers 707a and 707b as masks so that a second opening 791 is formed. The light-absorbing layer 701 is separated into light-absorbing layers 708a and 708b (see FIG. 35D). A conductive film 706 is formed in the second opening 791 where the light-absorbing layers 708a and 708b and the conductive layer 709 are exposed, so that the light-absorbing layers 708a and 708b, the conductive layer 709, and the conductive film 706 can be electrically connected to one another (see FIG. 35E).

FIGS. 34A to 34E and 35A to 35B show the examples where the first opening reaching the light-absorbing layer is formed in the insulating layer by laser light irradiation, in which the insulating layer is removed to expose the light-absorbing layer by laser ablation. By the laser light irradiation, the first opening may also be formed in the light-absorbing layer or the conductive layer formed below the insulating layer.

FIGS. 36A to 36E show an example where laser ablation is performed only to an upper portion of a light-absorbing layer below an insulating layer by laser light, in which the light-absorbing layer is left at a bottom of a first opening. A conductive layer 749, a light-absorbing layer 741, and an insulating layer 742 are formed over a substrate 740 (see FIG. 36A). In this embodiment mode, a conductive material is used as the light-absorbing layer 741, thereby functioning as a conductive layer. Further, a material which absorbs laser light may be used as the conductive layer 749, thereby functioning as a light-absorbing layer.

The conductive layer 749 and the light-absorbing layer 741 are stacked. In this embodiment mode, a low-melting point metal (chromium in this embodiment mode) that is relatively easily evaporated is used for the light-absorbing layer 741, and a high-melting point metal (tantalum in this embodiment mode) that is not easily evaporated compared to the light-absorbing layer 741 is used for the conductive layer 749.

Figure 36A:
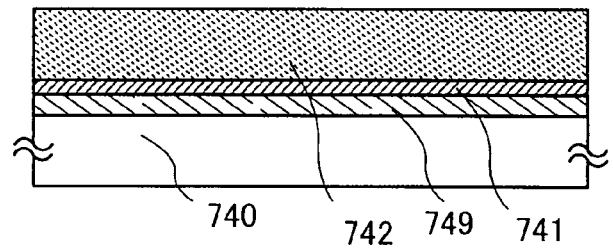
FIGS. 36A to 36E are schematic diagrams showing the present invention.
Figure 36B:
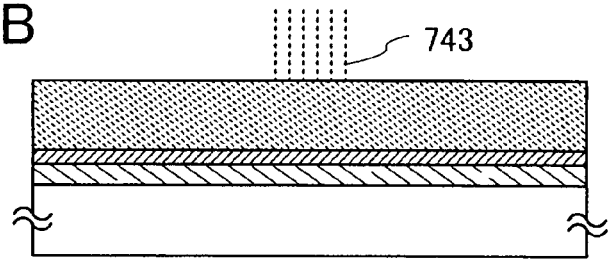
Figure 36C:
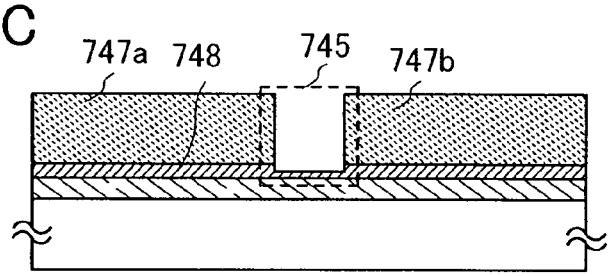
Figure 36D:
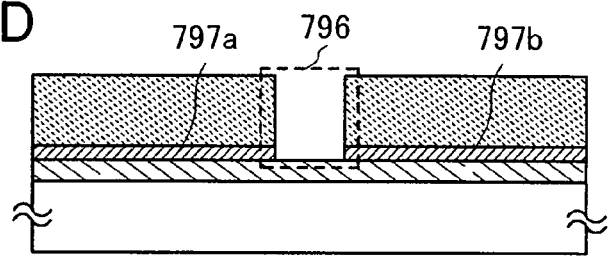
Figure 36E:
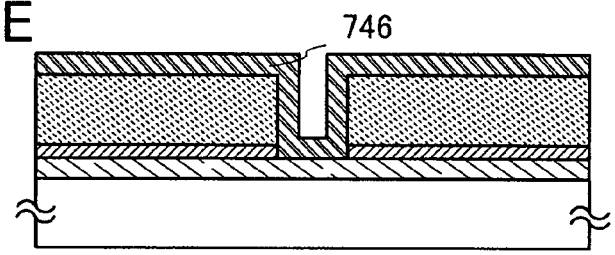

As shown in FIG. 36B, the light-absorbing layer 741 is selectively irradiated with laser light 743 from an insulating layer 742 side. Part of the light-absorbing layer in an irradiated region is evaporated by the irradiated energy, and the insulating layer 742 above the irradiated region of the light-absorbing layer 741 is removed. Consequently, a first opening 745 can be formed in the insulating layer 742 and the light-absorbing layer 741. The light-absorbing layer 741 is processed into a light-absorbing layer 748, and the insulating layer 742 is separated into insulating layers 747a and 747b (see FIG. 36C).

Next, the light-absorbing layer 748 is removed by etching using the insulating layers 747a and 747b as masks so that a second opening 796 is formed. The light-absorbing layer 748 is separated into light-absorbing layers 797a and 797b (see FIG. 36D). A conductive film 746 is formed in the second opening 796 where the light-absorbing layers 797a and 797b and the conductive layer 749 are exposed, so that the light-absorbing layers 797a and 797b, the conductive layer 749, and the conductive film 746 can be electrically connected to one another (see FIG. 36E).

FIGS. 36A to 36E show the example in which the second opening 796 is formed only in the insulating layer 742 and the light-absorbing layer 741. An example in which a second opening is formed by etching to also etch the conductive layer below the light-absorbing layer is shown in FIGS. 37A to 37E. A conductive layer 759, a light-absorbing layer 751, and an insulating layer 752 are formed over a substrate 750 (see FIG. 37A).

Figure 37A:
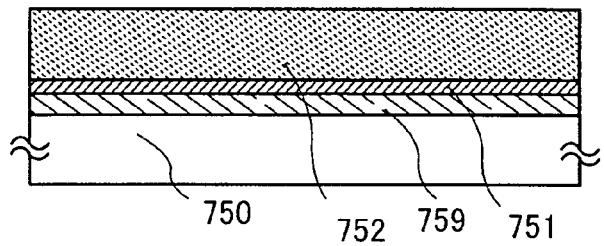
FIGS. 37A to 37E are schematic diagrams showing the present invention.
Figure 37B:
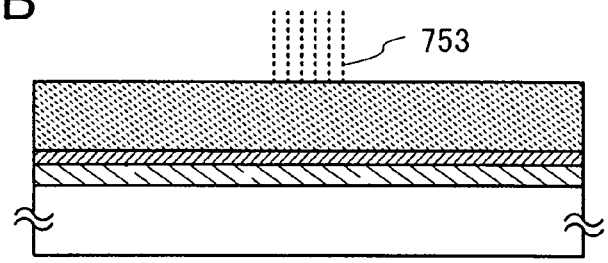
Figure 37C:
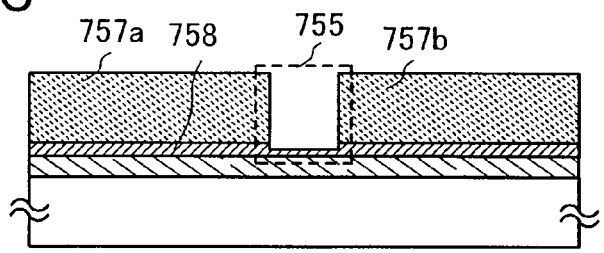
Figure 37D:
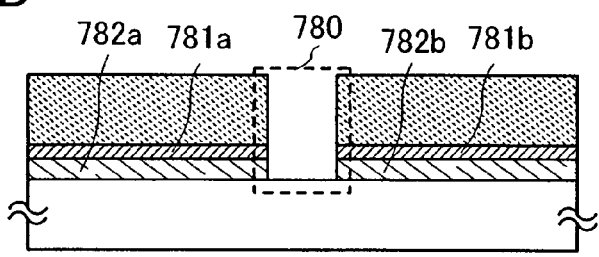
Figure 37E:
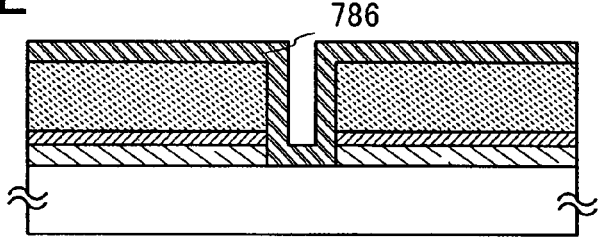

As shown in FIG. 37B, the light-absorbing layer 751 is selectively irradiated with laser light 753 from an insulating layer 752 side. Part of the light-absorbing layer in an irradiated region is evaporated by the irradiated energy, and the insulating layer 752 above the irradiated region of the light-absorbing layer 751 is removed. Consequently, a first opening 755 can be formed in the insulating layer 752 and the light-absorbing layer 751. The light-absorbing layer 751 is processed into a light-absorbing layer 758, and the insulating layer 752 is separated into insulating layers 757a and 757b (see FIG. 37C).

Next, the light-absorbing layer 758 and the conductive layer 759 are removed by etching using the insulating layers 757a and 757b as masks so that a second opening 780 is formed. The light-absorbing layer 758 is separated into light-absorbing layers 781a and 781b, and the conductive layer 759 is separated into conductive layers 782a and 782b (see FIG. 37D). A conductive film 786 is formed in the second opening 780 where the light-absorbing layers 781a and 781b, the conductive layers 782a and 782b, and the substrate 750 are exposed, so that the light-absorbing layers 781a and 781b, the conductive layers 782a and 782b, and the conductive film 786 can be electrically connected to one another (see FIG. 37E).

FIGS. 36A to 36E and FIGS. 37A to 37E show the examples where laser ablation is performed only to the upper portion of the light-absorbing layer below the insulating layer by the laser light, in which the light-absorbing layer is left at the bottom of the opening. An example in which a first opening reaching a conductive layer below a light-absorbing layer is formed by laser light irradiation is shown in FIGS. 38A to 38E. A conductive layer 769, a light-absorbing layer 761, and an insulating layer 762 are formed over a substrate 760 (see FIG. 38A).

Figure 38A:
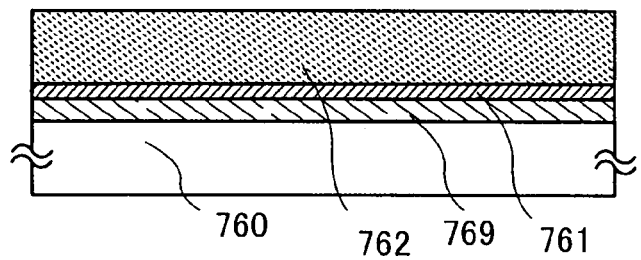
FIGS. 38A to 38E are schematic diagrams showing the present invention.
Figure 38B:
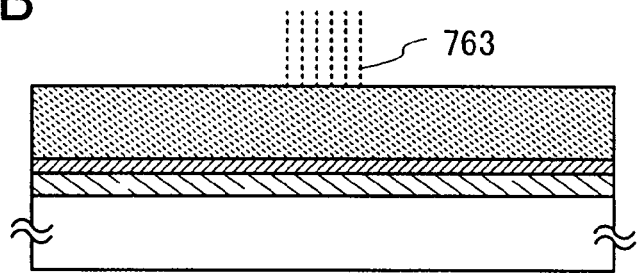
Figure 38C:
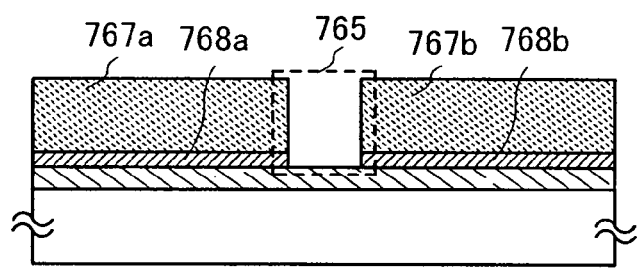
Figure 38D:
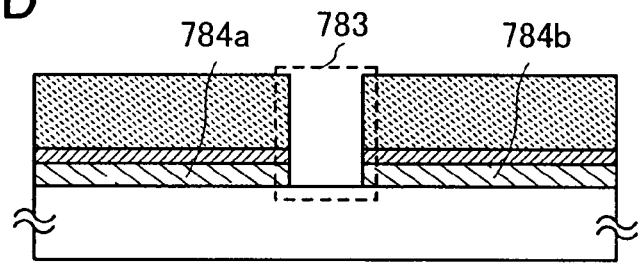
Figure 38E:
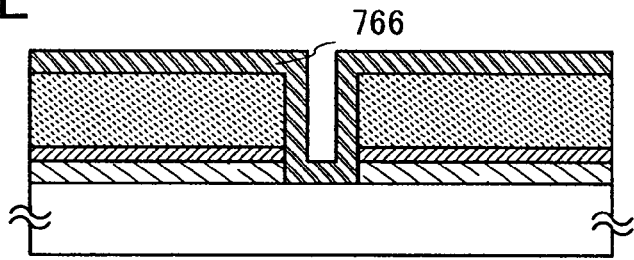

As shown in FIG. 38B, the light-absorbing layer 761 is selectively irradiated with laser light 763 from an insulating layer 762 side. An irradiated region of the light-absorbing layer 761 is evaporated by the irradiated energy, and the insulating layer 762 above the irradiated region of the light-absorbing layer 761 is removed. Consequently, a first opening 765 can be formed in the insulating layer 762 and the light-absorbing layer 761. The light-absorbing layer 761 is separated into light-absorbing layers 768a and 768b, and the insulating layer 762 is separated into insulating layers 767a and 767b (see FIG. 38C).

Next, the conductive layer 769 is removed by etching using the insulating layers 767a and 767b as masks so that a second opening 783 is formed. The conductive layer 769 is separated into conductive layers 784a and 784b (see FIG. 38D). A conductive film 766 is formed in the second opening 783 where the light-absorbing layers 768a and 768b, the conductive layers 784a and 784b, and the substrate 760 are exposed, so that the light-absorbing layers 768a and 768b, the conductive layers 784a and 784b, and the conductive film 766 can be electrically connected to one another (see FIG. 38E).

Further, a conductive layer below a light-absorbing layer may also be removed by laser light irradiation to form a first opening. The first opening in the conductive layer may be formed to expose a substrate; or only an upper portion of the conductive layer may be removed to leave the conductive layer at a bottom surface of the first opening. An example in which a first opening is formed in an insulating layer, a light-absorbing layer, and a conductive layer is shown in FIGS. 39A to 39E. A conductive layer 779, a light-absorbing layer 771, and an insulating layer 772 are formed over a substrate 770 (see FIG. 39A).

Figure 39A:
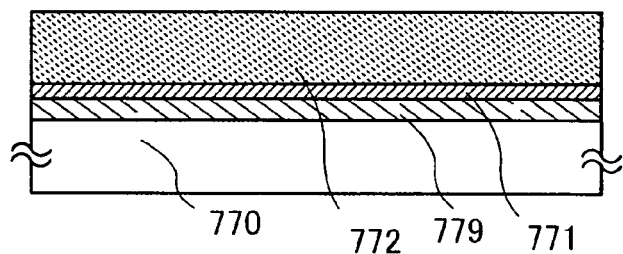
FIGS. 39A to 39E are schematic diagrams showing the present invention.
Figure 39B:
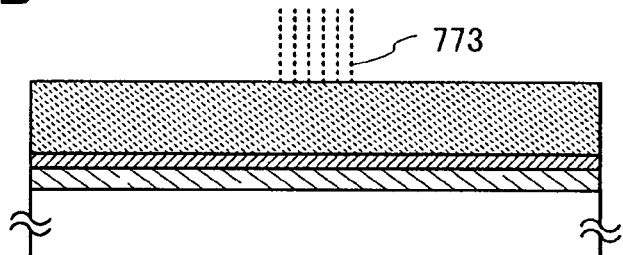
Figure 39C:
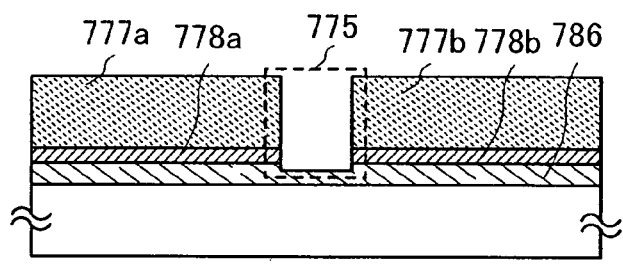
Figure 39D:
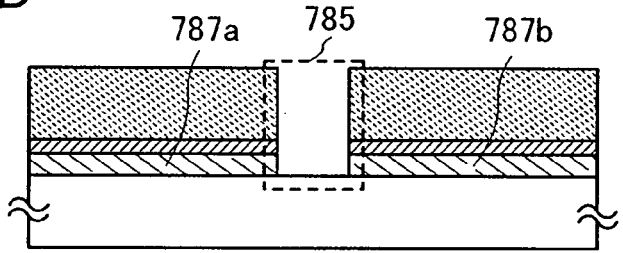
Figure 39E:
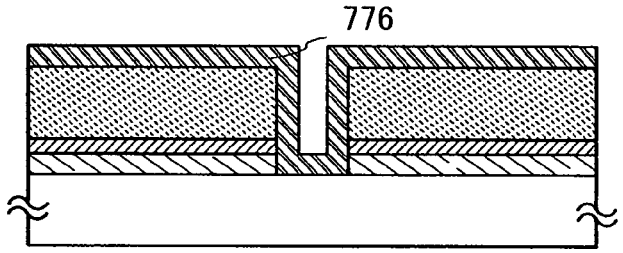

As shown in FIG. 39B, the light-absorbing layer 771 is selectively irradiated with laser light 773 from an insulating layer 772 side. An irradiated region of the light-absorbing layer 771 and part of the conductive layer are evaporated by the irradiated energy, and the insulating layer 772 above the conductive layer 779 and the irradiated region of the light-absorbing layer 771 is removed. Consequently, a first opening 775 can be formed in the insulating layer 772, the light-absorbing layer 771, and the conductive layer 779. The conductive layer 779 is processed into a conductive layer 786, the light-absorbing layer 771 is separated into light-absorbing layers 778a and 778b, and the insulating layer 772 is separated into insulating layers 777a and 777b (see FIG. 39C).

Next, the conductive layer 786 is removed by etching using the insulating layers 777a and 777b and the light-absorbing layers 778a and 778b as masks so that a second opening 785 is formed. The conductive layer 786 is separated into conductive layers 787a and 787b (see FIG. 39D). A conductive film 776 is formed in the second opening 785 where the light-absorbing layers 778a and 778b, the conductive layers 787a and 787b, and the substrate 770 are exposed, so that the light-absorbing layers 778a and 778b, the conductive layers 787a and 787b, and the conductive film 786 can be electrically connected to one another (see FIG. 39E).

Further, a conductive layer below a light-absorbing layer may also be removed by laser light irradiation to form an opening. The opening in the conductive layer may be formed to expose a substrate; or only an upper portion of the conductive layer may be removed to leave the conductive layer at a bottom surface of the opening.

As described above, a light-absorbing layer may also be stacked over a conductive layer (or a semiconductor layer). Further, a plurality of light-absorbing layers and/or a plurality of conductive layers may be stacked.

After the opening is formed by laser light irradiation, the conductive material or the insulating material which remains around the opening (a residue in the portion where the conductive layer or the insulating layer is removed) may be washed with a liquid to be removed. In this case, a non-reactive substance such as water may be used for washing, or a chemical solution such as an etchant which reacts with (dissolves) the insulating layer may be used. With an etchant, the opening is over-etched, and dust and the like are removed, so that the surface is more planarized. Further, the opening can also be widened.

In this manner, in the opening provided in the insulating layer, the light-absorbing layer below the insulating layer and the conductive layer over the insulating layer are electrically connected to each other. In this embodiment mode, the light-absorbing layer is formed of a metal with a high sublimation property over the conductive layer, and energy is supplied to the light-absorbing layer by laser light, so that the opening is formed in the insulating layer formed over the light-absorbing layer and the conductive layer. The size and shape of the opening formed in the insulating layer can be controlled by laser light irradiation conditions (e.g., energy intensity and irradiation period of time) and properties of materials for the insulating layer and the conductive layer (e.g., thermal conductivity, melting point, and boiling point). An example of the size of the laser light and the size of the opening is shown in FIGS. 4A to 4E.

Over a substrate 300, a conductive layer 309 (309a, 309b, and 309c) and a light-absorbing layer 301 are stacked, and an insulating layer 302 is formed to cover the conductive layer 309 (309a, 309b, and 309c) and the light-absorbing layer 301. In FIGS. 4A to 4E, the conductive layer 309 (309a, 309b, and 309c) has a stacked-layer structure including a plurality of thin films. For example, titanium can be used for the conductive layer 309a, aluminum can be used for the conductive layer 309b, titanium can be used for the conductive layer 309c, and chromium can be used for the light-absorbing layer 301. Further, tungsten, molybdenum, or the like may be used for the conductive layer 309 (309a, 309b, and 309c) as well. Needless to say, the light-absorbing layer 301 can also have a stacked-layer structure, and a stacked layer including copper and chromium or the like can be used.

Figure 4A:
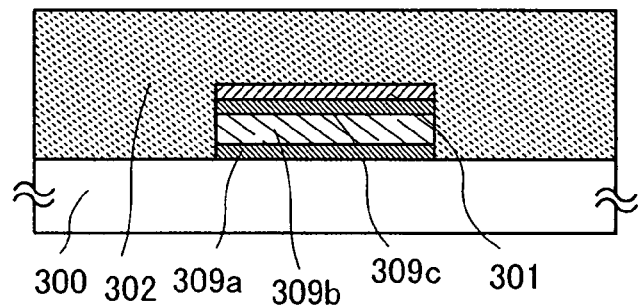
FIGS. 4A to 4E are schematic diagrams showing the present invention.
Figure 4B:
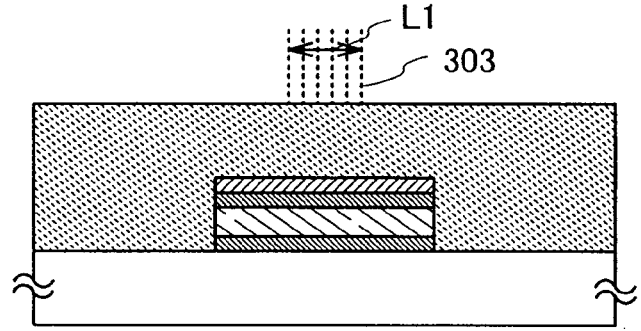
Figure 4C:
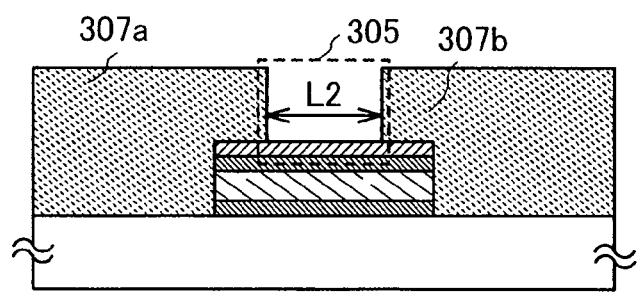
Figure 4D:
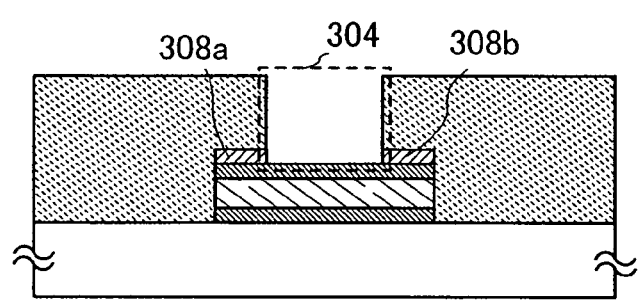
Figure 4E:
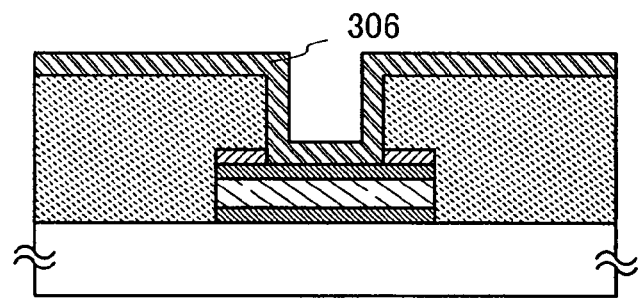

The insulating layer 302 and the light-absorbing layer 301 are selectively irradiated with laser light 303 having a diameter L1. As the energy of the laser light 303 is larger, the energy received by the light-absorbing layer 301 becomes larger and heat reaches an irradiated region and the peripheral portion thereof in the light-absorbing layer 301 as shown in FIG. 4C. Therefore, in the insulating layer 302, a first opening 305 having a diameter L2 that is larger than the diameter L1 of the laser light 303 is formed. In this manner, the insulating layer 302 is separated into insulating layers 307a and 307b, and the first opening 305 is formed.

Next, the light-absorbing layer 301 is removed by etching using the insulating layers 307a and 307b as masks so that a second opening 304 reaching the conductive layer 309 is formed. The light-absorbing layer 301 is separated into light-absorbing layers 308a and 308b (see FIG. 4D). A conductive film 306 is formed in the second opening 304 where the light-absorbing layers 308a and 308b and the conductive layer 309a are exposed, so that the light-absorbing layers 308a and 308b, the conductive layer 309, and the conductive film 306 can be electrically connected to one another (see FIG. 4E).

The size of the opening with respect to an irradiated region determined by the diameter of laser light depends on the energy amount of the laser light. When the energy of laser light is as large as enough, the energy reaches the periphery of the irradiated region, so that an opening which is larger than the irradiated region with the laser light is formed in the insulating layer. To the contrary, when the energy of laser light is small, an opening which has almost the same size as the irradiated region is formed in the insulating layer.

As described above, by controlling the energy of the laser light, the size of the opening formed in the insulating layer can be controlled as appropriate.

Since the opening can be selectively formed by laser light, it is not necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the first opening which is formed by the laser light irradiation, as a mask, the conductive light-absorbing layer (or the conductive layer below the light-absorbing layer) can be exposed in the second opening.

As described above, an opening (a contact hole) which electrically connects conductive layers can be formed in an insulating layer by laser light irradiation without forming a mask layer using a complicated photolithography process.

Accordingly, by manufacturing a display device according to the present invention, the manufacturing process can be simplified, so that loss of materials and the cost can be reduced. Therefore, display devices can be manufactured with a high yield.

Embodiment Mode 3

Figure 3A:
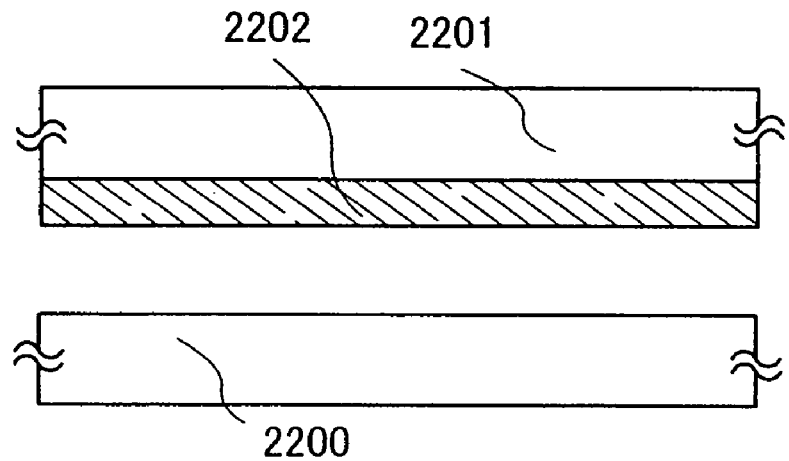
FIGS. 3A to 3C are schematic diagrams showing the present invention.
Figure 3B:
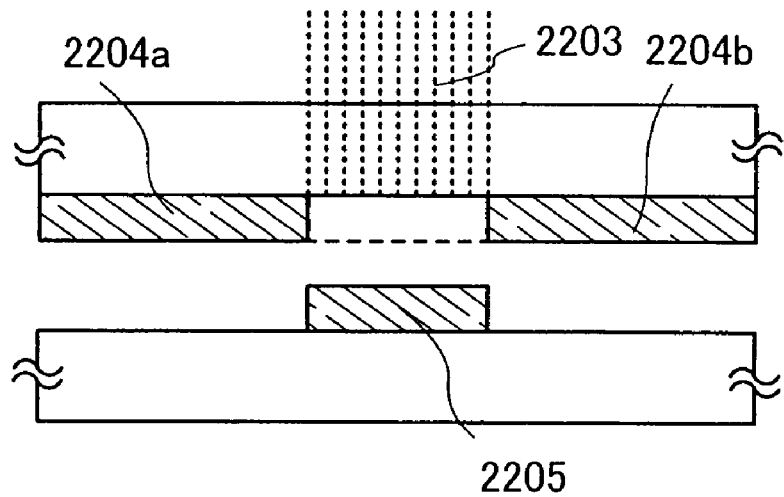
Figure 3C:
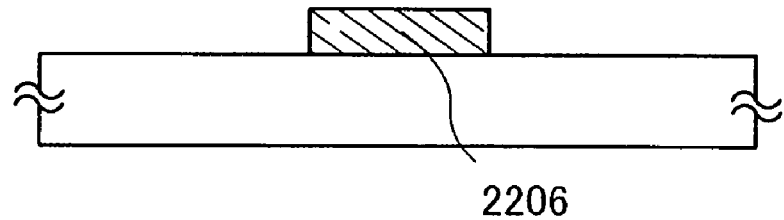

In this embodiment mode, a method for manufacturing a display device in order to manufacture the display devices at low cost through a highly reliable, more simplified process is described with reference to FIGS. 3A to 3C.

In this embodiment mode, components (also called patterns) such as a conductive layer, a semiconductor layer, or the like are selectively formed to have a predetermined shape without using a photolithography process in processing into a desired pattern. In the present invention, the components (also called the patterns) means a conductive layer such as a wiring layer, a gate electrode layer, a source electrode layer, or a drain electrode layer, a semiconductor layer, a mask layer, an insulating layer, or the like included in a thin film transistor or a display device and include all component parts formed to have a predetermined shape.

In this embodiment mode, a light-absorbing film such as a conductive film or a semiconductor film is formed over a light-transmitting transposing substrate and a transposing substrate side is irradiated with laser light, so that the light-absorbing film corresponding to a laser light irradiated region is transposed to a transposed substrate, thereby forming a light-absorbing layer such as a conductive layer or a semiconductor layer with a desired shape (pattern). In this specification, the substrate over which the light-absorbing film such as the conductive film or the semiconductor film is formed and which is irradiated with laser light in the first step is referred to as the transposing substrate, and the substrate over which the light-absorbing layer such as the conductive layer or the semiconductor layer is selectively formed finally is referred to as the transposed substrate. Since the light-absorbing film such as the conductive film or the semiconductor film can be selectively formed to have a desired shape without using a photolithography process, the manufacturing process can be simplified and cost can be reduced, for example.

A method for forming a thin film described in this embodiment mode is described in detail with reference to FIGS. 3A to 3C. In FIGS. 3A to 3C, a light-absorbing film 2202 is formed over a first substrate 2201 which is a transposing substrate, and the first substrate 2201 and a second substrate 2200 which is a transposed substrate are disposed to interpose the light-absorbing film 2202 therebetween.

Laser light 2203 is transmitted through the substrate 2201 to selectively irradiate the light-absorbing film 2202 with the laser light 2203 from a substrate 2201 side. The light-absorbing film 2202 in a region irradiated with the laser light 2203 absorbs the laser light 2203 and is transposed to a second substrate 2200 side as a light-absorbing layer 2205 by energy of the heat or the like. On the other hand, the other region which is not irradiated with the laser light 2203 is left on the first substrate 2201 side as light-absorbing films 2204a and 2204b. In this manner, when processing a thin film which is a light-absorbing layer 2206 into a desired pattern, without using a photolithography process, a component (also called a pattern) such as a conductive layer or a semiconductor layer is selectively formed to have a desired shape.

As for the laser light, a similar laser light to Embodiment Mode 1 can be used and irradiation can be similarly performed and the laser irradiation writing system shown in FIG. 30 may be used. Therefore, specific description thereof is omitted here.

After being transposed by the laser light, the light-absorbing layer may be subjected to heat treatment or may be irradiated with laser light.

A material which absorbs irradiated light is used for the light-absorbing film 2202 which is an object to be transposed, and a light transmitting substrate which transmits irradiated light is used for the first substrate 2201. By the present invention, transposition can be freely performed to various substrates; therefore, the range of selectable materials of the transposed substrate is increased. Further, an inexpensive material can be selected for the transposed substrate, so that a display device can be manufactured at low cost as well as the display device can have various functions in accordance with use application.

The thin film formation method in this embodiment mode can be used for forming a conductive layer such as a wiring layer, a gate electrode layer, a source electrode layer, or a drain electrode layer, a semiconductor layer, a mask layer, an insulating layer, or the like included in a thin film transistor or a display device. A film using a desired material may be formed as a light-absorbing layer, and light which is absorbed in the film may be selected and used for light irradiation.

For example, a conductive material can be used as the light-absorbing layer to be transposed. For example, one or a plurality of kinds of chromium, tantalum, silver, molybdenum, nickel, titanium, cobalt, copper, and aluminum can be used. Alternatively, a semiconductor material can be used as the light-absorbing layer. For example, an inorganic semiconductor material such as silicon, germanium, silicon germanium, gallium arsenide, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. The light-absorbing layer may also be added with hydrogen or an inert gas (e.g., helium (He), argon (Ar), krypton (Kr), neon (Ne), or xenon (Xe)).

By the present invention, components such as a wiring included in a display device can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 4

Figure 25A:
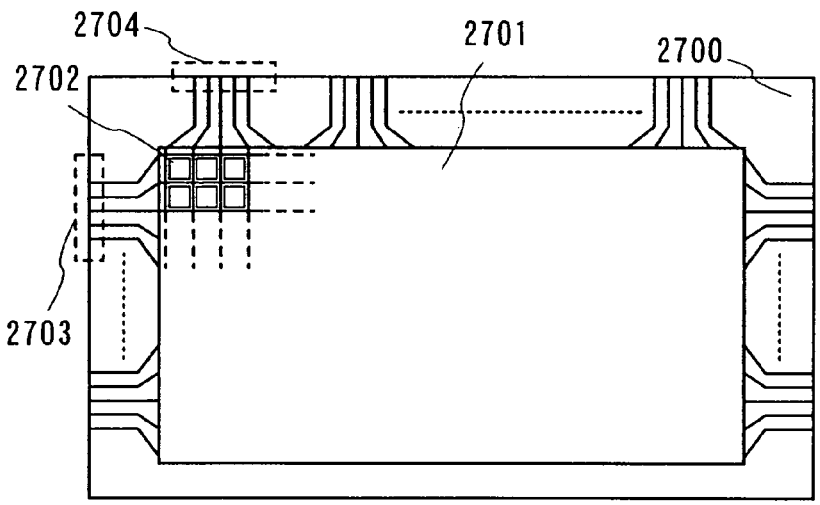
FIGS. 25A to 25C are top diagrams each of a display device of the present invention.

FIG. 25A is a top diagram showing a structure of a display panel of the present invention, in which a pixel region 2701 in which pixels 2702 are arranged in matrix, a scan line input terminal 2703, and a signal line input terminal 2704 are formed over a substrate 2700 having an insulating surface. The number of pixels may be set according to various standards: the number of pixels of XGA for RGB full-color display may be 1024×768×3 (RGB), that of UXGA for RGB full-color display may be 1600×1200×3 (RGB), and that corresponding to a full-spec high vision for RGB full-color display may be 1920×1080×3 (RGB).

Scan lines extended from the scan line input terminal 2703 intersect with signal lines extended from the signal line input terminal 2704, and the pixels 2702 are arranged in matrix at the intersections. Each pixel 2702 is provided with a switching element and a pixel electrode connected to the switching element. A typical example of the switching element is a TFT. A gate electrode side of the TFT is connected to the scan line, and a source or drain side thereof is connected to the signal line, so that each pixel can be controlled independently by signals inputted from outside.

Figure 26A:
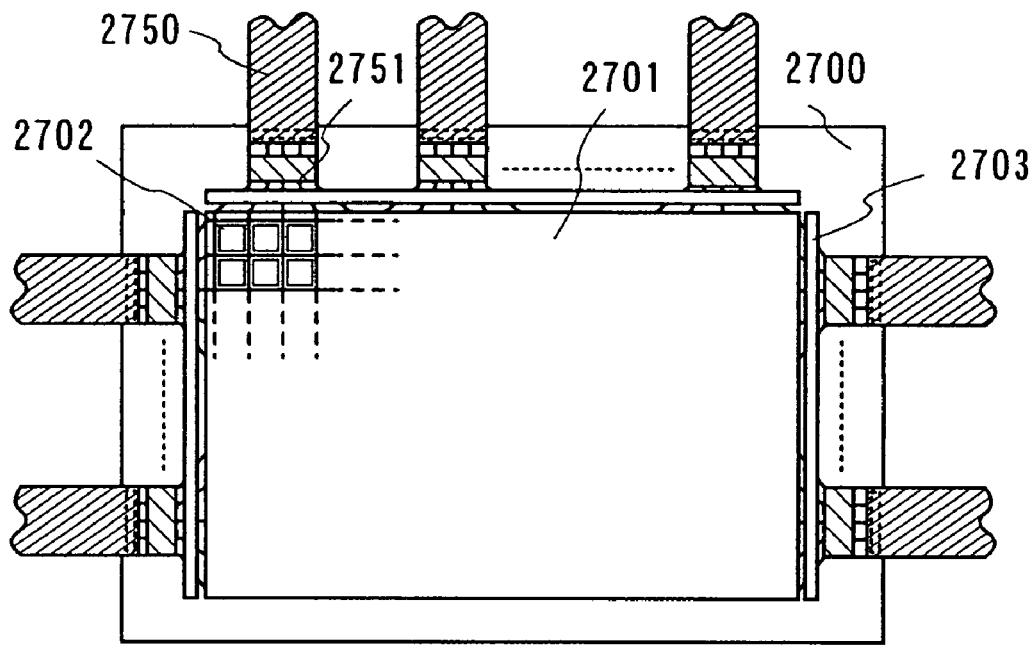
FIGS. 26A and 26B are top diagrams each of a display device of the present invention.
Figure 26B:
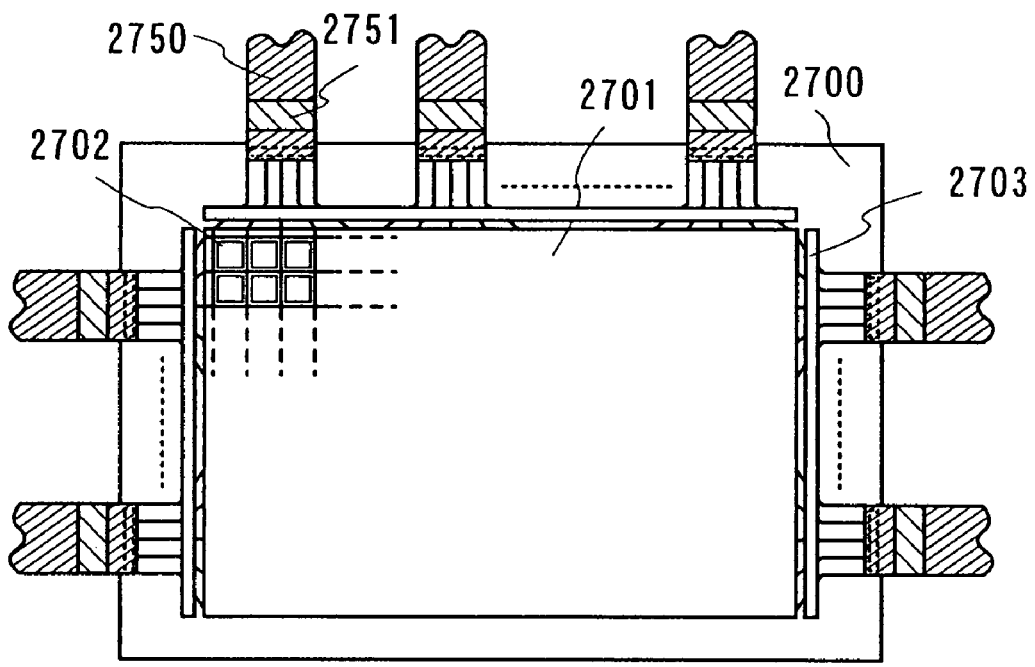

Although FIG. 25A shows the structure of the display panel in which signals inputted to the scan and signal lines are controlled by an external driver circuit, driver ICs 2751 may be mounted on the substrate 2700 by COG (Chip On Glass) as shown in FIG. 26A. Further, the driver ICs may also be mounted by TAB (Tape Automated Bonding) as shown in FIG. 26B. The driver ICs may be either ones formed using a single crystalline semiconductor substrate or circuits that are formed using a TFT over a glass substrate. In FIGS. 26A and 26B, each driver IC 2751 is connected to an FPC 2750.

Figure 25B:
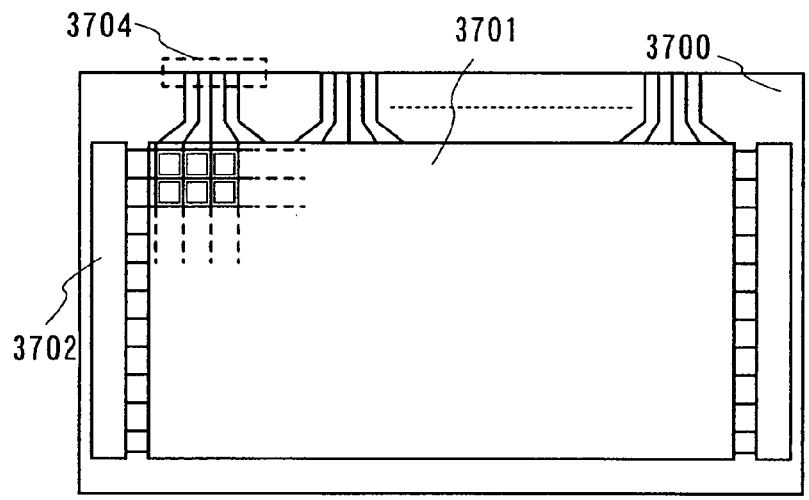
Figure 25C:
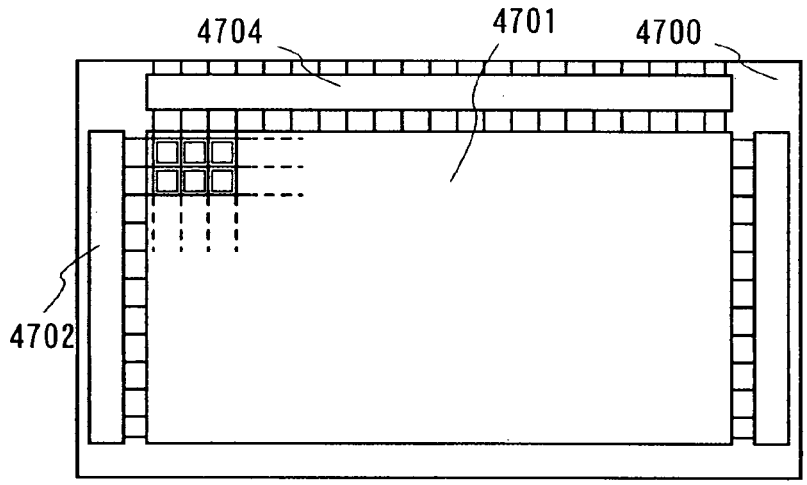

Further, in the case where a TFT provided in each pixel is formed using a polycrystalline (microcrystalline) semiconductor having high crystallinity, a scan line driver circuit 3702 may be formed over a substrate 3700 as shown in FIG. 25B. In FIG. 25B, reference numeral 3701 denotes a pixel region, and a signal line driver circuit is controlled by an external driver circuit, which is similar to FIG. 25A. In the case where, like the TFT formed in the present invention, a TFT provided in each pixel is formed using a polycrystalline (microcrystalline) semiconductor, a single crystalline semiconductor, or the like with high mobility, a scan line driver circuit 4702 and a signal line driver circuit 4704 can be formed over the same substrate 4700 as a pixel region 4701, as shown in FIG. 25C.

Figure 14A:
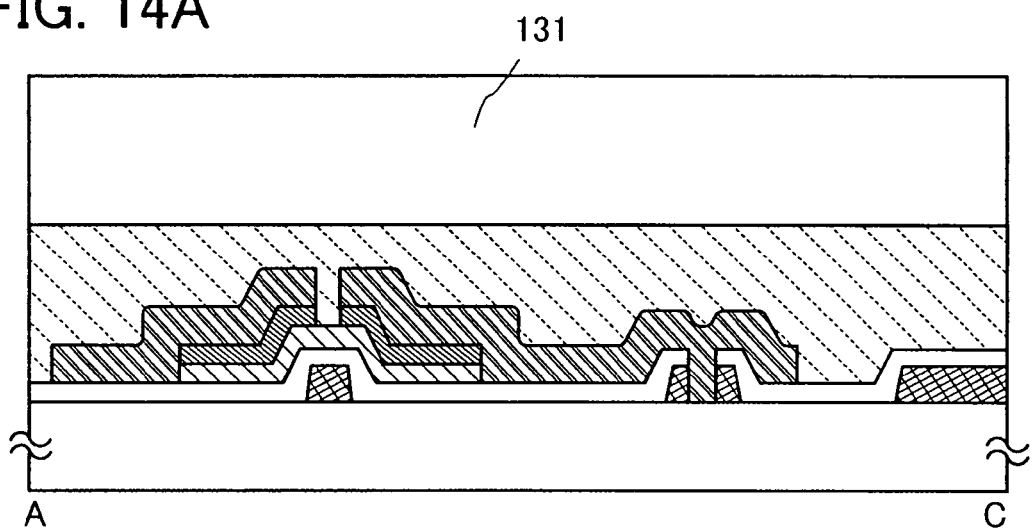
FIGS. 14A and 14B are diagrams showing a method for manufacturing a display device of the present invention.
Figure 14B:
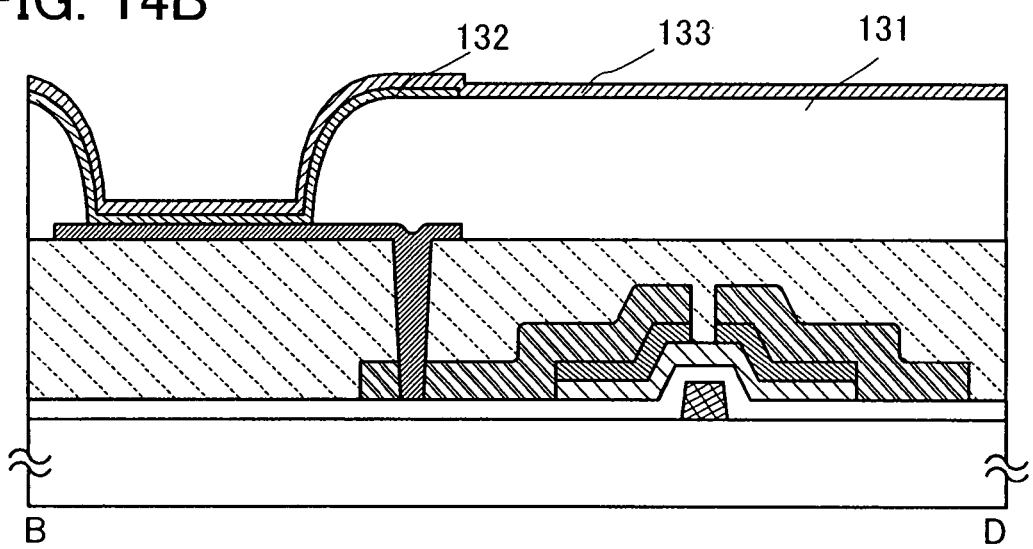

Embodiment modes of the present invention are described with reference to FIGS. 8A to 8C, 9A to 9C, 10A to 10C, 11A to 11C, 12A to 12D, 13A to 13C, and 14A and 14B. Specifically, a method for manufacturing a display device including an inversely staggered thin film transistor, to which the present invention is applied is described. FIGS. 8A, 9A, 10A, 11A, 12A, and 13A are top diagrams each of a pixel region of a display device; FIGS. 8B, 9B, 10B, 11B, 12B, and 13B are cross-sectional diagrams taken along lines A-C in FIGS. 8A, 9A, 10A, 11A, 12A, and 13A, respectively; and FIGS. 8C, 9C, 10C, 11C, 12C, and 13C are cross-sectional diagrams taken along lines B-D in FIGS. 8A, 9A, 10A, 11A, 12A, and 13A, respectively. FIGS. 14A and 14B are also cross-sectional diagrams of a display device.

As a substrate 100, a glass substrate made of barium borosilicate glass, aluminoborosilicate glass, or the like; a quartz substrate; a metal substrate; or a plastic substrate having heat resistance that can withstand process temperature of this manufacturing process is used. Further, the surface of the substrate 100 may be polished by a CMP method or the like to be planarized. Note that an insulating layer may be formed over the substrate 100. The insulating layer may be formed of either a single layer or a stacked layer using an oxide material containing silicon or a nitride material containing silicon by various methods such as a CVD method including a plasma CVD method, a sputtering method, or a spin coating method. It is not necessary to form this insulating layer; however, this insulating layer has an advantageous effect of blocking contaminants and the like from the substrate 100.

Gate electrode layers 103 (103a and 103b) and 104 (104a and 104b) are formed over the substrate 100. Each of the gate electrode layers 103 (103a and 103b) and 104 (104a and 104b) may be formed of an element selected from Ag, Au, Ni, Pt, Pd, Ir, Rh, Ta, W, Ti, Mo, Al, and Cu, or an alloy material or a compound material containing the above element as its main component. Further, a semiconductor film typified by a polycrystalline silicon film doped with an impurity element such as phosphorus, or an AgPdCu alloy may be used. Further, a single-layer structure or a structure including a plurality of layers may be used. For example, a two-layer structure of a tungsten nitride film and a molybdenum (Mo) film or a three-layer structure in which a tungsten film with a thickness of 50 nm, an alloy film of aluminum and silicon (Al—Si) with a thickness of 500 nm, and a titanium nitride film with a thickness of 30 nm are sequentially stacked may be used. In the case of the three-layer structure, tungsten nitride may be used instead of tungsten of the first conductive film, an alloy film of aluminum and titanium (Al—Ti) may be used instead of the alloy film of aluminum and silicon (Al—Si) of the second conductive film, and a titanium film may be used instead of the titanium nitride film of the third conductive film.

The gate electrode layers 103a, 103b, 104a, and 104b can be formed by using a sputtering method, a PVD (Physical Vapor Deposition) method, a CVD (Chemical Vapor Deposition) method such as a low-pressure CVD (LPCVD) method or a plasma CVD method, or the like, and processing using a mask layer. Further, a method by which a component can be transferred or drawn to be a desired pattern, such as various printing methods (a method for forming a component to be a desired pattern, e.g., screen (mimeograph) printing, offset (planograph) printing, relief printing, or gravure (intaglio) printing), a droplet discharging method, a dispenser method, a selective-coating method, or the like can also be used.

A conductive film may be processed by dry etching or wet etching. By using an ICP (Inductively Coupled Plasma) etching method and adjusting etching conditions (e.g., the amount of power applied to a coiled electrode, the amount of power applied to an electrode on a substrate side, the electrode temperature on the substrate side, or the like) as appropriate, each electrode layer can be etched into a tapered shape. Note that as an etching gas, a chlorine-based gas such as $Cl_2$, $BCl_3$, $SiCl_4$, or $CCl_4$, a fluorine-based gas such as $CF_4$, $SF_6$, or $NF_3$, or $O_2$ can be used as appropriate.

In this embodiment mode, as for formation of each gate electrode layer, after a conductive film which is a light-absorbing film is formed over a transposing substrate, the gate electrode layer is selectively formed over a transposed substrate by laser light by being processed into a desired shape. The light-absorbing film is formed over a substrate 101 by a sputtering method, a PVD (Physical Vapor Deposition) method, a CVD method such as a low-pressure CVD (LPCVD) method or a plasma CVD method, or the like.

The light-absorbing film is formed over the substrate 101 which is a transposing substrate, and the substrate 101 and the substrate 100 which is a transposed substrate are disposed to interpose the light-absorbing film therebetween.

The light-absorbing film is selectively irradiated with laser light 112a, 112b, 112c, and 112d through the substrate 101 from the substrate 101 side. The light-absorbing film in regions irradiated with the laser light 112a, 112b, 112c, and 112d absorbs the laser light 112a, 112b, 112c, and 112d and is transposed to a substrate 100 side as the gate electrode layers 103 (103a and 103b) and 104 (104a and 104b) by energy of the heat or the like. On the other hand, the other region which is not irradiated with the laser light 112a, 112b, 112c, and 112d is left on the substrate 101 side as light-absorbing films 102a, 102b, 102c, 102d, and 102e. In this manner, by transposing without using a photolithography process, the gate electrode layers 103 (103a and 103b) and 104 (104a and 104b) are selectively formed to have a desired shape.

After being transposed by the laser light, the light-absorbing layer may be subjected to heat treatment or may be irradiated with laser light.

A material which absorbs irradiated light is used for the light-absorbing film which is an object to be transposed, and a light transmitting substrate which transmits irradiated light is used for the substrate 101. By the present invention, transposition can be freely performed to various substrates; therefore, the range of selectable materials of the transposed substrate is increased. Further, an inexpensive material can be selected for the transposed substrate, so that a display device can be manufactured at low cost as well as the display device can have various functions in accordance with use application.

Next, a gate insulating layer 105 is formed over the gate electrode layers 103 (103a and 103b) and 104 (104a and 104b). The gate insulating layer 106 may be formed of an oxide material of silicon, a nitride material of silicon, or the like, and either a single-layer structure or a stacked-layer structure may be employed. In this embodiment mode, a two-layer structure of a silicon nitride film and a silicon oxide film is used. Alternatively, a single layer of a silicon oxynitride film or a stacked layer including three or more layers may be used. Preferably, a silicon nitride film having dense film quality is used. Further, in the case where silver, copper, or the like is used for each conductive layer formed by a droplet discharging method, an effect of preventing impurity diffusion and planarizing the surface can be obtained by forming a silicon nitride film or a NiB film as a barrier film thereover. Note that in order to form a dense insulating film with less gate leakage current at a low deposition temperature, a rare gas element such as argon may be mixed into the insulating film by being contained in a reaction gas.

Next, a second opening 137 is formed in the gate insulating layer 105. A mask layer is formed of an insulator such as resist or polyimide by a droplet discharging method. The second opening 137 is formed in part of the gate insulating layer 105 by etching using the mask layer, so that part of the gate electrode layer 104 provided below the gate insulating layer 105 can be exposed. Although either plasma etching (dry etching) or wet etching may be employed for the etching, plasma etching is suitable to process a large substrate. As an etching gas, a fluorine-based or chlorine-based gas such as $CF_4$, $NF_3$, $Cl_2$, or $BCl_3$ is used. An inert gas such as He or Ar may be added as needed. Further, by employing an etching process using atmospheric discharge plasma, a local discharge process can also be performed, so that a mask layer does not need to be formed over an entire surface of a substrate.

Figure 9A:
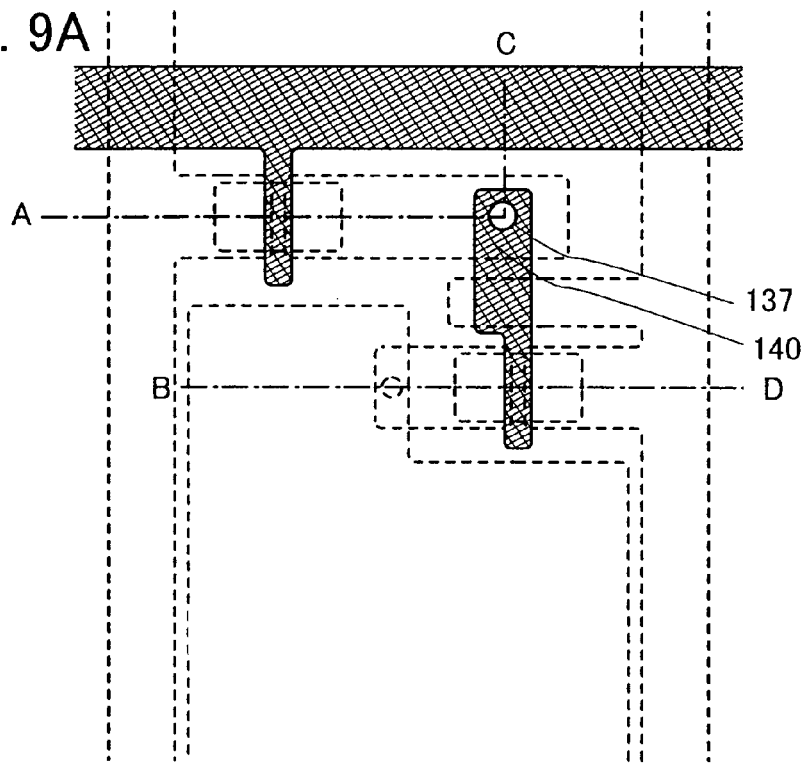
FIGS. 9A to 9D are diagrams showing a method for manufacturing a display device of the present invention.
Figure 9B:
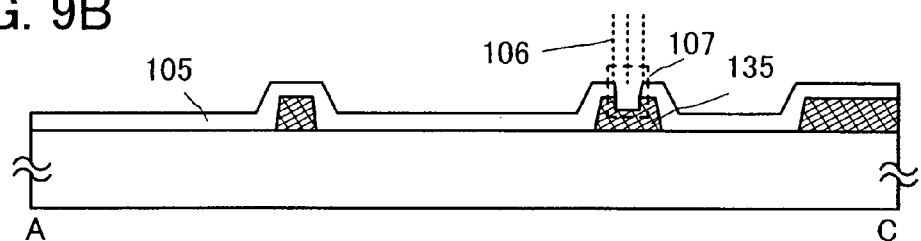
Figure 9C:
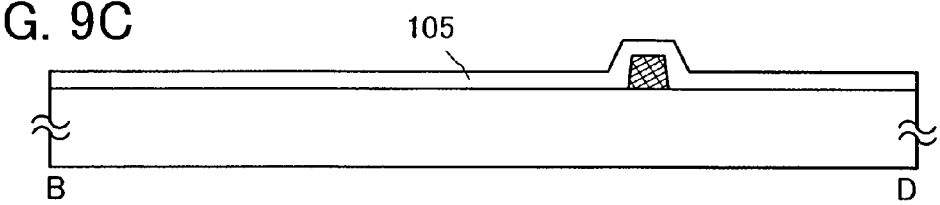
Figure 9D:
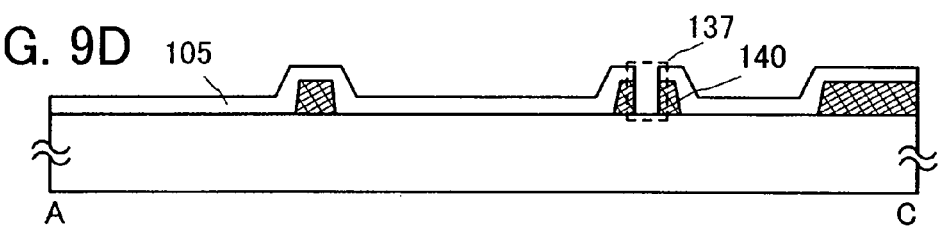
Figure 10A:
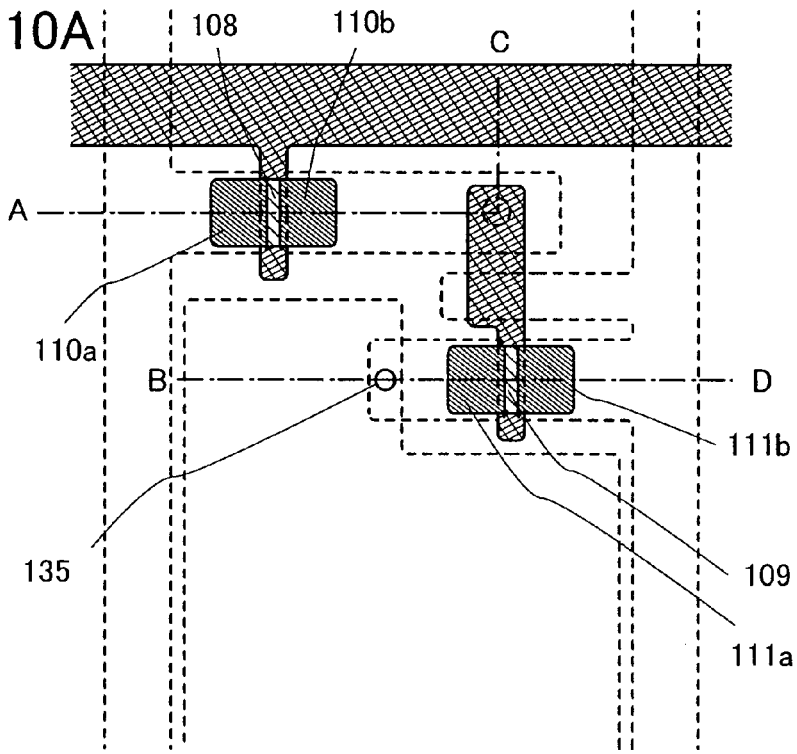
FIGS. 10A to 10C are diagrams showing a method for manufacturing a display device of the present invention.
Figure 10B:
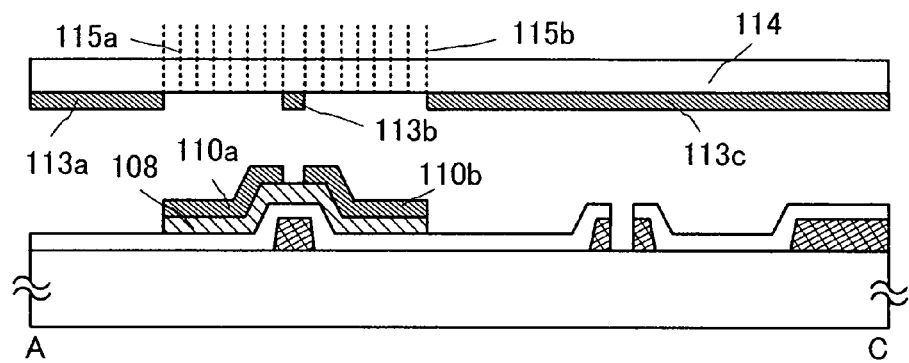
Figure 10C:
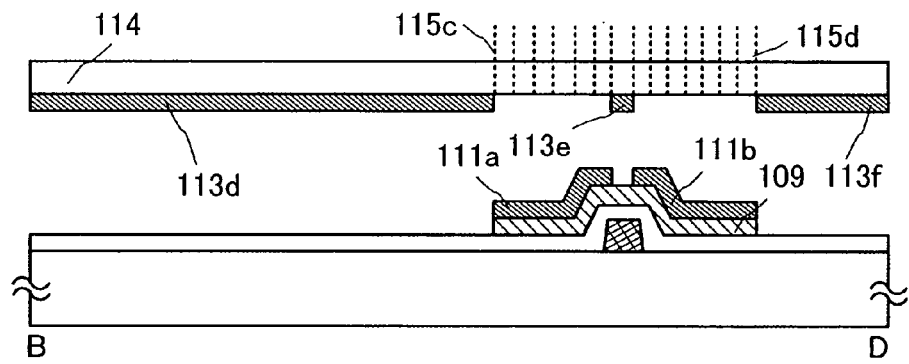

In this embodiment mode, the first opening 107 is formed by laser light as described in Embodiment Mode 1, and the second opening 137 is formed by etching (see FIGS. 9A to 9D). Note that FIGS. 9B and 9D correspond to each other, and a subsequent step of FIG. 9B is FIG. 9D. FIG. 9A which is the top diagram corresponds to FIG. 9D. In this embodiment mode, the gate electrode layer 104 functions as a light-absorbing layer.

The gate electrode layer 104 is selectively irradiated with laser light 106 from a gate insulating layer 105 side. Part of an irradiated region of the gate electrode layer 104 is evaporated by the irradiated energy, so that a gate electrode layer 135 is formed. The gate insulating layer 105 above the gate electrode layer 135 is removed, so that the first opening 107 can be formed.

Next, the gate electrode layer 135 is removed by etching using the gate insulating layer 105 having the first opening 107 as a mask, so that the second opening 137 is formed. The gate electrode layer 135 is processed into a gate electrode layer 140 (see FIG. 9D). A conductive film forming a source or drain electrode layer is formed in the second opening 137 where the gate electrode layer 140 is exposed, thereby the gate electrode layer 140 and the source or drain electrode layer can be electrically connected to each other. The first and second openings 107 and 137 may be formed after formation of a semiconductor layer.

The etching for forming the second opening 137 may be performed by both of or either one of wet etching and dry etching, and may be performed plural times.

Next, the semiconductor layer is formed. A semiconductor layer having one conductivity type may be formed as needed. Further, an NMOS structure of an n-channel TFT in which a semiconductor layer having n-type conductivity is formed, a PMOS structure of a p-channel TFT in which a semiconductor layer having p-type conductivity is formed, or a CMOS structure of an n-channel TFT and a p-channel TFT can be manufactured. Further, in order to impart conductivity type, an element which provides conductivity type may be added to a semiconductor layer by doping to form an impurity region in the semiconductor layer, so that an n-channel TFT or a p-channel TFT can be formed. Instead of forming a semiconductor layer having n-type conductivity, plasma treatment with a $PH_3$ gas may be performed, to provide conductivity type for a semiconductor layer.

As a material for forming the semiconductor layer, the following can be used: an amorphous semiconductor (hereinafter also referred to as an "AS") formed by a vapor deposition method using a semiconductor material gas typified by silane or germane or a sputtering method; a polycrystalline semiconductor or a semi-amorphous semiconductor (also referred to as microcrystal and hereinafter also referred to as a "SAS") formed by crystallizing the amorphous semiconductor by using light energy or thermal energy; or the like. The semiconductor layer can be formed by various methods (e.g., a sputtering method, an LPCVD method, or a plasma CVD method).

An SAS is a semiconductor having an intermediate structure between amorphous and crystalline (including single crystal and polycrystalline) structures and a third state which is stable in free energy. Further, an SAS includes a crystalline region with a short-distance order and lattice distortion. A crystal grain having a diameter of 0.5 to 20 nm can be observed at least in part of the film. In the case where silicon is contained as a main component, Raman spectrum is shifted toward the low-frequency side that is lower than 520 $cm^{-1}$. The diffraction peaks of (111) and (220), which are considered to be derived from a silicon crystal lattice, are observed by X-ray diffraction. An SAS contains hydrogen or halogen at 1 atomic % or more in order to terminate dangling bonds. An SAS is formed by glow discharge decomposition (plasma CVD) of a gas containing silicon. As the gas containing silicon, as well as $SiH_4$, any of $Si_2H_6$, $SiH_2Cl_2$, $SiHCl_3$, $SiCl_4$, $SiF_4$, and the like can be used. Further, $F_2$ or $GeF_4$ may be mixed. The gas containing silicon may be diluted with $H_2$, or $H_2$ and one or a plurality of kinds of rare gas elements of He, Ar, Kr, and Ne. The dilution ratio is 1:2 to 1:1000, pressure is approximately 0.1 to 133 Pa, and a power source frequency is 1 to 120 MHz, preferably 13 to 60 MHz. A temperature for heating the substrate is preferably less than or equal to 300° C., and an SAS can also be formed at 100 to 200° C. It is preferable that the concentration of impurities of atmospheric components such as oxygen, nitrogen, and carbon as impurity elements in the film be less than or equal to $1\times10^{20}$ $cm^{-3}$. In particular, an oxygen concentration is preferably less than or equal to $5\times10^{19}/cm^{-3}$, and more preferably less than or equal to $1\times10^{19}/cm^{-3}$. Further, when a rare gas element such as helium, argon, krypton, or neon is contained to further increase the lattice distortion, stability can be enhanced, and a favorable SAS can be obtained. Further, as the semiconductor layer, a stacked layer in which an SAS layer formed by using a hydrogen-based gas is stacked over an SAS layer formed by using a fluorine-based gas may be used.

As a typical example of an amorphous semiconductor, hydrogenated amorphous silicon can be given; and as a typical example of a crystalline semiconductor, polysilicon or the like can be given. Polysilicon (polycrystalline silicon) includes so-called high-temperature polysilicon formed using polysilicon which is formed at a processing temperature of greater than or equal to 800° C. as a main material, so-called low-temperature polysilicon formed using polysilicon which is formed at a processing temperature of less than or equal to 600° C. as a main material, polysilicon crystallized by adding an element which promotes crystallization, and the like. Of course, as described above, a semi-amorphous semiconductor or a semiconductor which includes a crystalline phase in part of the film can also be used.

When a crystalline semiconductor layer is used as the semiconductor layer, the crystalline semiconductor layer may be formed by various methods (e.g., a laser crystallization method, a thermal crystallization method, or a thermal crystallization method using an element such as nickel which promotes crystallization). Further, a microcrystalline semiconductor that is an SAS may be crystallized by laser irradiation to enhance crystallinity. In the case where the element which promotes crystallization is not used, before the amorphous silicon film is irradiated with laser light, the amorphous silicon film is heated at 500° C. for one hour in a nitrogen atmosphere to discharge hydrogen so that the hydrogen concentration in the amorphous silicon film becomes less than or equal to $1\times10^{20}$ $atoms/cm^3$. This is because, if the amorphous silicon film containing much hydrogen is irradiated with laser light, the amorphous silicon film would be broken.

A method for introducing a metal element into the amorphous semiconductor layer is not particularly limited as long as the metal element can be introduced into a surface of or inside the amorphous semiconductor layer. For example, a sputtering method, a CVD method, a plasma treatment method (including a plasma CVD method), an adsorption method, or a method for applying a solution of metal salt can be used. Among them, a method using a solution is simple and advantageous in that the concentration of the metal element can be easily controlled. At this time, it is desirable to form an oxide film by UV light irradiation in an oxygen atmosphere, a thermal oxidation method, treatment with either ozone water containing hydroxyl radicals or hydrogen peroxide, or the like to improve wettability of the surface of the amorphous semiconductor layer so that an aqueous solution is diffused on the entire surface of the amorphous semiconductor layer.

In order to crystallize the amorphous semiconductor layer, heat treatment may be combined with laser light irradiation, or either one of heat treatment and laser light irradiation may be performed plural times.

Further, the crystalline semiconductor layer may be directly formed over the substrate by a plasma method. Further, the crystalline semiconductor layer may also be selectively formed over the substrate by a linear plasma method.

An organic semiconductor material may be used as a semiconductor, and a printing method, a dispenser method, a spray method, a spin coating method, a droplet discharging method, or the like can be used. In this case, since the above-described etching step is not necessary, the number of steps can be reduced. As the organic semiconductor, a low-molecular material such as pentacene, a high-molecular material, or the like can be used. Further, an organic dye, a conductive high-molecular material, or the like can also be used. As the organic semiconductor material used in the present invention, a π-electron conjugated high-molecular material of which skeleton includes a conjugated double bond is desirable. Typically, a soluble high-molecular material such as polythiophene, polyfluorene, poly(3-alkylthiophene), or a polythiophene derivative can be used.

Further, as the organic semiconductor material which can be used in the present invention, there is a material by which a semiconductor layer can be formed by depositing a soluble precursor thereof to form a film and processing it. Note that as examples of such an organic semiconductor material, there are polythienylenevinylene, poly(2,5-thienylenevinylene), polyacetylene, polyacetylene derivatives, polyallylenevinylene, and the like.

In order to change the precursor into the organic semiconductor, not only heat treatment but also addition of a reaction catalyst such as a hydrogen chloride gas is performed. Further, as a typical solvent for dissolving the soluble organic semiconductor material, the following can be used: toluene, xylene, chlorobenzene, dichlorobenzene, anisole, chloroform, dichloromethane, γbutyllactone, butylcellosolve, cyclohexane, NMP (N-methyl-2-pyrrolidone), cyclohexanone, 2-butanon, dioxane, dimethylformamide (DMF), THF (tetrahydrofuran), or the like.

In this embodiment mode, each of a semiconductor layer and a semiconductor layer having one conductivity type is formed as follows: a semiconductor film which is a light-absorbing film is formed over a transposing substrate, and transposed to a transposed substrate while being selectively processed into a desired shape by laser light. The semiconductor film which is the light-absorbing film is formed over a substrate 114 by a sputtering method, a PVD (Physical Vapor Deposition) method, a CVD method such as a low-pressure CVD (LPCVD) method or a plasma CVD method, or the like.

The light-absorbing film is formed over the substrate 114 which is the transposing substrate, and the substrate 114 and the substrate 100 which is the transposed substrate are disposed to interpose the light-absorbing film therebetween.

Laser light 115a, 115b, 115c, and 115d are transmitted through 114 to selectively irradiate the light-absorbing film with the laser light from a substrate 114 side. The light-absorbing film in regions irradiated with the laser light 115a, 115b, 115c, and 115d absorbs the laser light 115a, 115b, 115c, and 115d and is transposed to a substrate 100 side as semiconductor layers having one conductivity type 110a, 110b, 111a, and 111b by energy of the heat or the like. On the other hand, the other region which is not irradiated with the laser light 115a, 115b, 115c, and 115d is left on the substrate 114 side as light-absorbing films 113a to 113f. Semiconductor layers 108 and 109 can also be formed by a transposing method using laser light in a similar manner to the semiconductor layers having one conductivity type. In this manner, by transposing a light-absorbing film selectively without using a photolithography process, the semiconductor layers 108 and 109 and the semiconductor layers having one conductivity type 110a, 110b, 111a, and 111b are selectively formed to have a desired shape (see FIGS. 10A to 10C).

After being transposed by the laser light, the light-absorbing layer may be subjected to heat treatment or may be irradiated with laser light.

A material which absorbs irradiated light is used for the light-absorbing film which is an object to be transposed, and a light transmitting substrate which transmits irradiated light is used for the substrate 114. By the present invention, transposition can be freely performed to various substrates; therefore, the range of selectable materials of the transposed substrate is increased. Further, an inexpensive material can be selected for the transposed substrate, so that a display device can be manufactured at low cost as well as the display device can have various functions in accordance with use application.

In this embodiment mode, amorphous semiconductor layers are formed as the semiconductor layers 108 and 109 and the semiconductor layers having one conductivity type 110a, 110b, 111a, and 111b. In this embodiment mode, a semiconductor film having n-type conductivity containing phosphorus (P) that is an impurity element imparting n-type conductivity is formed as each semiconductor film having one conductivity type. Each semiconductor film having one conductivity type functions as a source or drain region. Each semiconductor film having one conductivity type may be formed as needed, and a semiconductor film having n-type conductivity containing an impurity element imparting n-type conductivity (P or As) or a semiconductor film having p-type conductivity containing an impurity element imparting p-type conductivity (B) can be formed.

Over the substrate 100, source or drain electrode layers 116, 117, 118, and 119 are formed. For the source or drain electrode layers 116, 117, 118, and 119, an element selected from Ag (silver), Au (gold), Cu (copper), W (tungsten), Al (aluminum), Mo (molybdenum), Ta (tantalum), and Ti (titanium), an alloy material or a compound material containing the above element as its main component, or the like can be used. Further, indium tin oxide (ITO), indium tin oxide containing silicon oxide (ITSO), organic indium, organic tin, zinc oxide, titanium nitride, or the like, having a light-transmitting property may be combined.

The source or drain electrode layers 116, 117, 118, and 119 can be formed by a sputtering method, a PVD (Physical Vapor Deposition) method, a CVD (Chemical Vapor Deposition) method such as a low-pressure CVD (LPCVD) method or a plasma CVD method, or the like and processing using a mask layer. Further, a method by which a component can be transferred or drawn to be a desired pattern, such as various printing methods (a method for forming a component to be a desired pattern, e.g., screen (mimeograph) printing, offset (planograph) printing, relief printing, or gravure (intaglio) printing), a droplet discharging method, a dispenser method, a selective-coating method, or the like can also be used.

A conductive film may be processed by dry etching or wet etching. By using an ICP (Inductively Coupled Plasma) etching method and adjusting etching conditions (e.g., the amount of power applied to a coiled electrode, the amount of power applied to an electrode on a substrate side, the electrode temperature on the substrate side, or the like) as appropriate, each electrode layer can be etched into a tapered shape. Note that as an etching gas, a chlorine-based gas such as $Cl_2$, $BCl_3$, $SiCl_4$, or $CCl_4$, a fluorine-based gas such as $CF_4$, $SF_6$, or $NF_3$, or $O_2$ can be used as appropriate.

In this embodiment mode, the source or drain electrode layers are formed as follows: a conductive film which is a light-absorbing film is formed over a transposing substrate, and transposed to a transposed substrate selectively while being processed into a desired shape by laser light. The light-absorbing film is formed over a substrate 121 by a sputtering method, a PVD (Physical Vapor Deposition) method, a CVD method such as a low-pressure CVD (LPCVD) method or a plasma CVD method, or the like.

The light-absorbing film is formed over the substrate 121 which is a transposing substrate, and the substrate 121 and the substrate 100 which is a transposed substrate are disposed to interpose the light-absorbing film therebetween.

The light-absorbing film is selectively irradiated with laser light 122a, 122b, 122c, and 122d through the substrate 121 from the substrate 121 side. The light-absorbing film in regions irradiated with the laser light 122a, 122b, 122c, and 122d absorbs the laser light 122a, 122b, 122c, and 122d and is transposed to a substrate 100 side as the source or drain electrode layers 116, 117, 118, and 119 by energy of the heat or the like. On the other hand, the other region which is not irradiated with the laser light 122a, 122b, 122c, and 122d is left on the substrate 121 side as light-absorbing films 120a to 120f. In this manner, by transposing a light-absorbing film selectively without using a photolithography process, the source or drain electrode layers 116, 117, 118, and 119 are selectively formed to have a desired shape (see FIGS. 11A to 11C).

After being transposed by the laser light, the light-absorbing layer may be subjected to heat treatment or may be irradiated with laser light.

A material which absorbs irradiated light is used for the light-absorbing film which is an object to be transposed, and a light transmitting substrate which transmits irradiated light is used for the substrate 121. By the present invention, transposition can be freely performed to various substrates; therefore, the range of selectable materials of the transposed substrate is increased. Further, an inexpensive material can be selected for the transposed substrate, so that a display device can be manufactured at low cost as well as the display device can have various functions in accordance with use application.

The source or drain electrode layer 116 also functions as a source wiring layer, and the source or drain electrode layer 118 also functions as a power source line.

In the second opening 137 formed in the gate insulating layer 105, the source or drain electrode layer 117 and the gate electrode layer 140 are electrically connected to each other. Part of the source or drain electrode layer 118 forms a capacitor.

Figure 11A:
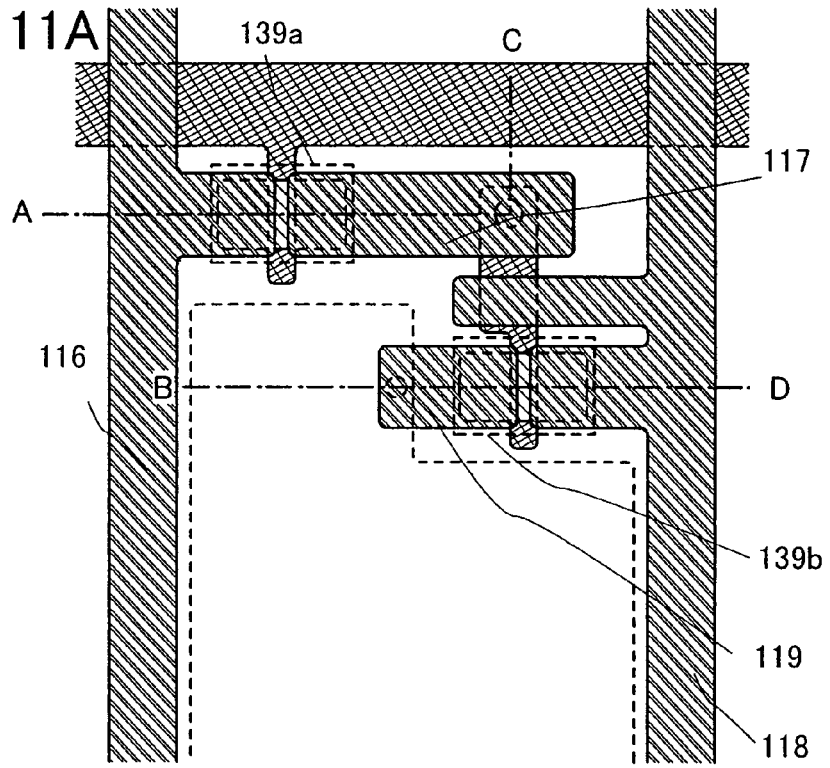
FIGS. 11A to 11C are diagrams showing a method for manufacturing a display device of the present invention.
Figure 11B:
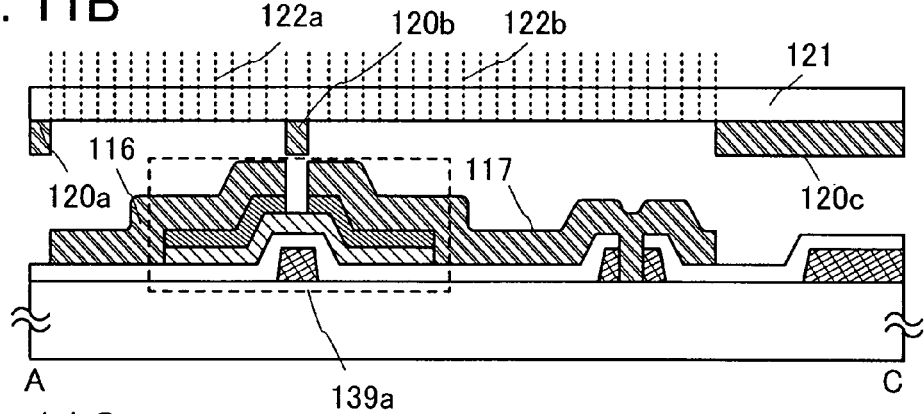
Figure 11C:
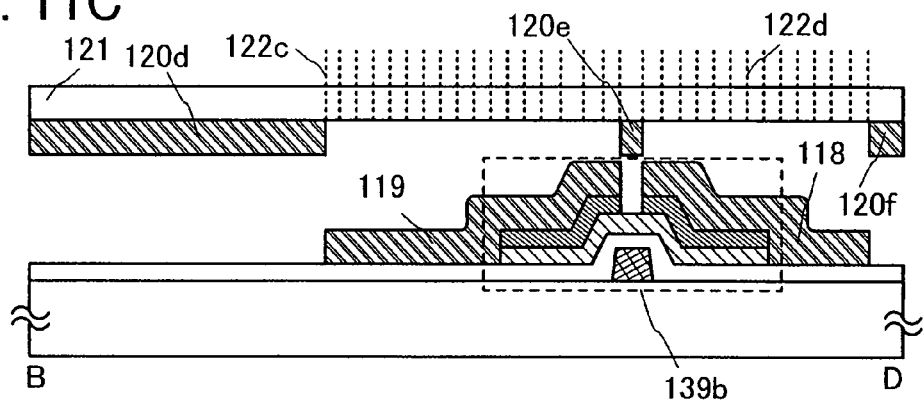
Figure 13A:
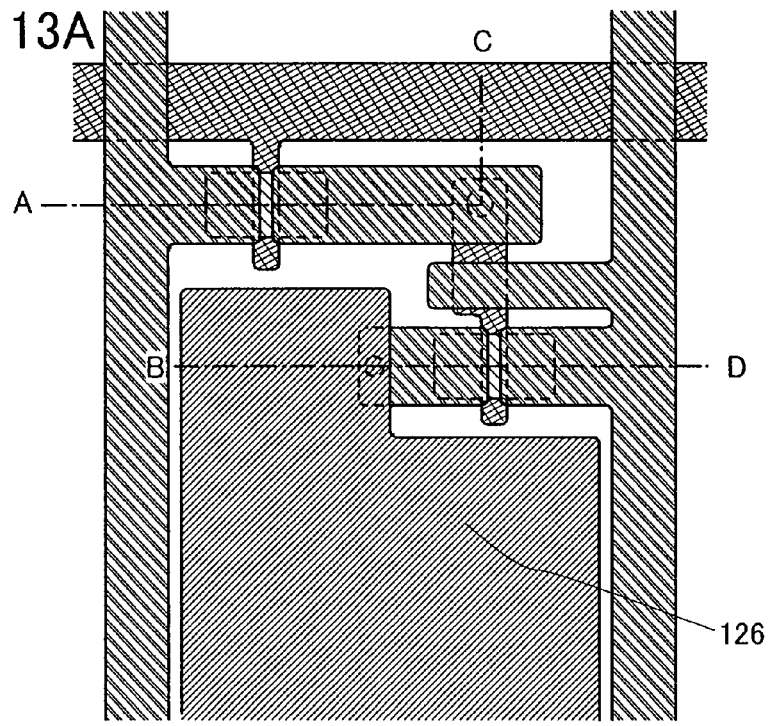
FIGS. 13A to 13C are diagrams showing a method for manufacturing a display device of the present invention.
Figure 13B:
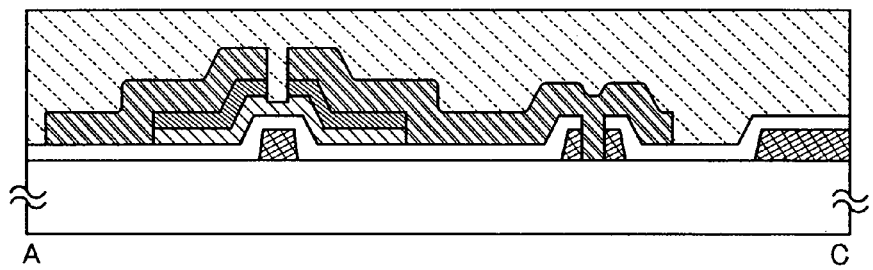
Figure 13C:
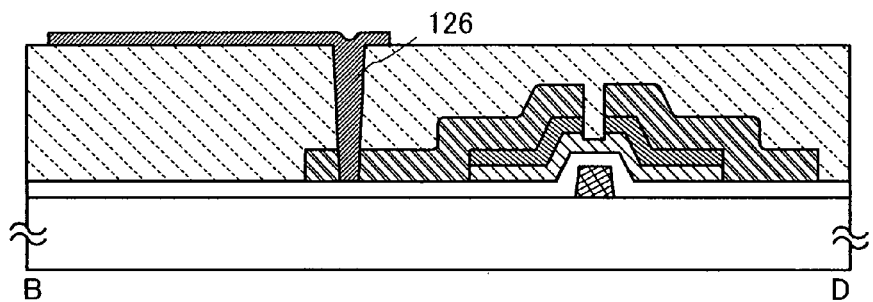

Through the above-described process, transistors 139a and 139b which are inversely staggered thin film transistors are manufactured (see FIGS. 11A to 11C).

An insulating layer 123 is formed over the gate insulating layer 105 and the transistors 139a and 139b.

The insulating layer 123 can be formed by a sputtering method, a PVD (Physical Vapor Deposition) method, a CVD (Chemical Vapor Deposition) method such as a low-pressure CVD (LPCVD) method or a plasma CVD method, or the like. Further, a droplet discharging method, various printing methods (a method for forming a pattern, such as screen printing or offset printing), a coating method such as a spin-coating method, a dipping method, a dispenser method, or the like may also be used.

The insulating layer 123 can be formed of a material selected from silicon oxide, silicon nitride, silicon oxinitride, aluminum oxide, aluminum nitride, aluminum oxynitride, diamond-like carbon (DLC), nitrogen-containing carbon (CN), polysilazane, and other substances containing an inorganic insulating material. Further, a material containing siloxane may be used. Further alternatively, an organic insulating material such as polyimide, acrylic, polyamide, polyimide amide, resist, or benzocyclobutene can be used. Further alternatively, an oxazole resin can be used, and for example, photo-curable polybenzoxazole or the like can be used.

Next, an opening 125 is formed in the insulating layer 123. In this embodiment mode, as described in Embodiment Mode. 1, the first opening 125 is formed by laser light and a second opening 136 is formed by etching (see FIGS. 12A to 12D). Note that FIGS. 12C and 12D correspond to each other, and a subsequent step of FIG. 12C is FIG. 12D. FIG. 12A which is the top diagram corresponds to FIG. 12D. In this embodiment mode, the source or drain electrode layer 119 functions as a light-absorbing layer.

The source or drain electrode layer 119 is selectively irradiated with laser light 124 from an insulating layer 123 side. Part of an irradiated region of the source or drain electrode layer 119 is evaporated by the irradiated energy, so that a source or drain electrode layer 142 is formed. The insulating layer 123 above the source or drain electrode layer 142 is removed, so that the first opening 125 can be formed.

Next, the source or drain electrode layer 142 is removed by etching using the insulating layer 123 having the first opening 125 as a mask, so that the second opening 136 is formed. Accordingly, the source or drain electrode layer 142 is processed into a source or drain electrode layer 141 (see FIG. 12D).

The etching for forming the second opening 136 may be performed by both of or either one of wet etching and dry etching, and may be performed plural times.

Since the opening can be selectively formed by laser light, it is not necessary to form a mask layer, so that the number of steps and materials can be reduced. Further, there are advantages in that the conductive layer and the insulating layer can be processed into a predetermined shape with high precision since laser light can be condensed into an extremely small spot, and the region other than the processing region is not heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the first opening which is formed by the laser light irradiation, as a mask, the conductive light-absorbing layer (or the conductive layer below the light-absorbing layer) can be exposed in the second opening.

As described above, an opening (a contact hole) which electrically connects conductive layers can be formed in an insulating layer by laser light irradiation without forming a mask layer using a complicated photolithography process.

A first electrode layer 126 of a light-emitting element, which functions as a pixel electrode, is formed in the opening 136 where the source or drain electrode layer 141 is exposed, thereby electrically connecting to the source or drain electrode layer 141.

The first electrode layer 126 may also be formed as follows, as described in Embodiment Mode 3: a conductive light-absorbing film is formed over a transposing substrate and irradiated with laser light, to be formed selectively over a transposed substrate while being processed into a desired shape.

In this embodiment mode, the first electrode layer is formed by forming a conductive film and processing into a desired shape using a mask layer.

The first electrode layer 126 can be formed by a sputtering method, a PVD (Physical Vapor Deposition) method, a CVD method such as a low-pressure CVD (LPCVD) method or a plasma CVD method, or the like. As a conductive material to form the first electrode layer 126, indium tin oxide (ITO), indium tin oxide containing silicon oxide (ITSO), zinc oxide (ZnO), or the like can be used. Preferably, indium tin oxide containing silicon oxide is used by a sputtering method using a target in which silicon oxide is contained at 2 to 10 wt % in ITO. Instead, a conductive material in which ZnO is doped with gallium (Ga) or indium zinc oxide (IZO) which is an oxide conductive material containing silicon oxide, formed using a target in which indium oxide is doped with zinc oxide (ZnO) at 2 to 20 wt % may be used.

As a mask layer, a resin material such as an epoxy resin, a phenol resin, a novolac resin, an acrylic resin, a melamine resin, a urethane resin, or the like is used. Further, the mask layer may be formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing photosensitizer may be used. For example, a positive type resist or a negative type resist may be used. In using any material, the surface tension and the viscosity are appropriately controlled by, for example, controlling the concentration of a solvent or by adding a surfactant or the like.

The first electrode layer 126 may be processed by dry etching or wet etching. By using an ICP (Inductively Coupled Plasma) etching method and controlling as appropriate etching conditions (e.g., the amount of power applied to a coiled electrode, the amount of power applied to an electrode on a substrate side, or the electrode temperature on the substrate side), the electrode layer can be etched into a tapered shape. Note that as an etching gas, a chlorine-based gas such as $Cl_2$, $BCl_3$, $SiCl_4$, or $CCl_4$, a fluorine-based gas such as $CF_4$, $SF_6$, or $NF_3$, or $O_2$ can be used as appropriate.

The first electrode layer 126 may be cleaned and polished by a CMP method or using a polyvinyl-alcohol-based porous body to planarize the surface thereof. Further, after being polished using a CMP method, the surface of the first electrode layer 126 may be subjected to ultraviolet light irradiation, oxygen plasma treatment, or the like.

Through the above-described process, a TFT substrate for a display panel in which a bottom-gate TFT and the first electrode layer 126 are connected over the substrate 100 is completed. The TFT in this embodiment mode is inversely staggered type.

Next, an insulating layer 131 (also called a partition wall) is selectively formed. The insulating layer 131 is formed to have an opening over the first electrode layer 126. In this embodiment mode, the insulating layer 131 is formed over the entire surface and patterned by etching using a mask of a resist or the like. When the insulating layer 131 is formed by a droplet discharging method, a printing method, a dispenser method, or the like by which the pattern can be formed directly and selectively, patterning by etching is not necessarily carried out.

The insulating layer 131 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular material such as polyimide, aromatic polyamide, or polybenzimidazole; an insulating material of inorganic siloxane which includes a Si—O—Si bond among compounds formed using a siloxane-based material as a starting material and which include silicon, oxygen, and hydrogen; or an insulating material of organic siloxane of which hydrogen bonded to silicon is substituted by an organic group such as methyl or phenyl. A photosensitive or nonphotosensitive material such as acrylic or polyimide may also be used. The insulating layer 131 is preferably formed to have a continuously-changing radius of curvature, so that the coverage with an electroluminescent layer 132 and a second electrode layer 133 which are formed over the insulating layer 131 improves.

Further, after the insulating layer 131 is formed by discharging a composition by a droplet discharging method, a surface thereof may be planarized by pressing with pressure to enhance the planarity. As a pressing method, concavity and convexity of the surface may be reduced by scanning the surface with a roller or the like, or the surface may be pressed perpendicularly with a flat plate-shaped object. Alternatively, concavity and convexity of the surface may be removed with an air knife after the surface is softened or melted with a solvent or the like. Further, a CMP method may also be used for polishing the surface. This step can be employed in planarizing the surface when the surface becomes uneven by a droplet discharging method. When the planarity is enhanced by this step, display irregularity of the display panel or the like can be prevented, and thus, a high precision image can be displayed.

A light-emitting element is formed over the substrate 100 which is the TFT substrate for the display panel (see FIGS. 14A and 14B).

Before the electroluminescent layer 132 is formed, heat treatment is performed at 200° C. in the atmospheric pressure to remove moisture in the first electrode layer 126 and the insulating layer 131 and moisture adsorbed on their surfaces. Further, it is preferable to perform the heat treatment at 200 to 400° C., more preferably 250 to 350° C., under low pressure and to form the electroluminescent layer 132 successively without exposing the substrate to the air by a vacuum evaporation method or a droplet discharging method under low pressure.

As the electroluminescent layer 132, materials exhibiting light of red (R), green (G), and blue (B) are selectively formed by an evaporation method using an evaporation mask, or the like. The materials exhibiting light of red (R), green (G), and blue (B) can also be formed by a droplet discharging method (by using a low-molecular material, a high-molecular material, or the like) similarly to a color filter, and in this case, materials for R, Q and B can be selectively deposited without using a mask, which is preferable. The second electrode layer 133 is stacked over the electroluminescent layer 132, so that a display device having a display function using a light-emitting element is completed.

Although not shown in the drawing, it is effective to provide a passivation film to cover the second electrode layer 133. The passivation (protection) film provided in manufacturing a display device may employ a single-layer structure or a multilayer structure. The passivation film can be formed of a single layer or a stacked layer of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide containing more nitrogen than oxygen (AlNO), aluminum oxide, diamond-like carbon (DLC), or carbon-containing nitrogen ($CN_x$). For example, a stacked layer of a carbon-containing nitrogen ($CN_x$) or silicon nitride (SiN), or an organic material can also be used, and a stacked layer of a high-molecular material such as styrene polymer may also be used. Alternatively, a siloxane material may be used.

At this time, it is preferable to use a film with which favorable coverage is provided as the passivation film, and it is effective to use a carbon film, particularly a DLC film as the passivation film. A DLC film, which can be formed in the temperature range from room temperature to less than or equal to 100° C., can be formed easily even over an electroluminescent layer having a low heat resistance. A DLC film can be formed by a plasma CVD method (typically, an RF plasma CVD method, a microwave CVD method, an electron cyclotron resonance (ECR) CVD method, a heat filament CVD method, or the like), a combustion method, a sputtering method, an ion beam evaporation method, a laser evaporation method, or the like. As a reaction gas for deposition, a hydrogen gas and a hydrocarbon-based gas (e.g., $CH_4$, $C_2H_2$, or $C_6H_6$) are used to be ionized by glow discharge, and the ions are accelerated to impact against a cathode to which negative self-bias voltage is applied. Further, a CN film may be formed using a $C_2H_4$ gas and a $N_2$ gas as reaction gases. A DLC film, which has high blocking effect against oxygen, can suppress oxidization of the electroluminescent layer. Accordingly, a problem such as oxidation of the electroluminescent layer during a subsequent sealing step can be prevented.

A sealing member is formed, and sealing with a sealing substrate is performed. Thereafter, a flexible wiring board may be connected to a gate wiring layer which is formed to be electrically connected to each gate electrode layer 103, so that electrical connection to an external portion may be obtained. This is also applied to a source wiring layer which is formed to be electrically connected to the source or drain electrode layer 116 which is also a source wiring layer.

A space between the substrate 100 provided with the element and the sealing substrate is filled with a filler and sealing therebetween is performed. A dripping method can also be used for disposing the filler. Instead of the filler, an inert gas such as nitrogen may be used for filling the space. Further, by providing a drying agent in the display device, deterioration due to moisture in the light-emitting element can be prevented. The drying agent may be provided either on the sealing substrate side or the substrate 100 side provided with the element, and may be provided by forming a concave portion in a region where the sealing member is formed in the substrate. Further, by providing the drying agent in a portion corresponding to a region which does not contribute to display, such as a driver circuit region or a wiring region of the sealing substrate, an aperture ratio is not decreased even if the drying agent is an opaque substance. The filler may contain a hygroscopic material to have a function as a drying agent. Through the above-described process, a display device having a display function using a light-emitting element is completed.

Although in this embodiment mode, the case where a switching TFT has a single gate structure is described, the switching TFT may employ a multi-gate structure such as a double-gate structure. Further, when the semiconductor layer is formed of an SAS or a crystalline semiconductor, an impurity region can be formed by adding an impurity imparting one conductivity type. In this case, the semiconductor layer may have impurity regions with different concentrations. For example, a low-concentration impurity region may be formed around a channel region and in a region overlapping with the gate electrode layer, and a high-concentration impurity region may be formed in a region outside the low-concentration region.

This embodiment mode can be combined with any of Embodiment Modes 1 to 3 as appropriate.

By the present invention, components such as a wiring included in a display device can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 5

In this embodiment mode, an example of a display device in order to manufacture a display device at low cost through a highly reliable, more simplified process is described. Specifically, a light-emitting display device using a light-emitting element as a display element is described. A method for manufacturing a display device in this embodiment mode is described with reference to FIGS. 15A and 15B.

As a base film over a substrate 150 having an insulating surface, a base film 151*a* is formed using a silicon nitride oxide film to a thickness of 10 to 200 nm (preferably, 50 to 150 nm), and a base film 151*b* is formed using a silicon oxynitride film to a thickness of 50 to 200 nm (preferably, 100 to 150 nm) by a sputtering method, a PVD (Physical Vapor Deposition) method, a CVD (Chemical Vapor Deposition) method such as a low-pressure CVD (LPCVD) method or a plasma CVD method, or the like. Alternatively, an acrylic acid, a methacrylic acid, or a derivative thereof; a heat-resistant high molecule such as polyimide, aromatic polyamide, or polybenzimidazole; or a siloxane resin may be used. Further alternatively, a resin material such as a vinyl resin, e.g., polyvinyl alcohol or polyvinyl butyral, an epoxy rein, a phenol resin, a novolac resin, an acrylic rein, a melamine resin, or a urethane resin may be used. Further alternatively, an organic material such as benzocyclobutene, parylene, fluorinated arylene ether, or polyimide, a composition material containing water-soluble homopolymers and water-soluble copolymers, or the like may be used. Further alternatively, an oxazole resin such as photo-curable polybenzoxazole may be used.

Further, a droplet discharging method, a printing method (a method by which a pattern can be formed, such as screen printing or offset printing), a coating method such as a spin coating method, a dipping method, a dispenser method, or the like can also be used. In this embodiment mode, the base films 151*a* and 151*b* are formed by a plasma CVD method. As the substrate 150, a glass substrate, a quartz substrate, a silicon substrate, a metal substrate, or a stainless steel substrate having an insulating film formed on its surface may be used. Further, a plastic substrate having heat resistance enough to withstand the processing temperature in this embodiment mode, or a flexible substrate such as a film may also be used. As a plastic substrate, a substrate made of PET (polyethylene terephthalate), PEN (polyethylene naphthalate), or PES (polyethersulfone) can be used. As a flexible substrate, a synthetic resin such as acrylic can be used. Since a display device manufactured in this embodiment mode has a structure in which light is extracted from a light-emitting element through the substrate 150, it is necessary that the substrate 150 has a light-transmitting property.

As the base film, silicon oxide, silicon nitride, silicon oxynitride, silicon nitride oxide, or the like can be used, and either a single-layer structure or a stacked-layer structure such as a structure including two or three layers may be employed.

Next, a semiconductor film is formed over the base films. The semiconductor film may be formed to a thickness of 25 to 200 nm (preferably, 30 to 150 nm) by various methods (e.g., a sputtering method, an LPCVD method, or a plasma CVD method). In this embodiment mode, it is preferable to use a crystalline semiconductor film which is obtained by crystallizing an amorphous semiconductor film by laser.

The semiconductor film thus obtained may be doped with a slight amount of an impurity element (boron or phosphorus) in order to control a threshold voltage of a thin film transistor. Such doping with the impurity element may be performed on the amorphous semiconductor film prior to the crystallization step. If the amorphous semiconductor film is doped with the impurity element, activation of the impurities can also be performed by subsequent heat treatment for crystallization. Furthermore, a defect or the like caused in doping can be recovered.

Then, the crystalline semiconductor film is processed into a desired shape by etching, thereby forming a semiconductor layer.

Although either plasma etching (dry etching) or wet etching may be employed for the etching, plasma etching is suitable to process a large substrate. As an etching gas, a fluorine-based gas such as $CF_4$ or $NF_3$ or a chlorine-based gas such as $Cl_2$ or $BCl_3$ is used. An inert gas such as He or Ar may be added as needed. Further, by employing an etching process using atmospheric discharge plasma, a local discharging process can also be performed, and the mask layer does not need to be formed over the entire surface of the substrate.

In the present invention, a conductive layer forming a wiring layer or an electrode layer, a mask layer for forming a predetermined pattern, or the like may be formed by a method by which a pattern can be selectively formed, such as a droplet discharging method. By a droplet discharging getting) method (also called an ink-jet method depending on its system), droplets of a composition which is mixed for a particular purpose are selectively discharged betted) to form a predetermined pattern (e.g., a conductive layer or an insulating layer). At this time, treatment to control wettability or adhesion may be performed on a formation region. Further, a method by which a pattern can be transferred (transposed) or drawn, such as a printing method (a method for forming a pattern, such as screen printing or offset printing), or a dispenser method may also be used.

A gate insulating layer covering the semiconductor layer is formed. The gate insulating layer is formed of an insulating film containing silicon to a thickness of 10 to 150 nm by a plasma CVD method, a sputtering method, or the like. The gate insulating layer may be formed of a material such as an oxide material or a nitride material of silicon, typified by silicon nitride, silicon oxide, silicon oxynitride, or silicon nitride oxide, and may be a stacked layer or a single layer. For example, the insulating layer may have a stacked-layer structure of three layers including a silicon nitride film, a silicon oxide film, and a silicon nitride film, or a single-layer structure of a silicon oxynitride film or a stacked-layer structure of two layers thereof.

Next, a gate electrode layer is formed over the gate insulating layer. The gate electrode layer can be formed by a sputtering method, an evaporation method, a CVD method, or the like. The gate electrode layer may be formed of an element selected from tantalum (Ta), tungsten (W), titanium (Ti), molybdenum (Mo), aluminum (Al), copper (Cu), chromium (Cr), and neodymium (Nd), or an alloy material or a compound material containing the above element as its main component. Further, as the gate electrode layer, a semiconductor film typified by a polycrystalline silicon film doped with an impurity element such as phosphorus, or an AgPdCu alloy may also be used. The gate electrode layer may be either a single layer or a stacked layer.

Although in this embodiment mode, the gate electrode layer is formed into a tapered shape, the present invention is not limited thereto. The gate electrode layer may employ a stacked layer structure, where only one layer has a tapered shape while the other has a perpendicular side surface by anisotropic etching. The taper angles may be different between the stacked gate electrode layers as in this embodiment mode or may be the same. With the tapered shape, coverage with a film stacked thereover is improved and a defect is reduced, so that reliability is improved.

The gate insulating layer may be thinned to some extent by the etching step for forming the gate electrode layer.

An impurity element is added to the semiconductor layer to form an impurity region. The impurity region can be formed as a high-concentration impurity region or a low-concentration impurity region by controlling the concentration of the impurity element. A thin film transistor having a low-concentration impurity region is referred to as a thin film transistor having an LDD (Lightly Doped Drain) structure. Further, the low-concentration impurity region can be formed to overlap with a gate electrode; such a thin film transistor is referred to as a thin film transistor having a GOLD (Gate Overlapped LDD) structure. The conductivity type of the thin film transistor is set to n type by adding phosphorus (P) or the like to the impurity region thereof. In the case where a p-channel thin film transistor is formed, boron (B) or the like may be added.

In this embodiment mode, a region of the impurity region, which overlaps with the gate electrode layer with the gate insulating layer interposed therebetween, is referred to as an Lov region. Further, the other region of the impurity region, which does not overlap with the gate electrode layer with the gate insulating layer interposed therebetween, is referred to as an Loff region.

In order to activate the impurity element, heat treatment, intense light irradiation, or laser beam irradiation may be performed. At the same time as the activation, plasma damage to the gate insulating layer and plasma damage to the interface between the gate insulating layer and the semiconductor layer can be recovered.

Next, a first interlayer insulating layer covering the gate electrode layer and the gate insulating layer is formed. In this embodiment mode, a stacked-layer structure of insulating films 167 and 168 is used. As each of the insulating films 167 and 168, a silicon nitride film, a silicon nitride oxide film, a silicon oxynitride film, a silicon oxide film, or the like can be formed by a sputtering method or a plasma CVD method.

Further, a single layer of another insulating film containing silicon or a stacked-layer structure including three or more layers thereof may also be used.

Further, heat treatment is performed at 300 to 550° C. for 1 to 12 hours in a nitrogen atmosphere, thereby hydrogenating the semiconductor layer. Preferably, the heat treatment is performed at 400 to 500° C. In this step, dangling bonds in the semiconductor layer are terminated by hydrogen contained in the insulating film 167 which is an interlayer insulating layer. In this embodiment mode, the heat treatment is performed at 410° C.

The insulating films 167 and 168 may also be formed using a material selected from aluminum nitride (AlN), aluminum oxynitride (AlON), aluminum nitride oxide containing more nitrogen than oxygen (AlNO), aluminum oxide, diamond-like carbon (DLC), nitrogen-containing carbon (CN), polysilazane, and other substances containing an inorganic insulating material. A material containing siloxane may also be used. Alternatively, an organic insulating material such as polyimide, acrylic, polyamide, polyimide amide, resist, or benzocyclobutene may be used. Further alternatively, an oxazole resin can be used, and for example, photo-curable polybenzoxazole or the like can be used.

Next, a contact hole (an opening) which reaches the semiconductor layer is formed in the insulating films 167 and 168, and the gate insulating layer.

In this embodiment mode, an opening is formed by laser light as described in Embodiment Mode 1. A source region and a drain region of the semiconductor layer are selectively irradiated with laser light from an insulating films 167 and 168 side, and the insulating films 167 and 168 and the gate insulating layer over irradiated regions of the source region and the drain region of the semiconductor layer are removed by the irradiated energy, so that first openings can be formed.

Next, parts of the source region and the drain region of the semiconductor layer are etched using the gate insulating layer and the insulating films 167 and 168 having the first openings as masks, so that second openings in which the source region and the drain region of the semiconductor layer are exposed are formed.

The etching for forming the second openings may be performed by both of or either one of wet etching and dry etching, and may be performed plural times.

A source electrode layer and a drain electrode layer are formed in the openings where the source region and the drain region of the semiconductor layer are exposed, thereby the source region and the drain region of the semiconductor layer can be electrically connected to the source electrode layer and the drain electrode layer.

Each of the source electrode layer and the drain electrode layer can be formed as follows; a conductive film is formed by a PVD method, a CVD method, an evaporation method, or the like, and is processed into a desired shape. Alternatively, a conductive film can be selectively formed in a predetermined portion by a droplet discharging method, a printing method, a dispenser method, an electrolytic plating method, or the like. Further alternatively, a reflow method or a damascene method may be used. As a material of each of the source electrode layer and the drain electrode layer, a metal such as Ag, Au, Cu, Ni, Pt, Pd, Ir, Rh, W, Al, Ta, Mo, Cd, Zn, Fe, Ti, Si, Ge, Zr, or Ba, or an alloy or metal nitride thereof is used. Further, a stacked-layer structure thereof may also be employed.

Each of the gate electrode layer, the semiconductor layer, the source electrode layer, and the drain electrode layer included in the display device of this embodiment mode can also be formed as follows, as described in Embodiment Mode 3: a light-absorbing film using a conductive material or a semiconductor material is formed over a transposing substrate, and irradiated with laser light, to be formed selectively over a transposed substrate while being processed into a desired shape. Accordingly, the manufacturing process is simplified because a photolithography process is not used, so that loss of materials and the cost can be reduced.

Through the above-described steps, an active matrix substrate can be manufactured, in which a p-channel thin film transistor 285 having a p-type impurity region in an Lov region and an n-channel thin film transistor 275 having an n-type impurity region in an Lov region are provided in a peripheral driver circuit region 204; and a multi-channel type n-channel thin film transistor 265 having an n-type impurity region in an Loff region and a p-channel thin film transistor 255 having a p-type impurity region in an Lov region are provided in a pixel region 206.

The present invention is not limited to this embodiment mode, and the structure of each thin film transistor may be a single gate structure in which one channel formation region is formed, a double-gate structure in which two channel formation regions are formed, or a triple-gate structure in which three channel formation regions are formed.

Figure 15A:
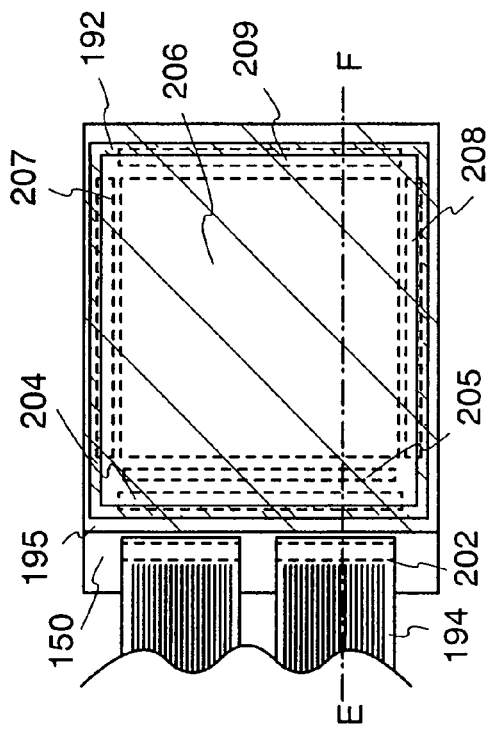
FIGS. 15A and 15B are diagrams showing a display device of the present invention.
Figure 15B:
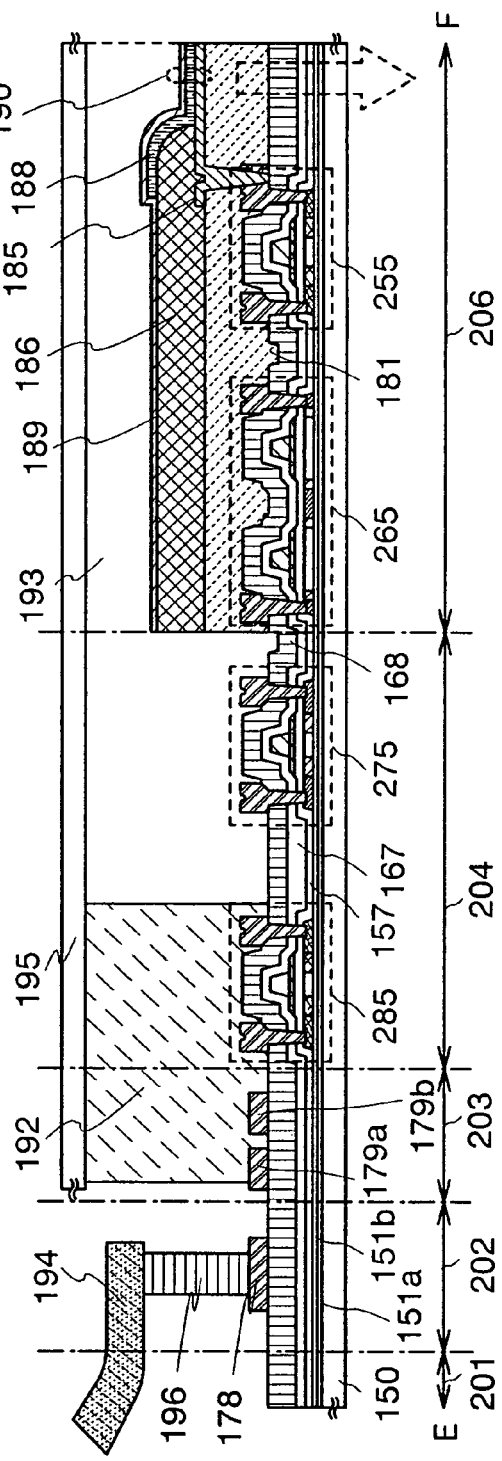

Next, an insulating film 181 is formed as a second interlayer insulating layer. In FIGS. 15A and 15B, a separation region 201 for separation by scribing, an external terminal connection region 202 to which an FPC is attached, a wiring region 203 which is a lead wiring region for the peripheral portion, the peripheral driver circuit region 204, and the pixel region 206 are provided. Wirings 179a and 179b are provided in the wiring region 203, and a terminal electrode layer 178 connected to an external terminal is provided in the external terminal connection region 202.

The insulating film 181 can be formed of a material selected from silicon oxide, silicone nitride, silicon oxynitride, silicon nitride oxide, aluminum nitride (AlN), aluminum oxide containing nitrogen (also called aluminum oxynitride) (AlON), aluminum nitride oxide containing oxygen (also called aluminum nitride oxide) (AlNO), aluminium oxide, diamond-like carbon (DLC), nitrogen-containing carbon (CN), PSG (phosphosilicate glass), BPSG (borophosphosilicate glass), alumina, and other substances containing an inorganic insulating material. Further, a siloxane resin may also be used. Further alternatively, an organic insulating material which is either photosensitive or non-photosensitive, such as polyimide, acrylic, polyamide, polyimide amide, resist, benzocyclobutene, or a low-dielectric constant material (Low-k material) may be used. Further alternatively, an oxazole resin can be used, and for example, photo-curable polybenzoxazole or the like may be used. It is necessary that an interlayer insulating layer provided for planarization has high heat resistance, a high insulating property, and high planarity; therefore, a coating method typified by a spin coating method is preferably employed for forming the insulating film 181.

The insulating film 181 can be formed by a dipping method, spray coating, a doctor knife, a roll coater, a curtain coater, a knife coater, a CVD method, an evaporation method, or the like. Further, the insulating film 181 may also be formed by a droplet discharging method. In the case of employing a droplet discharging method, a material solution can be saved. Alternatively, a method by which a pattern can be transferred or drawn, like a droplet discharging method, such as a printing method (a method for forming a pattern, such as screen printing or offset printing), a dispenser method, or the like may be employed.

A minute opening, that is, a contact hole is formed in the insulating film 181 in the pixel region 206. The source or drain electrode layer is electrically connected to a first electrode layer 185 in the opening formed in the insulating film 181. The opening formed in the insulating film 181 can be formed as follows, as described in Embodiment Mode 1: a first opening as a mask is formed by laser light irradiation and etching using the thin film having the first opening as a mask is performed to form a second opening. In this embodiment mode, a low-melting point metal that is relatively easily evaporated (chromium in this embodiment mode) is used as the source and drain electrode layers. The source and drain electrode layers are selectively irradiated with laser light from an insulating film 181 side, to remove the insulating film 181 over irradiated regions of the source and drain electrode layers by the irradiation energy, so that the first openings can be formed.

Next, the source and drain electrode layers are removed by etching using the insulating film 181 having the first openings as a mask, so that the second openings are formed. The first electrode layer 185 is formed in the second opening where the source or drain electrode layer is exposed, thereby the source or drain electrode layer and the first electrode layer 185 can be electrically connected to each other. The etching for forming the second openings may be performed by both of or either one of wet etching and dry etching, and may be performed plural times.

Since the opening can be selectively formed by laser light, it is not necessary to form a mask layer, so that the number of steps and materials can be reduced. Further, there are advantages in that the conductive layer and the insulating layer can be processed into a predetermined shape with high precision since laser light can be condensed into an extremely small spot, and the region other than the processing region is not heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the insulating film having the first opening as a mask, the conductive light-absorbing layer (or the conductive layer below the light-absorbing layer) can be exposed in the second opening.

As described above, an opening (a contact hole) which electrically connects conductive layers can be formed in an insulating layer by laser light irradiation without forming a mask layer using a complicated photolithography process.

The first electrode layer 185 functions as either an anode or a cathode, as which a film containing an element selected from Ti, Ni, W, Cr, Pt, Zn, Sn, In, and Mo, or an alloy material or a compound material containing the above element as its main component, such as titanium nitride, $TiSi_xN_y$, $WSi_x$, tungsten nitride, $WSi_xN_y$, or NbN, or a stacked-layer film thereof with a total thickness of 100 to 800 nm may be used.

In this embodiment mode, since a light-emitting element is used as a display element, and light from the light-emitting element is extracted from a first electrode layer 185 side, the first electrode layer 185 has a light-transmitting property. The first electrode layer 185 is formed by forming a transparent conductive film and etching into a desired shape.

In the present invention, as the first electrode layer 185 which is a light-transmitting electrode layer, a transparent conductive film formed of a light-transmitting conductive material may be specifically used, and for example, indium oxide containing tungsten oxide, indium zinc oxide containing tungsten oxide, indium oxide containing titanium oxide, indium tin oxide containing titanium oxide, or the like can be used. It is needless to say that indium tin oxide (ITO), indium zinc oxide (IZO), indium tin oxide added with silicon oxide (ITSO), or the like can also be used.

Further, even in the case of a material which does not have a light-transmitting property, such as a metal film, when the thickness is small (preferably, about 5 to 30 nm) so that light can be transmitted, light can be emitted through the first electrode layer 185. As the metal thin film which can be used as the first electrode layer 185, a conductive film formed of titanium, tungsten, nickel, gold, platinum, silver, aluminum, magnesium, calcium, lithium, or an alloy thereof, or the like can be used.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. The first electrode layer 185 is preferably formed to a total thickness of 100 to 800 nm. The first electrode layer 185 may also be formed as follows, as described in Embodiment Mode 3: a conductive light-absorbing film is formed over a transposing substrate, and irradiated with laser light to be selectively formed over a transposed substrate while being processed into a desired shape.

The first electrode layer 185 may be cleaned and polished by a CMP method or using a polyvinyl-alcohol-based porous body to planarize the surface thereof. Further, after being polished using a CMP method, the surface of the first electrode layer 185 may be subjected to ultraviolet light irradiation, oxygen plasma treatment, or the like.

Heat treatment may also be performed after the first electrode layer 185 is formed. By this heat treatment, moisture contained in the first electrode layer 185 is discharged. Accordingly, degasification or the like is not caused in the first electrode layer 185; thus, even when a light-emitting material that is easily deteriorated by moisture is formed over the first electrode layer, the light-emitting material is not deteriorated, and a highly reliable display device can be manufactured.

Next, an insulating layer 186 (also called a partition wall, a barrier, or the like) covering the end portion of the first electrode layer 185 and the source or drain electrode layer is formed.

The insulating layer 186 may be formed of silicon oxide, silicon nitride, silicon oxynitride, silicon nitride oxide, or the like and employ a single-layer structure or a stacked-layer structure such as a structure including two or three layers. Further, the insulating layer 186 may also be formed of a material selected from aluminum nitride, aluminum oxynitride containing more oxygen than nitrogen, aluminum nitride oxide containing more nitrogen than oxygen, diamond-like carbon (DLC), nitrogen-containing carbon, polysilazane, and other substances containing an inorganic insulating material. A material containing siloxane may also be used. Alternatively, an organic insulating material which is either photosensitive or non-photosensitive, such as polyimide, acrylic, polyamide, polyimide amide, resist, benzocyclobutene, or polysilazane may be used. Further alternatively, an oxazole resin can be used, and for example, photo-curable polybenzoxazole or the like can be used.

The insulating layer 186 can be formed by a sputtering method, a PVD (Physical Vapor Deposition) method, a CVD (Chemical Vapor Deposition) method such as a low-pressure CVD (LPCVD) method or a plasma CVD method, or the like. Further, a droplet discharging method, various printing methods (a method for forming a pattern, such as screen printing or offset printing), a coating method such as a spin-coating method, a dipping method, a dispenser method, or the like may also be used.

Although either plasma etching (dry etching) or wet etching may be employed for the etching to process into the desired shape, plasma etching is suitable to process a large substrate. As an etching gas, a fluorine-based gas such as $CF_4$ or $NF_3$ or a chlorine-based gas such as $Cl_2$ or $BCl_3$ is used. An inert gas such as He or Ar may be added as needed. Further, by employing an etching process using atmospheric discharge plasma, a local discharging process can also be performed, and the mask layer does not need to be formed over the entire surface of the substrate.

In a connection region 205 shown in FIG. 15A, a wiring layer formed of the same material and by the same step as a second electrode layer is electrically connected to a wiring layer formed of the same material and by the same step as the gate electrode layer.

A light-emitting layer 188 is formed over the first electrode layer 185. Although only one pixel is shown in FIGS. 15A and 15B, electric field electrode layers corresponding to R (red), G (green), and B (blue) are formed separately in this embodiment mode.

Then, a second electrode layer 189 formed of a conductive film is provided over the light-emitting layer 188. As the second electrode layer 189, Al, Ag, Li, Ca, or an alloy or a compound thereof such as MgAg, MgIn, AlLi, or $CaF_2$, or calcium nitride may be used. In this manner, a light-emitting element 190 including the first electrode layer 185, the light-emitting layer 188, and the second electrode layer 189 is formed (see FIG. 15B).

In the display device of this embodiment mode shown in FIGS. 15A and 15B, light from the light-emitting element 190 is transmitted through the first electrode layer 185 in a direction denoted by an arrow in FIG. 15B.

In this embodiment mode, an insulating layer may be provided as a passivation film (a protective film) over the second electrode layer 189. It is effective to thus provide a passivation film to cover the second electrode layer 189. The passivation film may be formed of an insulating film containing silicon nitride, silicon oxide, silicon oxynitride, silicon nitride oxide, aluminum nitride, aluminum oxynitride, aluminum nitride oxide containing more nitrogen than oxygen, aluminum oxide, diamond-like carbon (DLC), or nitrogen-containing carbon, and employ a single-layer structure of the insulating film or a stacked-layer structure thereof. Alternatively, a siloxane resin may be used.

In this case, it is preferable to use, as the passivation film, a film with which favorable coverage is provided, and it is effective to use a carbon film, particularly a DLC film. A DLC film, which can be formed in the range from room temperature to equal to or less than 100° C., can also be formed easily over the light-emitting layer 188 with low heat resistance. A DLC film can be formed by a plasma CVD method (typically, an RF plasma CVD method, a microwave CVD method, an electron cyclotron resonance (ECR) CVD method, a thermal-filament CVD method, or the like), a combustion flame method, a sputtering method, an ion beam evaporation method, a laser evaporation method, or the like. As a reaction gas for deposition, a hydrogen gas and a hydrocarbon-based gas (e.g., $CH_4$, $C_2H_2$, $C_6H_6$, or the like) are used to be ionized by glow discharge, and the ions are accelerated to impact against a cathode to which negative self bias is applied. Further, a CN film may be formed using a $C_2H_4$ gas and a $N_2$ gas as reaction gases. A DLC film has a high blocking effect against oxygen; therefore, oxidization of the light-emitting layer 188 can be suppressed. Accordingly, a problem such as oxidation of the light-emitting layer 188 during a subsequent sealing step can be prevented.

The substrate 150 over which the light-emitting element 190 is thus formed and a sealing substrate 195 are firmly attached to each other by using a sealing member 192, so that the light-emitting element is sealed (see FIGS. 15A and 15B). As the sealing member 192, typically, a visible light curable resin, an ultraviolet curable resin, or a thermosetting resin is preferably used. For example, the following epoxy resin can be used: a bisphenol-A liquid resin, a bisphenol-A solid resin, a bromine-containing epoxy resin, a bisphenol-F resin, a bisphenol-AD resin, a phenol resin, a cresol resin, a novolac resin, a cycloaliphatic epoxy resin, an Epi-Bis epoxy resin, a glycidyl ester resin, a glycidyl amine-based resin, a heterocyclic epoxy resin, a modified epoxy resin, or the like. Note that a region surrounded by the sealing member may be filled with a filler 193, and may be filled with nitrogen or the like by performing sealing in a nitrogen atmosphere. Although the filler 193 does not necessarily have a light-transmitting property in this embodiment mode because of a bottom emission type, it is necessary that the filler has a light-transmitting property in the case where light is extracted through the filler 193. Typically, a visible light curable epoxy resin, an ultraviolet curable epoxy resin, or a thermosetting epoxy resin may be used. Through the above-described steps, a display device having a display function using a light-emitting element of this embodiment mode is completed. Further, the filler may be dropped in a liquid state to fill the display device. In the case of using a hygroscopic substance such as a drying agent as the filler, a further moisture absorption effect can be obtained, thereby preventing deterioration of the element.

A drying agent is provided in an EL display panel in order to prevent deterioration due to moisture in the element. In this embodiment mode, the drying agent is provided in a concave portion which is formed in the sealing substrate to surround the pixel region, thereby the thin design is not hindered. Further, when the drying agent is also provided in a region corresponding to a gate wiring layer so that a moisture absorbing area is increased, the moisture absorption effect becomes high. Further, when the drying agent is provided over the gate wiring layer which does not emit light itself, the light extraction efficiency is not decreased.

The light-emitting element is sealed by a glass substrate in this embodiment mode. Note that sealing treatment is a treatment for protecting a light-emitting element from moisture, and any of the following methods is used: a method for mechanically sealing by a cover member, a method for sealing with a thermosetting resin or an ultraviolet light curable resin, and a method for sealing by a thin film having a high barrier property such as a metal oxide film or a metal nitride film. As the cover member, glass, ceramics, plastics, or metal can be used, and it is necessary that the cover member has a light-transmitting property in the case where light is emitted to a cover member side. Further, the cover member and the substrate over which the light-emitting element is formed are attached to each other with a sealing member such as a thermosetting resin or an ultraviolet curable resin, and the resin is cured by heat treatment or ultraviolet light irradiation treatment to form a sealed space. It is also effective to provide a moisture absorbent typified by barium oxide in this sealed space. This moisture absorbent may be provided on and in contact with the sealing member, or over or in the periphery of the partition wall so as not to shield light from the light-emitting element. Further, the space between the cover member and the substrate over which the light-emitting element is formed can be filled with a thermosetting resin or an ultraviolet light curable resin. In this case, it is effective to add a moisture absorbent typified by barium oxide in the thermosetting resin or the ultraviolet light curable resin.

Further, the source or drain electrode layer and the first electrode layer are not necessary to be in direct contact with each other to be electrically connected, but may be connected to each other through a wiring layer.

In this embodiment mode, the terminal electrode layer 178 is connected to an FPC 194 through an anisotropic conductive layer 196 in the external terminal connection region 202, thereby electrically connecting to outside. Further, as shown in FIG. 15A which is a top diagram of the display device, the display device manufactured in this embodiment mode includes peripheral driver circuit regions 207 and 208 each including a scan line driver circuit in addition to the peripheral driver circuit region 204 and a peripheral driver circuit region 209 each including a signal line driver circuit.

Although the above-described circuits are included in this embodiment mode, the present invention is not limited thereto. An IC chip may be mounted by the aforementioned COG method or TAB method as a peripheral driver circuit. Further, the number of each of gate line driver circuits and source line driver circuits is not particularly limited.

Further, in the display device of the present invention, a driving method for image display is not particularly limited; for example, a dot sequential driving method, a line sequential driving method, a frame sequential driving method, or the like may be used. Typically, a line sequential driving method may be used, and a time division gray scale driving method or an area gray scale driving method may be used as appropriate. Further, a video signal to be inputted to a source line of the display device may be either an analog signal or a digital signal; and in accordance with the video signal, the driver circuit and the like may be appropriately designed.

This embodiment mode can be combined with any of Embodiment Modes 1 to 3 as appropriate.

By the present invention, components such as a wiring included in a display device can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 6

A thin film transistor can be formed by the present invention, and a display device can be formed using the thin film transistor. In the case where a light-emitting element is used and an n-channel transistor is used as a transistor for driving the light-emitting element, light emission from the light-emitting element is any of bottom emission, top emission, and dual emission. Here, a stacked-layer structure of the light-emitting element in each case is described with reference to FIGS. 17A to 17C.

In this embodiment mode, channel protective thin film transistors 461, 471, and 481 to which the present invention is applied are used. The thin film transistor 481 is provided over a light-transmitting substrate 480 and includes a gate electrode layer 493, a gate insulating layer 497, a semiconductor layer 494, an n-type semiconductor layer 495a, an n-type semiconductor layer 495b, a source or drain electrode layer 487a, a source or drain electrode layer 487b, a channel protective layer 496, an insulating layer 499, and a wiring layer 498. Any of the gate electrode layer, the semiconductor layer, the source electrode layer, the drain electrode layer, and the like may also be formed as follows, as described in Embodiment Mode 3: a conductive light-absorbing film is formed over a transposing substrate, and irradiated with laser light, to be formed selectively over a transposed substrate while being processed into a desired shape. Accordingly, the manufacturing process is simplified, so that loss of materials and the cost can be reduced.

Figure 17A:
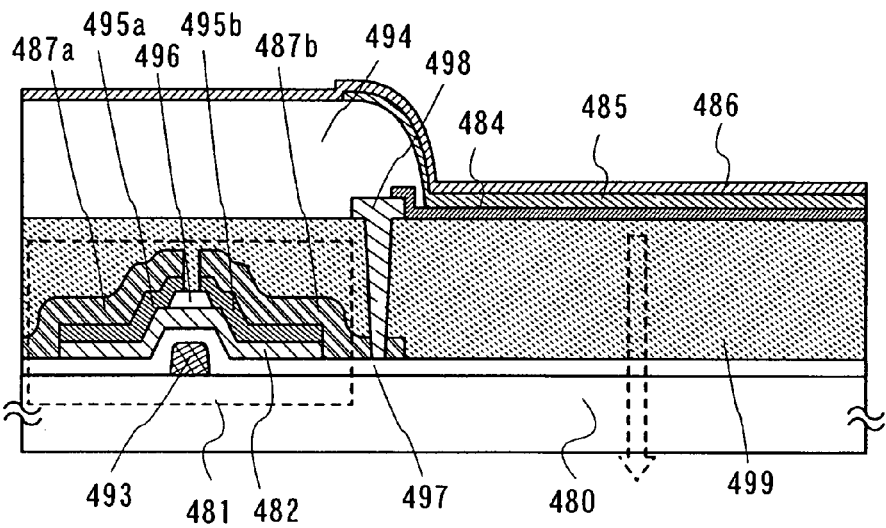
FIGS. 17A to 17C are diagrams each showing a display device of the present invention.
Figure 17B:
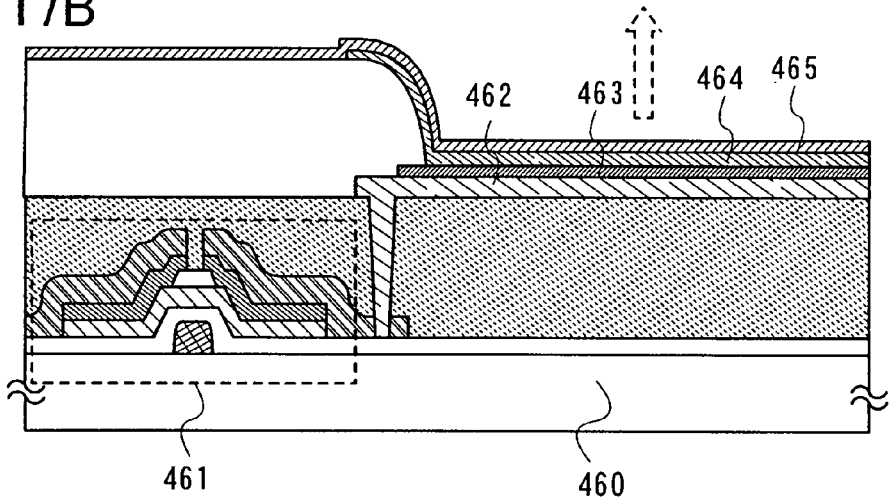
Figure 17C:
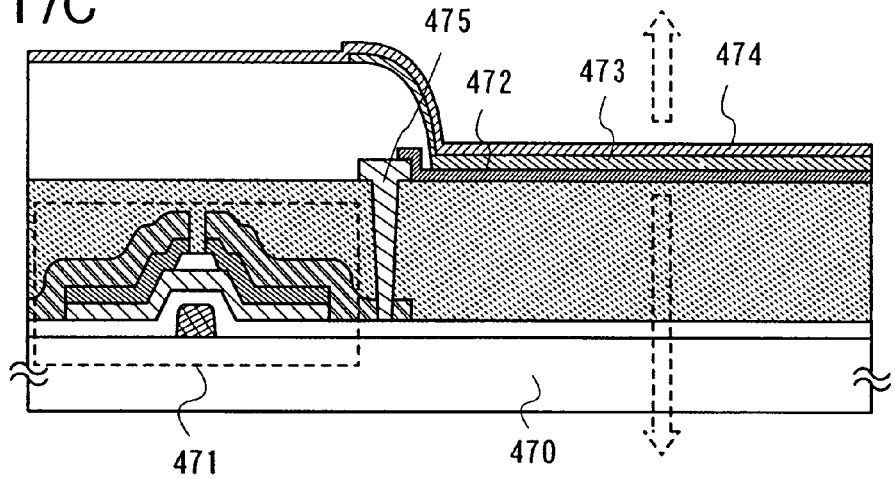

In FIGS. 17A to 17C described in this embodiment mode, a contact hole (an opening), which reaches the source or drain electrode layer 487b, is formed in the insulating layer 499.

In this embodiment mode, a first opening is formed by laser light, and a second opening is formed using a thin film having the first opening, as described in Embodiment Mode 1. The source or drain electrode layer 487b is selectively irradiated with laser light from an insulating layer 499 side, and the insulating layer 499 over an irradiated region of the source or drain electrode layer 487b can be removed by the irradiation energy, so that the first opening can be formed.

Next, the source or drain electrode layer 487b is removed by etching using the insulating layer 499 having the first opening as a mask, so that the second opening which reaches the gate insulating layer 497 can be formed. The etching for forming the second opening may be performed by both of or either one of wet etching and dry etching, and may be performed plural times.

The wiring layer 498 is formed in the opening where the source or drain electrode layer 487b and the gate insulating layer 497 are exposed, thereby the source or drain electrode layer 487b can be electrically connected to the wiring layer 498. Since the wiring layer 498 is connected to a first electrode layer 484 of a light-emitting element, the thin film transistor 481 and the light-emitting element are electrically connected to each other through the wiring layer 498.

Since the opening can be selectively formed by laser light, it is necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the insulating film having the first opening as a mask, the conductive light-absorbing layer (or the conductive layer below the light-absorbing layer) can be exposed in the second opening.

As described above, an opening (a contact hole) which electrically connects conductive layers can be formed in an insulating layer by laser light irradiation without forming a mask layer using a complicated photolithography process.

A wiring layer 475 is formed in the opening where the source or drain electrode layer 487b and the gate insulating layer 497 are exposed, thereby the source or drain electrode layer 487b can be electrically connected to the wiring layer 475. Since the wiring layer 475 is connected to a first electrode layer 472 of a light-emitting element, the thin film transistor 471 and the light-emitting element are electrically connected to each other through the wiring layer 475.

In this embodiment mode, an amorphous semiconductor layer is used as the semiconductor layer. However, the present invention is not limited to this embodiment mode; a crystalline semiconductor layer can be used as the semiconductor layer, and an n-type semiconductor layer can be used as the semiconductor layer having one conductivity type. Instead of forming the n-type semiconductor layer, conductivity type may be provided for a semiconductor layer by plasma treatment using a $PH_3$ gas. In the case where a crystalline semiconductor layer of polysilicon or the like is used, an impurity region having one conductivity type may be formed by introducing (adding) an impurity into the crystalline semiconductor layer without forming a semiconductor layer having one conductivity type. Further, an organic semiconductor such as pentacene may also be used. By selectively depositing the organic semiconductor with a droplet discharging method or the like, the processing process can be simplified.

The case where a crystalline semiconductor layer is used as the semiconductor layer is described. First, an amorphous semiconductor layer is crystallized to form a crystalline semiconductor layer. In a crystallization step, an element which promotes crystallization (also referred to as a catalytic element or a metal element) is added into the amorphous semiconductor layer, and crystallization is performed by heat treatment (at 550 to 750° C. for 3 minutes to 24 hours). As the metal element which promotes crystallization of silicon, one or a plurality of kinds of elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from the crystalline semiconductor layer, a semiconductor layer containing an impurity element is formed to be in contact with the crystalline semiconductor layer and is made to function as a gettering sink. As the impurity element, an impurity element imparting n-type conductivity, an impurity element imparting p-type conductivity, a rare gas element, or the like can be used. For example, one or a plurality of kinds of elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. An n-type semiconductor layer is formed to be in contact with the crystalline semiconductor layer containing the element which promotes crystallization, and heat treatment (at 550 to 750° C. for 3 minutes to 24 hours) is performed. The element which promotes crystallization contained in the crystalline semiconductor layer moves into the n-type semiconductor layer, and the element which promotes crystallization contained in the crystalline semiconductor layer is removed or reduced, so that the semiconductor layer is formed. On the other hand, the n-type semiconductor layer becomes an n-type semiconductor layer containing the metal element which promotes crystallization, and then processed into a desired shape to be an n-type semiconductor layer. In this manner, the n-type semiconductor layer functions as a gettering sink of the semiconductor layer, and also as a source region or a drain region as it is.

The crystallization step and the gettering step of the semiconductor layer may also be performed by either a plurality of heat treatment or one heat treatment. In the latter case, heat treatment may be performed after the following: an amorphous semiconductor layer is formed, an element which promotes crystallization is added, and a semiconductor layer which functions as a gettering sink is formed.

In this embodiment mode, the gate insulating layer is formed by stacking a plurality of layers, and a silicon nitride oxide film and a silicon oxynitride film are stacked on a gate electrode layer 493 side, as the gate insulating film 497 employing a two-layer structure. The stacked insulating layers are preferably formed successively at the same temperature in the same chamber while changing a reaction gas without breaking a vacuum. By forming the layers successively without breaking a vacuum, an interface between the stacked layers can be prevented from being contaminated.

The channel protective layer 496 may be formed by a droplet discharging method using polyimide, polyvinyl alcohol, or the like. As a result, a light exposure step can be omitted. The channel protective layer can be formed using one or a plurality of kinds of the following or a stacked layer thereof: an inorganic material (e.g., silicon oxide, silicon nitride, silicon oxynitride, or silicon nitride oxide), a photosensitive or non-photosensitive organic materials (organic resin materials) (e.g., polyimide, acrylic, polyamide, polyimide amide, resist, or benzocyclobutene), a low-dielectric constant material, and the like. Further, a siloxane material may also be used. As a manufacturing method, a vapor deposition method such as a plasma CVD method or a thermal CVD method, or a sputtering method can be used. Alternatively, a droplet discharging method, a dispenser method, or a printing method (a method for forming a pattern, such as screen printing or offset printing) may be used. An SOG film obtained by a coating method, or the like may be used.

First, the case where light is emitted to a substrate 480 side, that is, the case of bottom emission is described with reference to FIG. 17A. In this case, a wiring layer 498, the first electrode layer 484, an electroluminescent layer 485, and a second electrode layer 486 are stacked sequentially to be in contact with the source or drain electrode layer 487b, thereby electrically connecting to the thin film transistor 481. It is necessary that the substrate 480 through which light is transmitted has a light-transmitting property against at least visible light.

Next, the case where light is emitted to the side opposite to a substrate 460, that is, the case of top emission is described with reference to FIG. 17B. The thin film transistor 461 can be formed similarly to the thin film transistor 481 described above. A source or drain electrode layer 462 electrically connected to the thin film transistor 461 is in contact with a first electrode layer 463 so that they are electrically connected to each other. The first electrode layer 463, an electroluminescent layer 464, and a second electrode layer 465 are sequentially stacked. The source or drain electrode layer 462 is a metal layer having light reflectivity and reflects light which is emitted from the light-emitting element, upward as shown by an arrow. Since the source or drain electrode layer 462 is stacked over the first electrode layer 463, even when the first electrode layer 463 is formed of a light-transmitting material and transmits light, the light is reflected on the source or drain electrode layer 462 and then is emitted to the direction opposite to the substrate 460. It is needless to say that the first electrode layer 463 may also be formed of a metal film having light reflectivity. Light from the light-emitting element is transmitted through the second electrode layer 465; therefore, the second electrode layer 465 is formed of a material having a light-transmitting property against at least visible light.

Finally, the case where light is emitted to a substrate 470 side and to a side opposite to the substrate 470 side, that is, the case of dual emission is described with reference to FIG. 17C. The thin film transistor 471 is also a channel protective thin film transistor. A source or drain electrode layer electrically connected to a semiconductor layer of the thin film transistor 471 is electrically connected to a wiring layer 475 and a first electrode layer 472. The first electrode layer 472, an electroluminescent layer 473, and a second electrode layer 474 are sequentially stacked. At this time, by using materials having a light-transmitting property against at least visible light as both of the first electrode layer 472 and the second electrode layer 474 or forming both of them to have thicknesses enough to transmit light, dual emission is realized. In this case, the insulating layer and the substrate 470 through which light is transmitted are also necessary to have a light-transmitting property against at least visible light.

This embodiment mode can be combined with any of Embodiment Modes 1 to 5 as appropriate.

By the present invention, components such as a wiring included in a display device can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 7

In this embodiment mode, an example of a display device in order to manufacture a display device at low cost through a highly reliable, more simplified process is described. Specifically, a light-emitting display device using a light-emitting element as a display element is described.

In this embodiment mode, structures of the light-emitting element which can be used as the display element of the display device of the present invention are described with reference to FIGS. 22A to 22D.

FIGS. 22A to 22D each show an element structure of a light-emitting element where an electroluminescent layer 860 formed of a mixture of an organic compound and an inorganic compound is interposed between a first electrode layer 870 and a second electrode layer 850. As shown in the drawings, the electroluminescent layer 860 includes a first layer 804, a second layer 803, and a third layer 802.

First, the first layer 804 is a layer which has a function of transporting holes to the second layer 803, and includes at least a first organic compound and a first inorganic compound having an electron-accepting property with respect to the first organic compound. It is important that the first organic compound and the first inorganic compound are not simply mixed but the first inorganic compound has an electron-accepting property with respect to the first organic compound. With this structure, many hole-carriers are generated in the first organic compound originally having almost no inherent carriers, and a hole-injecting property and hole-transporting property which are extremely excellent can be obtained.

Accordingly, the first layer 804 can be provided with not only an advantageous effect that is considered to be obtained by mixing an inorganic compound (e.g., improvement in heat resistance) but also with excellent conductivity (in particular, a hole-injecting property and a hole-transporting property in the first layer 804). This is an advantageous effect, which cannot be obtained in a conventional hole-transporting layer in which an organic compound and an inorganic compound that do not electronically interact with each other are simply mixed. This advantageous effect can make a driving voltage lower than the conventional one. Further, since the first layer 804 can be made thick without causing a rise in driving voltage, a short circuit of the element due to dust or the like can be suppressed.

As described above, hole carriers are generated in the first organic compound; therefore, a hole-transporting organic compound is preferably used as the first organic compound. As examples of the hole-transporting organic compound, the following can be given: phthalocyanine (abbreviation: H$_2$Pc), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), 4,4',4"-tris(N-carbazolyl)triphenylamine (abbreviation: TCTA), and the like. The present invention is not limited thereto. In addition, among the compounds described above, an aromatic amine compound such as TDATA, MTDATA, m-MTDAB, TPD, NPB, DNTPD, TCTA, or the like can easily generate hole carriers and is a suitable compound group for the first organic compound.

On the other hand, the first inorganic compound may be any material as long as electrons can be easily accepted from the first organic compound, and various metal oxides and metal nitrides can be used. Any of transition metal oxides that belong to Groups 4 to 12 of the periodic table is preferable because an electron-accepting property is easily exhibited. Specifically, titanium oxide, zirconium oxide, vanadium oxide, molybdenum oxide, tungsten oxide, rhenium oxide, ruthenium oxide, zinc oxide, and the like can be given as examples thereof. Among the metal oxides described above, transition metal oxides that belong to Groups 4 to 8 of the periodic table mostly have a high electron-accepting property, which is a preferable group. In particular, vanadium oxide, molybdenum oxide, tungsten oxide, and rhenium oxide are preferable because they can be deposited by vacuum evaporation and can be easily handled.

Note that the first layer 804 may also be formed by stacking a plurality of layers each containing the mixture of the organic compound and the inorganic compound described above, and may further contain another organic compound or inorganic compound.

Next, the third layer 802 is described. The third layer 802 is a layer having a function of transporting electrons to the second layer 803, and includes at least a third organic compound and a third inorganic compound having an electron-donating property with respect to the third organic compound. It is important that the third organic compound and the third inorganic compound are not simply mixed but the third inorganic compound has an electron-denoting property with respect to the third organic compound. With this structure, many electron carriers are generated in the third organic compound originally having almost no inherent carriers, and an electron-injecting property and an electron-transporting property which are highly excellent can be obtained.

Accordingly, the third layer 802 can be provided with not only an advantageous effect that is considered to be obtained by mixing an inorganic compound (e.g., improvement in heat resistance) but also with excellent conductivity (in particular, a hole-injecting property and a hole-transporting property in the third layer 802). This is an advantageous effect, which cannot be obtained in a conventional hole-transporting layer in which an organic compound and an inorganic compound that do not electronically interact with each other are simply mixed. This advantageous effect can make a driving voltage lower than the conventional one. Further, since the third layer 802 can be made thick without causing a rise in driving voltage, a short circuit of the element due to dust or the like can be suppressed.

As described above, electron carriers are generated in the third organic compound; therefore, an electron-transporting organic compound is preferably used as the third organic compound. As examples of the electron-transporting organic compound, the following can be given: tris(8-quinolinolato) aluminum (abbreviation: $Alq_3$), tris(4-methyl-8-quinolinolato)aluminum (abbreviation: $Almq_3$), bis(10-hydroxybenzo [h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis [2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), 3-(4-biphenylyl)-4-(4-ethylphenyl)-5-(4-tert-butylphenyl)-1,2,4-triazole (abbreviation: p-EtTAZ), and the like. The present invention is not limited thereto. Further, among the compounds mentioned above, chelate metal complexes each having a chelate ligand including an aromatic ring such as $Alq_3$, $Almq_3$, $BeBq_2$, BAlq, $Zn(BOX)_2$, and $Zn(BTZ)_2$, organic compounds having a phenanthroline skeleton such as BPhen and BCP, and organic compounds having an oxadiazole skeleton such as PBD and OXD-7 can easily generate electron carriers and is a suitable compound group for the third organic compound.

On the other hand, the third inorganic compound may be any material as long as electrons can be easily denoted to the third organic compound, and various metal oxides and metal nitrides can be used. Alkali metal oxide, alkaline-earth metal oxide, rare-earth metal oxide, alkali metal nitride, alkaline-earth metal nitride, or rare-earth metal nitride is preferable because an electron-donating property is easily exhibited. Specifically, lithium oxide, strontium oxide, barium oxide, erbium oxide, lithium nitride, magnesium nitride, calcium nitride, yttrium nitride, lanthanum nitride, and the like can be given as examples thereof. In particular, lithium oxide, barium oxide, lithium nitride, magnesium nitride, and calcium nitride are preferable because they can be deposited by vacuum evaporation and can be easily handled.

Note that the third layer 802 may also be formed by stacking a plurality of layers each containing the mixture of the organic compound and the inorganic compound described above, and may further contain another organic compound or inorganic compound.

Next, the second layer 803 is described. The second layer 803 is a layer having a function of emitting light and includes a second organic compound having a light-emitting property. Further, a second inorganic compound may also be included. The second layer 803 can be formed using various light-emitting organic and inorganic compounds. However, since it is considered that a current does not easily flow through the second layer 803 as compared to the first layer 804 or the third layer 802, the thickness of the second layer 803 is preferably approximately 10 to 100 nm.

Any light-emitting organic compound can be used as the second organic compound. The following can be given as examples thereof: 9,10-di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), coumarin 30, coumarin 6, coumarin 545, coumarin 545T, perylene, rubrene, periflanthene, 2,5,8,11-tetra(tert-butyl)perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), 4-(dicyanomethylene)-2,6-bis[p-(dimethylamino)styryl]-4H-pyran (abbreviation: BisDCM), and the like. Further, a compound capable of emitting phosphorescence can also be used, such as bis[2-(4',6'-difluorophenyl)pyridinato-$N,C^{2'}$]iridium(picolinate) (abbreviation: FIrpic), bis{2-[3',5'-bis(trifluoromethyl)phenyl] pyridinato-$N,C^{2'}$}iridium(picolinate) (abbreviation: Ir($CF_3$ ppy)$_2$(pic)), tris(2-phenylpyridinato-$N,C^{2'}$)iridium (abbreviation: Ir(ppy)$_3$), bis(2-phenylpyridinato-$N,C^{2'}$)iridium (acetylacetonate) (abbreviation: Ir(ppy)$_2$(acac)), bis[2-(2'-thienyl)pyridinato-$N,C^{3'}$]iridium(acetylacetonate) (abbreviation: Ir(thp)$_2$(acac)), bis(2-phenylquinolinato-$N,C^{2'}$)iridium(acetylacetonate) (abbreviation: Ir(pq)$_2$(acac)), bis[2-(2'-benzothienyl)pyridinato-$N,C^{3'}$]iridium(acetylacetonate) (abbreviation: Ir(btp)$_2$(acac)), or the like.

Further, a triplet excitation light-emitting material containing a metal complex or the like may be used for the second layer 803, as well as a singlet excitation light-emitting material. For example, among respective pixels emitting light of red, green, and blue, a pixel emitting light of red whose luminance is reduced by half in a relatively short time is formed using a triplet excitation light-emitting material and the other pixels are formed using a singlet excitation light-emitting material. A triplet excitation light-emitting material has a feature that light-emitting efficiency is favorable, so that less power is consumed to obtain the same luminance. In other words, when a triplet excitation light-emitting material is used for a red pixel, the amount of current needs to be applied to a light-emitting element is small; thus, reliability can be improved. Further, the pixel emitting light of red and the pixel emitting light of green may be formed using a triplet excitation light-emitting material and the pixel emitting light of blue may be formed using a singlet excitation light-emitting material in order to achieve low power consumption. Low power consumption can be further achieved by forming a light-emitting element which emits light of green that has high visibility for human eyes with a triplet excitation light-emitting material.

Further, the second layer 803 may be added with another organic compound in addition to the second organic compound which emits light, described above. The organic compound that can be added is the following: 4,4'-bis(N-carbazolyl)biphenyl (abbreviation: CBP), 1,3,5-tris[4-(N-carbazolyl)phenyl]benzene (abbreviation: TCPB), or the like as well as TDATA, MTDATA, m-MTDAB, TPD, NPB, DNTPD, TCTA, $Alq_3$, $Almq_3$, $BeBq_2$, BAlq, $Zn(BOX)_2$, $Zn(BTZ)_2$, BPhen, BCP, PBD, OXD-7, TPBI, TAZ, p-EtTAZ, DNA, t-BuDNA, and DPVBi which are mentioned above. The present invention is not limited thereto. Note that it is preferable that the organic compound, which is added in addition to the second organic compound, have larger excitation energy than the second organic compound and be added by the larger amount than the second organic compound in order to make the second organic compound emit light efficiently (which makes it possible to prevent concentration quenching of the second organic compound). Alternatively, as another function, the added organic compound may emit light along with the second organic compound (which makes it possible to emit white light or the like).

The second layer 803 may have a structure in which color display is performed by forming light-emitting layers having different emission wavelength bands for respective pixels. Typically, respective light-emitting layers corresponding to R (red), G (green), and B (blue) are formed. Also in this case, color purity can be improved and a pixel region can be prevented from having a mirror surface (reflecting) by providing a filter which transmits light of an emission wavelength range of the light on the light-emission side of the pixel. By providing a filter, a circularly polarizing plate or the like that has been considered to be necessary can be omitted, and the loss of light emitted from the light-emitting layer can be eliminated. Further, change in color tone, which occurs when the pixel region (a display screen) is obliquely seen, can be reduced.

Either a low-molecular organic light-emitting material or a high-molecular organic light-emitting material can be used as a material of the second layer 803. A high-molecular organic light-emitting material has higher physical strength and provides higher durability of an element than a low-molecular material. Further, since a high-molecular organic light-emitting material can be deposited by coating, an element can be relatively easily manufactured.

The emission color is determined depending on a material forming the light-emitting layer; therefore, a light-emitting element which emits desired light can be formed by selecting an appropriate material for the light-emitting layer. As examples of a high-molecular electroluminescent material which can be used for a light-emitting layer, a polyparaphenylene-vinylene-based material, a polyparaphenylene-based material, a polythiophene-based material, a polyfluorene-based material, and the like can be given.

As an example of the polyparaphenylene-vinylene-based material, a derivative of poly(paraphenylenevinylene) [PPV] such as poly(2,5-dialkoxy-1,4-phenylenevinylene) [RO—PPV], poly(2-(2'-ethyl-hexoxy)-5-methoxy-1,4-phenylenevinylene) [MEH-PPV], or poly(2-(dialkoxyphenyl)-1,4-phenylenevinylene) [ROPh-PPV] can be given. As an example of the polyparaphenylene-based material, a derivative of polyparaphenylene [PPP] such as poly(2,5-dialkoxy-1,4-phenylene) [RO—PPP] or poly(2,5-dihexoxy-1,4-phenylene) can be given. As an example of the polythiophene-based material, a derivative of polythiophene [PT] such as poly(3-alkylthiophene) [PAT], poly(3-hexylthiophen) [PHT], poly(3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], or poly[3-(4-octylphenyl)-2,2bithiophene] [PTOPT] can be given. As an example of the polyfluorene-based material, a derivative of polyfluorene [PF] such as poly(9,9-dialkylfluorene) [PDAF] or poly(9,9-dioctylfluorene) [PDOF] can be given.

The second inorganic compound may be any inorganic compound as long as light emission of the second organic compound is not easily quenched; various metal oxides and metal nitrides can be used. In particular, a metal oxide that belongs to Group 13 or 14 of the periodic table is preferable because light emission of the second organic compound is not easily quenched, and specifically, aluminum oxide, gallium oxide, silicon oxide, or germanium oxide is preferable. The present invention is not limited thereto.

Note that the second layer 803 may be formed by stacking a plurality of layers each containing the mixture of the organic compound and the inorganic compound, which are described above, and may further include another organic compound or inorganic compound. A layer structure of the light-emitting layer can be changed, and an electrode layer for injecting electrons may be provided or a light-emitting material may be dispersed unless that departs from the purpose of the present invention, instead of providing no specific electron-injecting region or light-emitting region.

A light-emitting element formed using the above-described materials emits light by being forwardly biased. Each pixel of a display device, which is formed using a light-emitting element, can be driven by a simple matrix mode or an active matrix mode. In either case, each pixel emits light by application of forward bias thereto at a specific timing, and the pixel is in a non-emitting state for a certain period. Reliability of the light-emitting element can be improved by applying reverse bias in the non-emitting time. In a light-emitting element, there are a deterioration mode in which emission intensity is decreased under a constant driving condition and a deterioration mode in which a non-light-emitting region is increased in the pixel and luminance is apparently decreased. However, progression of deterioration can be slowed down by performing alternating driving in which bias is applied forwardly and reversely; thus, reliability of a light-emitting display device can be improved. Further, either digital driving or analog driving can be applied.

Therefore, a color filter (a colored layer) may be provided for a sealing substrate. The color filter (colored layer) can be formed by an evaporation method or a droplet discharging method. High-definition display can be performed by using the color filter (colored layer). This is because a broad peak can be modified to be sharp in each emission spectrum of R, Q and B by the color filter (colored layer).

A material which emits mono-color light is deposited and is combined with a color filter or a color conversion layer, so that full color display can be performed. The color filter (colored layer) or the color conversion layer may be provided for, for example, a sealing substrate and attached to an element substrate.

It is needless to say that display of mono-color emission may be performed. For example, an area color type display device may be formed using mono-color emission. The area color type is suitable for a passive matrix display portion and can mainly display characters and symbols.

Figure 22A:
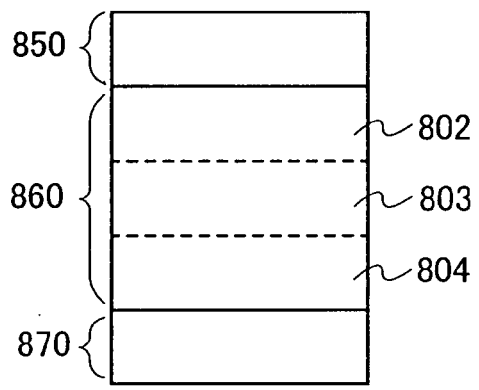
FIGS. 22A to 22D are diagrams each showing a structure of a light-emitting element applicable to the present invention.
Figure 22B:
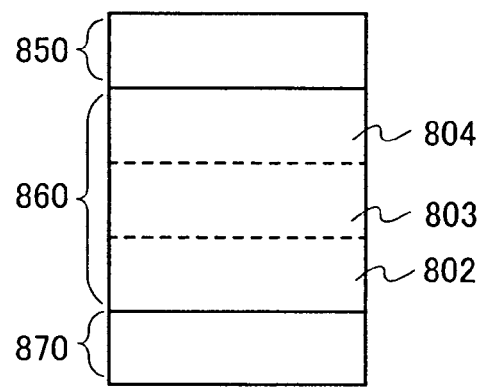

It is necessary that materials for the first electrode layer 870 and the second electrode layer 850 are selected in consideration of the work function. Each of the first electrode layer 870 and the second electrode layer 850 can be either an anode or a cathode depending on the pixel structure. In the case where the conductivity type of a driving thin film transistor is a p-channel type, the first electrode layer 870 is preferably an anode and the second electrode layer 850 is preferably a cathode as shown in FIG. 22A. In the case where the conductivity type of the driving thin film transistor is an n-channel type, the first electrode layer 870 is preferably a cathode and the second electrode layer 850 is preferably an anode as shown in FIG. 22B. Materials that can be used for the first electrode layer 870 and the second electrode layer 850 are described. It is preferable to use a material having a high work function (specifically, a material having a work function of 4.5 eV or more) for one of the first electrode layer 870 and the second electrode layer 850, which serves as an anode, and a material having a low work function (specifically, a material having a work function of 3.5 eV or less) for the other electrode layer which serves as a cathode. However, since the first layer 804 is superior in hole-injecting property and hole-transporting property and the third layer 802 is superior in electron-injecting property and electron transporting property, both the first electrode layer 870 and the second electrode layer 850 are scarcely restricted by a work function and various materials can be used.

The light-emitting elements shown in FIGS. 22A and 22B each have a structure where light is extracted from the first electrode layer 870 and thus, the second electrode layer 850 does not necessarily have a light-transmitting property. The second electrode layer 850 may be formed to a total thickness of 100 to 800 nm, of a film mainly containing an element selected from Ti, Ni, W, Cr, Pt, Zn, Sn, In, Ta, Al, Cu, Au, Ag, Mg, Ca, Li and Mo, or an alloy material or a compound material containing the above element as its main component, such as titanium nitride, $TiSi_xN_y$, $WSi_x$, tungsten nitride, $WSi_xN_y$, or NbN; or a stacked film thereof.

The second electrode layer 850 can be formed by an evaporation method, a sputtering method, a CVD method, a printing method, a dispenser method, a droplet discharging method, or the like.

Further, when the second electrode layer 850 is formed using a light-transmitting conductive material like the material used for the first electrode layer 870, light can be extracted from the second electrode layer 850 as well, so that a dual emission structure in which light emitted from the light-emitting element is extracted from both of the first electrode layer 870 and the second electrode layer 850 can be obtained.

It is to be noted that the light-emitting element of the present invention can have variations by changing the kinds of the first electrode layer 870 and the second electrode layer 850.

FIG. 22B shows the case where the electroluminescent layer 860 is formed by stacking the third layer 802, the second layer 803, and the first layer 804 sequentially from a first electrode layer 870 side.

As described above, in the light-emitting element of the present invention, the layer interposed between the first electrode layer 870 and the second electrode layer 850 is formed of the electroluminescent layer 860 including a layer in which an organic compound and an inorganic compound are combined. The light-emitting element is an organic-inorganic composite light-emitting element provided with layers (that is, the first layer 804 and the third layer 802) that provide functions of high carrier-injecting property and carrier-transporting property by mixing an organic compound and an inorganic compound. Further, it is particularly necessary that one of the first layer 804 and the third layer 802 which is provided on the first electrode layer 870 side is a layer in which an organic compound and an inorganic compound are combined, and the other which is provided on a second electrode layer 850 side may contain only one of an organic compound and an inorganic compound.

Note that various methods can be used as a method for forming the electroluminescent layer 860 which is the layer in which an organic compound and an inorganic compound are mixed. For example, there is a co-evaporation method in which both an organic compound and an inorganic compound are evaporated by resistance heating. Alternatively, an inorganic compound may be evaporated by an electron beam (EB) while an organic compound is evaporated by resistance heating, to co-evaporate them. Further, there is a method in which sputtering using an inorganic compound is performed while an organic compound is evaporated by resistance heating to deposit them at the same time. Further, the electroluminescent layer 860 may also be formed by a wet method.

Further, also for the first electrode layer 870 and the second electrode layer 850, an evaporation method by resistance heating, an EB evaporation method, a sputtering method, a wet method, or the like can be used. Further, each of the first electrode layer 870 and the second electrode layer 850 may also be formed as follows, as described in Embodiment Mode 3: a conductive light-absorbing film is formed over a transposing substrate and irradiated with laser light, to be formed selectively over a transposed substrate while being processed into a desired shape.

Figure 22C:
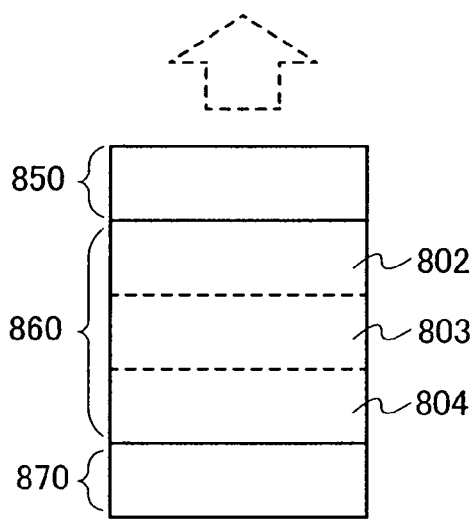
Figure 22D:
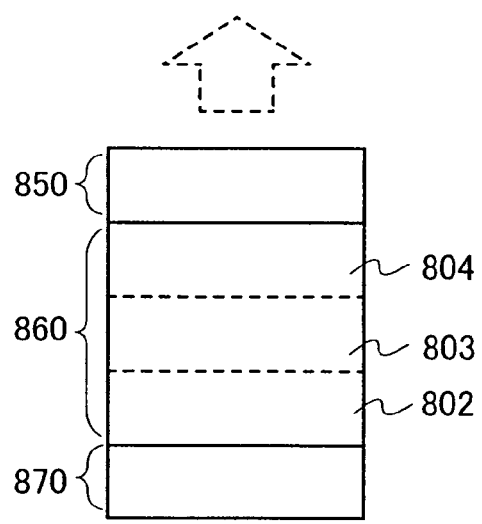

In FIG. 22C, an electrode layer having light reflectivity is used for the first electrode layer 870 and an electrode layer having a light-transmitting property is used for the second electrode layer 850 in the structure of FIG. 22A. Light emitted from the light-emitting element is reflected on the first electrode layer 870, and transmitted through the second electrode layer 850. Similarly, in FIG. 22D, an electrode layer having light reflectivity is used for the first electrode layer 870 and an electrode layer having a light-transmitting property is used for the second electrode layer 850 in the structure of FIG. 22B. Light emitted from the light-emitting element is reflected on the first electrode layer 870, and transmitted through the second electrode layer 850.

This embodiment mode can be freely combined with any of the above embodiment modes concerning the display device including the light-emitting element. This embodiment mode can be freely combined with any of Embodiment Modes 1 to 5 as appropriate.

By the present invention, components such as a wiring included in a display device or the like can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 8

In this embodiment mode, an example of a display device in order to manufacture a display device at low cost through a highly reliable, more simplified process is described. Specifically, a light-emitting display device using a light-emitting element as a display element is described. In this embodiment mode, structures of a light-emitting element applicable as a display element of the display device of the present invention are described with reference to FIGS. 23A to 23C, and 24A to 24C.

A light-emitting element utilizing electroluminescence is distinguished depending on whether a light-emitting material is an organic compound or an inorganic compound. In general, the former is called an organic EL element, and the latter is called an inorganic EL element.

The inorganic EL element is categorized into a dispersion inorganic EL element and a thin-film inorganic EL element depending on its element structure. The former and the latter are different in that the former has an electroluminescent layer where particles of a light-emitting material are dispersed in a binder whereas the latter has an electroluminescent layer formed of a thin film of a light-emitting material. However, the former and the latter are the same in that electrons accelerated by a high electric field are necessary. Note that, as a mechanism of light emission obtained, there are donor-acceptor recombination light emission that utilizes a donor level and an acceptor level, and localized light emission that utilizes inner-shell electron transition of a metal ion. In general, a dispersion inorganic EL element may have donor-acceptor recombination light emission and a thin-film inorganic EL element may have localized light emission.

The light-emitting material that can be used in the present invention includes a base material and an impurity element to be a light-emission center. By changing an impurity element that is contained, light emission of various colors can be obtained. As a method for forming the light-emitting material, various methods such as a solid phase method and a liquid phase method (a coprecipitation method) may be used. Alternatively, an evaporative decomposition method, a double decomposition method, a method by heat decomposition reaction of a precursor, a reversed micelle method, a method in which such a method is combined with high-temperature baking, a liquid phase method such as a lyophilization method, or the like can be used.

A solid phase method is a method in which a base material, and an impurity element or a compound containing an impurity element are weighed, mixed in a mortar, heated in an electric furnace, and baked to be reacted, so that the impurity element is contained in the base material. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state. Although the baking is necessarily performed at relatively high temperature, the solid phase method is easy; therefore, high productivity can be achieved. Thus, the solid phase method is suitable for mass production.

A liquid phase method (a coprecipitation method) is a method in which a base material or a compound containing a base material is reacted with an impurity element or a compound containing an impurity element in a solution, dried, and then baked. Particles of a light-emitting material are distributed uniformly, and the reaction can progress even when the grain size is small and the baking temperature is low.

As the base material used for the light-emitting material, sulfide, oxide, or nitride can be used. As sulfide, the flowing can be used: zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like. As oxide, zinc oxide (ZnO), yttrium oxide ($Y_2O_3$), or the like can be used. As nitride, aluminum nitride (AlN), gallium nitride (GaN), indium nitride (InN), or the like can be used. Alternatively, zinc selenide (ZnSe), zinc telluride (ZnTe), or the like may be used, or a ternary mixed crystal such as calcium gallium sulfide ($CaGa_2S_4$), strontium gallium sulfide ($SrGa_2S_4$), or barium gallium sulfide ($BaGa_2S_4$) may be used.

As the light-emission center of localized light emission, the following can be used: manganese (Mn), copper (Cu), samarium (Sm), terbium (Tb), erbium (Er), thulium (Tm), europium (Eu), cerium (Ce), praseodymium (Pr), or the like. Note that a halogen element such as fluorine (F) or chlorine (Cl) may be added. The halogen element can also function as charge compensation.

On the other hand, as the light-emission center of donor-acceptor recombination light emission, a light-emitting material containing a first impurity element which forms a donor level and a second impurity element which forms an acceptor level can be used. As the first impurity element, fluorine (F), chlorine (Cl), aluminum (Al), or the like can be used. As the second impurity element, copper (Cu), silver (Ag), or the like can be used.

In the case where the light-emitting material of donor-acceptor recombination light emission is synthesized by a solid phase method, each of the base material, the first impurity element or a compound containing the first impurity element, and the second impurity element or a compound containing the second impurity element is weighed, mixed in a mortar, heated in an electric furnace, and baked. As the base material, any of the above-described base materials can be used. As the first impurity element or the compound containing the first impurity element, fluorine (F), chlorine (Cl), aluminum sulfide ($Al_2S_3$), or the like can be used. As the second impurity element or the compound containing the second impurity element, copper (Cu), silver (Ag), copper sulfide ($Cu_2S$), silver sulfide ($Ag_2S$), or the like can be used. The baking temperature is preferably 700 to 1500° C. This is because the solid reaction does not progress when the temperature is too low, whereas the base material is decomposed when the temperature is too high. The baking may be performed in a powder state; however, it is preferable to perform the baking in a pellet state.

As the impurity element in the case of utilizing solid reaction, the compounds containing the first impurity element and the second impurity element may be combined. In this case, since the impurity elements are easily diffused and solid reaction progresses easily, a uniform light-emitting material can be obtained. Further, since an unnecessary impurity element is not mixed, a light-emitting material having high purity can be obtained. As the compound containing the first impurity element and the second impurity element, copper chloride (CuCl), silver chloride (AgCl), or the like can be used.

Note that the concentration of these impurity elements may be 0.01 to 10 atomic % with respect to the base material and is preferably 0.05 to 5 atomic %.

In the case of a thin-film inorganic EL element, an electroluminescent layer is a layer containing the above light-emitting material, and can be formed by a vacuum evaporation method such as a resistance heating evaporation method or an electron beam evaporation (EB evaporation) method, a physical vapor deposition (PVD) method such as a sputtering method, a chemical vapor deposition (CVD) method such as a metal organic CVD method or a low-pressure hydride transport CVD method, an atomic layer epitaxy (ALE) method, or the like.

Figure 23A:
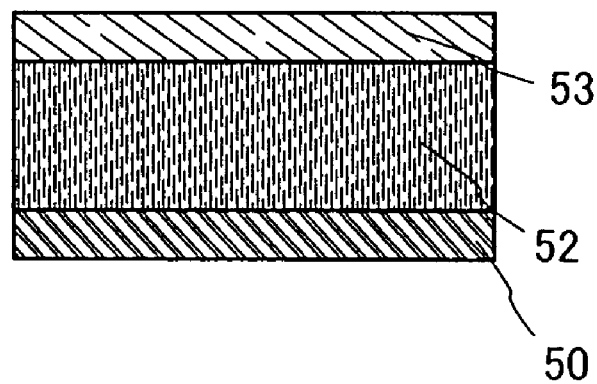
FIGS. 23A to 23C are diagrams each showing a structure of a light-emitting element applicable to the present invention.
Figure 23B:
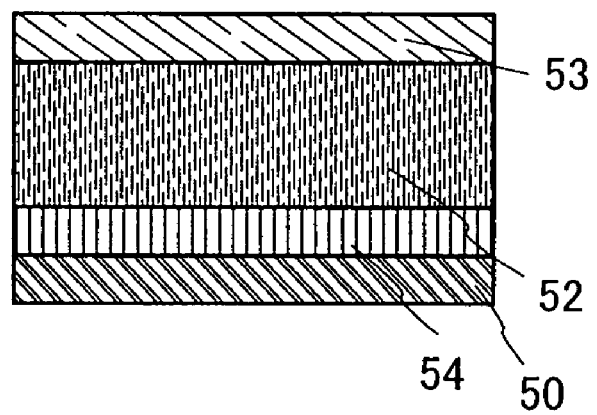
Figure 23C:
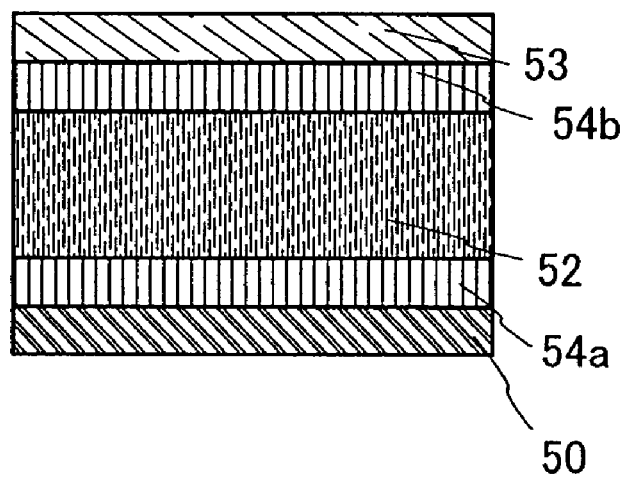

FIGS. 23A to 23C each show an example of a thin-film inorganic EL element that can be used as a light-emitting element. In FIGS. 23A to 23C, each light-emitting element includes a first electrode layer 50, an electroluminescent layer 52, and a second electrode layer 53.

The light-emitting elements shown in FIGS. 23B and 23C each have a structure where an insulating layer is provided between the electrode layer and the electroluminescent layer of the light-emitting element of FIG. 23A. The light-emitting element shown in FIG. 23B has an insulating layer 54 between the first electrode layer 50 and the electroluminescent layer 52. The light-emitting element shown in FIG. 23C includes an insulating layer 54a between the first electrode layer 50 and the electroluminescent layer 52, and an insulating layer 54b between the second electrode layer 53 and the electroluminescent layer 52. Thus, the insulating layer may be provided either between the electroluminescent layer and one of the electrode layers that interpose the electroluminescent layer, or both of between the electroluminescent layer and the first electrode layer and between the electroluminescent layer and the second electrode layer. Further, the insulating layer may employ a single-layer structure or a stacked-layer structure including a plurality of layers.

Further, although the insulating layer 54 is provided to be in contact with the first electrode layer 50 in FIG. 23B, the insulating layer 54 may be provided to be in contact with the second electrode layer 53 by reversing the order of the insulating layer and the electroluminescent layer.

In the case of a dispersion inorganic EL element, a film-shaped electroluminescent layer is formed by dispersing particles of a light-emitting material in a binder. When particles with a desired grain size cannot be obtained by a method for manufacturing a light-emitting material, a light-emitting material may be processed into a particle state by crushing in a mortar or the like. The binder is a substance for fixing particles of a light-emitting material in a dispersed state to keep a shape of an electroluminescent layer. The light-emitting material is uniformly dispersed and fixed in the electroluminescent layer by the binder.

In the case of the dispersion inorganic EL element, as a method for forming an electroluminescent layer, a droplet discharging method which can selectively form an electroluminescent layer, a printing method (such as screen printing or offset printing), a coating method such as a spin coating method, a dipping method, a dispenser method, or the like can be used. There is no particular limitation on the thickness of the electroluminescent layer; however, a thickness of 10 to 1000 nm is preferable. In addition, in the electroluminescent layer containing a light-emitting material and a binder, a ratio of the light-emitting material is preferably equal to or greater than 50 wt % and equal to or less than 80 wt %.

Figure 24A:
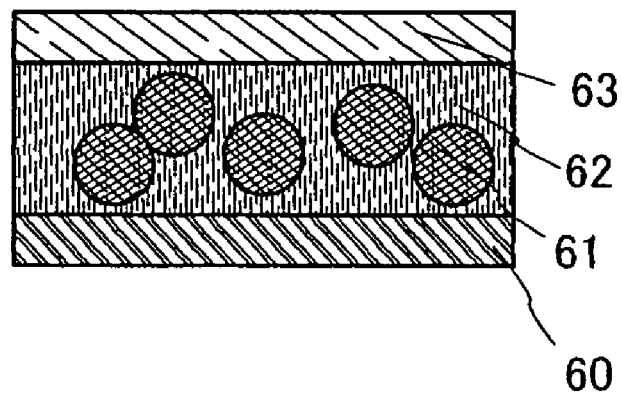
FIGS. 24A to 24C are diagrams each showing a structure of a light-emitting element applicable to the present invention.
Figure 24B:
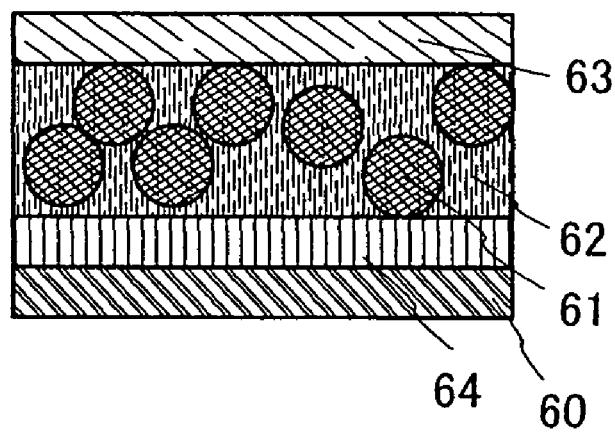
Figure 24C:
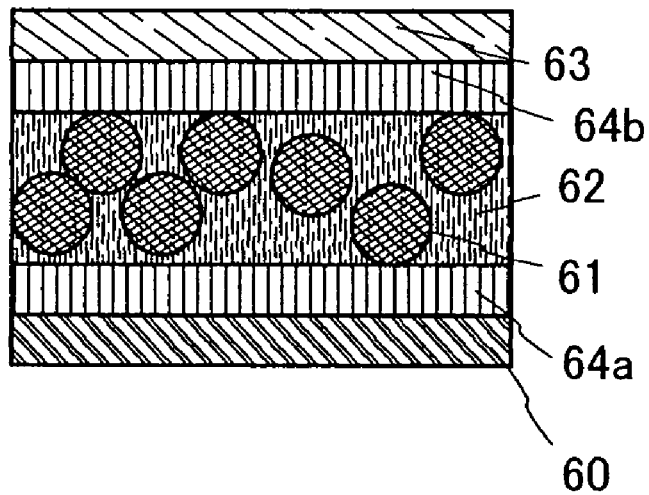

FIGS. 24A to 24C each show an example of a dispersion inorganic EL element that can be used as a light-emitting element. In FIG. 24A, the light-emitting element employs a stacked-layer structure of a first electrode layer 60, an electroluminescent layer 62, and a second electrode layer 63, in which a light-emitting material 61 held by a binder is contained in the electroluminescent layer 62.

Further, also each of the first electrode layers 50 and 60 and the second electrode layers 53 and 63 may be formed as follows, as described in Embodiment Mode 3: a conductive light-absorbing film is formed over a transposing substrate and irradiated with laser light, to be formed selectively over a transposed substrate while being processed into a desired shape.

As the binder that can be used in this embodiment mode, an organic material or an inorganic material can be used, and a mixed material of an organic material and an inorganic material may also be used. As the organic material, a resin such as a polymer having a relatively high dielectric constant, e.g., a cyanoethyl cellulose-based resin, polyethylene, polypropylene, a polystyrene-based resin, a silicone resin, an epoxy resin, or vinylidene fluoride can be used. Alternatively, a heat-resistant high molecular such as aromatic polyamide or polybenzimidazole, or a siloxane resin may be used. Note that a siloxane resin corresponds to a resin containing a Si—O—Si bond. Siloxane is composed of a skeleton structure formed by the bond of silicon (Si) and oxygen (O). As a substituent thereof, an organic group containing at least hydrogen (such as an alkyl group or aromatic hydrocarbon) is used. Instead, a fluoro group, or a fluoro group and an organic group containing at least hydrogen may be used as the substituent. Further alternatively, a resin material such as a vinyl resin, e.g., polyvinyl alcohol or polyvinyl butyral, a phenol resin, a novolac resin, an acrylic resin, a melamine resin, a urethane resin, or an oxazole resin (polybenzoxazole) may be used. A dielectric constant can be controlled by mixing high-dielectric constant microparticles of barium titanate ($BaTiO_3$), strontium titanate ($SrTiO_3$), or the like as appropriate.

As the inorganic material contained in the binder, a material selected from silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), and other substances containing an inorganic material can be used. By mixing a high-dielectric constant inorganic material (by addition or the like), a dielectric constant of an electroluminescent layer containing a light-emitting material and a binder can be further controlled to be increased. When a mixed layer of an inorganic material and an organic material is used for the binder to provide a high dielectric constant, a large amount of electric charges can be induced by the light-emitting material.

In a manufacturing process, the light-emitting material is dispersed in a solution containing a binder. As a solvent of the solution containing the binder that can be used in this embodiment mode, it is preferable to select a solvent that dissolves a binder material and can make a solution with the viscosity appropriate for a method for forming the electroluminescent layer (various wet processes) and a desired film thickness. An organic solvent or the like can be used, and for example, when a siloxane resin is used as the binder, propylene glycolmonomethyl ether, propylene glycolmonomethyl ether acetate (also called PGMEA), 3-methoxy-3-methyl-1-butanol (also called MMB), or the like can be used.

The light-emitting elements shown in FIGS. 24B and 24C each have a structure where an insulating layer is provided between the electrode layer and the electroluminescent layer of the light-emitting element of FIG. 24A. The light-emitting element shown in FIG. 24B has an insulating layer 64 between the first electrode layer 60 and the electroluminescent layer 62. The light-emitting element shown in FIG. 24C includes an insulating layer 64a between the first electrode layer 60 and the electroluminescent layer 62, and an insulating layer 64b between the second electrode layer 63 and the electroluminescent layer 62. Thus, the insulating layer may be provided either between the electroluminescent layer and one of the electrode layers that interpose the electroluminescent layer, or both of between the electroluminescent layer and the first electrode layer and between the electroluminescent layer and the second electrode layer. Further, the insulating layer may employ a single-layer structure or a stacked-layer structure including a plurality of layers.

Further, although the insulating layer 64 is provided to be in contact with the first electrode layer 60 in FIG. 24B, the insulating layer 64 may be provided to be in contact with the second electrode layer 63 by reversing the order of the insulating layer and the electroluminescent layer.

Although the insulating layer 54 in FIGS. 23B and 23C and the insulating layer 64 in FIGS. 24B and 24C are not particularly limited, such insulating layers preferably have high dielectric strength and dense film qualities, and more preferably have a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), or the like, or a mixed film or a staked-layer film of two or more kinds thereof can be used. Such an insulating film can be formed by sputtering, evaporation, CVD, or the like. Further, the insulating layer may also be formed by dispersing particles of such an insulating material in a binder. A binder material may be formed of a similar material and by a similar method to the binder contained in the electroluminescent layer. A thickness of such an insulating layer is not particularly limited, and is preferably in the range of 10 to 1000 nm.

Each light-emitting element described in this embodiment mode can emit light by application of voltage between the pair of electrode layers which interpose the electroluminescent layer, and can be operated by either direct current driving or alternating current driving.

By the present invention, components such as a wiring included in a display device or the like can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

This embodiment mode can be freely combined with any of Embodiment Modes 1 to 5 as appropriate.

Embodiment Mode 9

In this embodiment mode, an example of a display device in order to manufacture a display device at low cost through a highly reliable, more simplified process is described. Specifically, a liquid crystal display device using a liquid crystal display element as a display element is described.

FIG. 19A is a top diagram of a liquid crystal display device, and FIG. 19B is a cross-sectional diagram taken along a line G-H of FIG. 19A.

As shown in FIG. 19A, a pixel region 606, and driver circuit regions 608a and 608b which are scan line driver circuits are sealed between a substrate 600 and a counter substrate 695 with a sealing member 692, and a driver circuit region 607 which is a signal line driver circuit formed of an IC driver is provided over the substrate 600. A transistor 622 and a capacitor 623 are provided in the pixel region 606. A driver circuit including transistors 620 and 621 is provided in the driver circuit region 608b. A reference numeral 602 and 603 show an external terminal connection region and a sealing region, respectively. An insulating substrate can be used as the substrate 600 as in the above embodiment modes. Further, although there is a general concern that a substrate formed of a synthetic resin has a lower temperature limit than other substrates, the substrate formed of the synthetic resin can be used by transposition after a manufacturing process is performed using a substrate with high heat resistance.

In the pixel region 606, the transistor 622 which is to be a switching element is provided with base films 604a and 604b interposed therebetween. In this embodiment mode, a multigate thin film transistor (TFT) is used as the transistor 622, which includes a semiconductor layer having impurity regions serving as a source region and a drain region, a gate insulting layer, a gate electrode layer having a stacked-layer structure of two layers, a source electrode layer, and a drain electrode layer. The source or drain electrode layer is in contact with and electrically connected to the impurity region of the semiconductor layer and a pixel electrode layer 630.

Each of the source electrode layer and the drain electrode layer has a stacked-layer structure, and source and drain electrode layers 644a and 644b are electrically connected to the pixel electrode layer 630 in an opening formed in an insulating layer 615. The opening in the insulating layer 615 can be formed by irradiation with laser light as described in Embodiment Mode 2. In this embodiment mode, the source or drain electrode layer 644b is formed using a low-melting point metal that is relatively easily evaporated (chromium in this embodiment mode), and the source or drain electrode layer 644a is formed using a high-melting point metal that is not easily evaporated compared to the source or drain electrode layer 644b (tungsten in this embodiment mode). The source and drain electrode layers 644a and 644b are selectively irradiated with laser light from an insulating layer 615 side, and then the insulating layer 615 over an irradiated region of the source or drain electrode layer 644b is removed by the irradiation energy, so that a first opening reaching the source or drain electrode layer 644b is formed.

Then, the source or drain electrode layer 644b is removed by etching using the insulating layer 615 having the first opening as a mask, so that a second opening reaching the source or drain electrode layer 644a is formed. The etching for forming the second opening may be performed by both of or either one of wet etching and dry etching, and may be performed plural times.

The pixel electrode layer 630 is formed in the second opening where the source and drain electrode layers 644a and 644b are exposed, thereby electrically connecting to the source and drain electrode layers 644a and 644b.

Since the opening can be selectively formed by laser light, it is not necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not necessarily heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the insulating layer having the first opening as a mask, the conductive light-absorbing layer (or the conductive layer below the light-absorbing layer) can be exposed in the second opening.

As described above, an opening (a contact hole) which electrically connects conductive layers can be formed in an insulating layer by laser light irradiation without forming a mask layer using a complicated photolithography process.

The thin film transistor can be manufactured by various methods. For example, a crystalline semiconductor film is used as an active layer, a gate electrode is provided over the crystalline semiconductor film with a gate insulating film interposed therebetween, and an impurity element can be added to the active layer by using the gate electrode. Thus, by using the gate electrode for adding the impurity element, it is not necessary to form a mask for adding the impurity element. The gate electrode can employ a single-layer structure or a stacked-layer structure. The impurity region can be either a high-concentration impurity region or a low-concentration impurity region with its concentration being controlled. A structure of such a thin film transistor having a low-concentration impurity region is called an LDD (Lightly Doped Drain) structure. Further, the low-concentration impurity region may be formed to overlap with the gate electrode and a structure of such a thin film transistor is called a GOLD (Gate Overlapped LDD) structure. The conductivity type of the thin film transistor is an n type when phosphorus (P) or the like is used for the impurity region. The conductivity type of the thin film transistor is a p type when boron (B) or the like is added. After that, insulating films 611 and 612 covering the gate electrode and the like are formed. A dangling bond of the crystalline semiconductor film can be terminated by a hydrogen element mixed into the insulating film 611 (and the insulating film 612).

In order to further improve planarity, the insulating layer 615 may be formed as an interlayer insulating layer. As the insulating layer 615, an organic material, an inorganic material, or a stacked-layer structure thereof can be used. For example, a material selected from silicon oxide, silicon nitride, silicon oxynitride, silicon nitride oxide, aluminum nitride, aluminum oxynitride, aluminum nitride oxide containing more nitrogen than oxygen, aluminum oxide, diamond-like carbon (DLC), polysilazane, nitrogen-containing carbon (CN), PSG (phosphosilicate glass), BPSG (borophosphosilicate glass), alumina, and other substances containing an inorganic insulating materials can be used. Alternatively, an organic insulating material may be used. As the organic material, either a photosensitive material or a nonphotosensitive material can be used, and polyimide, acrylic, polyamide, polyimide amide, resist, benzocyclobutene, a siloxane resin, or the like can be used. It is to be noted that a siloxane resin is a resin containing a Si—O—Si bond. The skeletal structure of siloxane is formed of a bond of silicon (Si) and oxygen (O). As a substituent, an organic group containing at least hydrogen (such as an alkyl group or aromatic hydrocarbon) is used. Instead, a fluoro group, or a fluoro group and an organic group containing at least hydrogen may be used as the substituent.

The pixel region and the driver circuit region can be formed over the same substrate when the crystalline semiconductor film is used. In this case, each transistor in the pixel region and each transistor in the driver circuit region 608b are formed at the same time. The transistors included in the driver circuit region 608b forms a CMOS circuit. Although each thin film transistor included in the CMOS circuit employs a GOLD structure, it may employ an LDD structure like the transistor 622.

The present invention is not limited to this embodiment mode, and each thin film transistor in the pixel region may employ any of a single-gate structure in which one channel formation region is formed, a double-gate structure in which two channel formation regions are formed, and a triple-gate structure in which three channel formation regions are formed. Similarly, each thin film transistor in the peripheral driver circuit region may employ any of a single-gate structure, a double-gate structure, and a triple-gate structure.

Note that the present invention is not limited to each thin film transistor described in this embodiment mode. The present invention may also be applied to a thin film transistor employing any of a top gate structure (e.g., a staggered type), a bottom gate structure (e.g., an inversely staggered type), a dual gate structure in which two gate electrode layers are arranged above and below a channel formation region, with a gate insulating film interposed between the channel formation region and each gate electrode layer, and other structures.

Next, an insulating layer 631 called an alignment film is formed by a printing method or a droplet discharging method to cover the pixel electrode layer 630. Note that the insulating layer 631 can be selectively formed by a screen printing method or an off-set printing method. Thereafter, rubbing treatment is performed. This rubbing treatment is not performed in some cases when a liquid crystal mode is, for example, a VA mode. An insulating layer 633 serving as an alignment film is similar to the insulating layer 631. Then, the sealing member 692 is formed in a peripheral region of the pixels by a droplet discharging method.

After that, the counter substrate 695 provided with the insulating layer 633 serving as the alignment film, a conductive layer 634 serving as a counter electrode, a colored layer 635 serving as a color filter, a polarizer 641 (also called a polarizing plate), and a polarizer 642 is attached to the substrate 600 which is the TFT substrate with a spacer 637 interposed therebetween, and a liquid crystal layer 632 is provided in the space therebetween. Since the liquid crystal display device of this embodiment mode is a transmissive type, a polarizer (polarizing plate) 643 is also provided on a side of the substrate 600, which is opposite to a side where the elements are provided. The polarizer can be provided over the substrate with the use of an adhesive layer. A filler may be mixed into the sealing member, and a shielding film (a black matrix) or the like may be provided for the counter substrate 695. Note that the color filter or the like may be formed of materials which exhibit red (R), green (G), and blue (B) when the liquid crystal display device performs full-color display, and may be omitted or may be formed of a material which exhibits at least one color when the liquid crystal display device performs a mono-color display.

Note that when light-emitting diodes (LEDs) which exhibit R, G, and B respectively, or the like are provided as backlights and a field sequential method for performing color display by time division is employed, there is the case where the color filter is not provided. The black matrix may be provided to overlap with the transistor and the CMOS circuit in order to reduce the reflection of external light due to a wiring of the transistor and the CMOS circuit. Note that the black matrix may be provided to overlap with the capacitor; this is because the black matrix can prevent reflection due to a metal film included in the capacitor.

As a method for forming the liquid crystal layer, a dispenser method (a dripping method) can be employed, or an injection method in which a liquid crystal is injected with the use of a capillary phenomenon may be used after the substrate 600 provided with the elements is attached to the counter substrate 695. The dripping method may be employed when a large substrate to which the injection method is difficult to be applied is used.

The spacer may be provided by a method of spraying particles each having a size of several μm. In this embodiment mode, a method in which a resin film is formed over the entire surface of the substrate and then etched is employed. A material for the spacer is applied by a spinner and then, light exposure and developing treatment are performed to form a predetermined pattern thereof. Further, the material is heated at 150 to 200° C. in a clean oven or the like to be cured. The spacer thus manufactured can have various shapes depending on the conditions of the light exposure and the developing treatment. It is preferable that the spacer have a columnar shape with a flat top so that mechanical strength of the liquid crystal display device can be secured when the counter substrate is attached. The shape of the spacer is not particularly limited and may be conical, pyramidal, or the like.

Then, an FPC 694, which is a wiring board for connection, is provided over terminal electrode layers 678a and 678b electrically connected to the pixel region, with an anisotropic conductive layer 696 interposed therebetween. The FPC 694 transmits signals and potentials from outside. Through the above-described steps, a liquid crystal display device having a display function can be manufactured.

Note that as each of the wiring, the gate electrode layer, the pixel electrode layer 630, and the conductive layer 634 serving as the counter electrode layer included in the transistor, the following can be used: indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide; a metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy of such a metal; or metal nitride thereof.

A retardation film may be provided between the polarizing plate and the liquid crystal layer.

Note that although this embodiment mode describes a TN liquid crystal panel, the above process can also be applied similarly to liquid crystal panels of other modes. For example, this embodiment mode can be applied to a liquid crystal panel of a transverse electric field mode in which liquid crystals are aligned by application of an electric filed in a direction parallel to the glass substrate. Further, this embodiment mode can also be applied to a VA (Vertical Alignment) mode liquid crystal panel.

Figure 5:
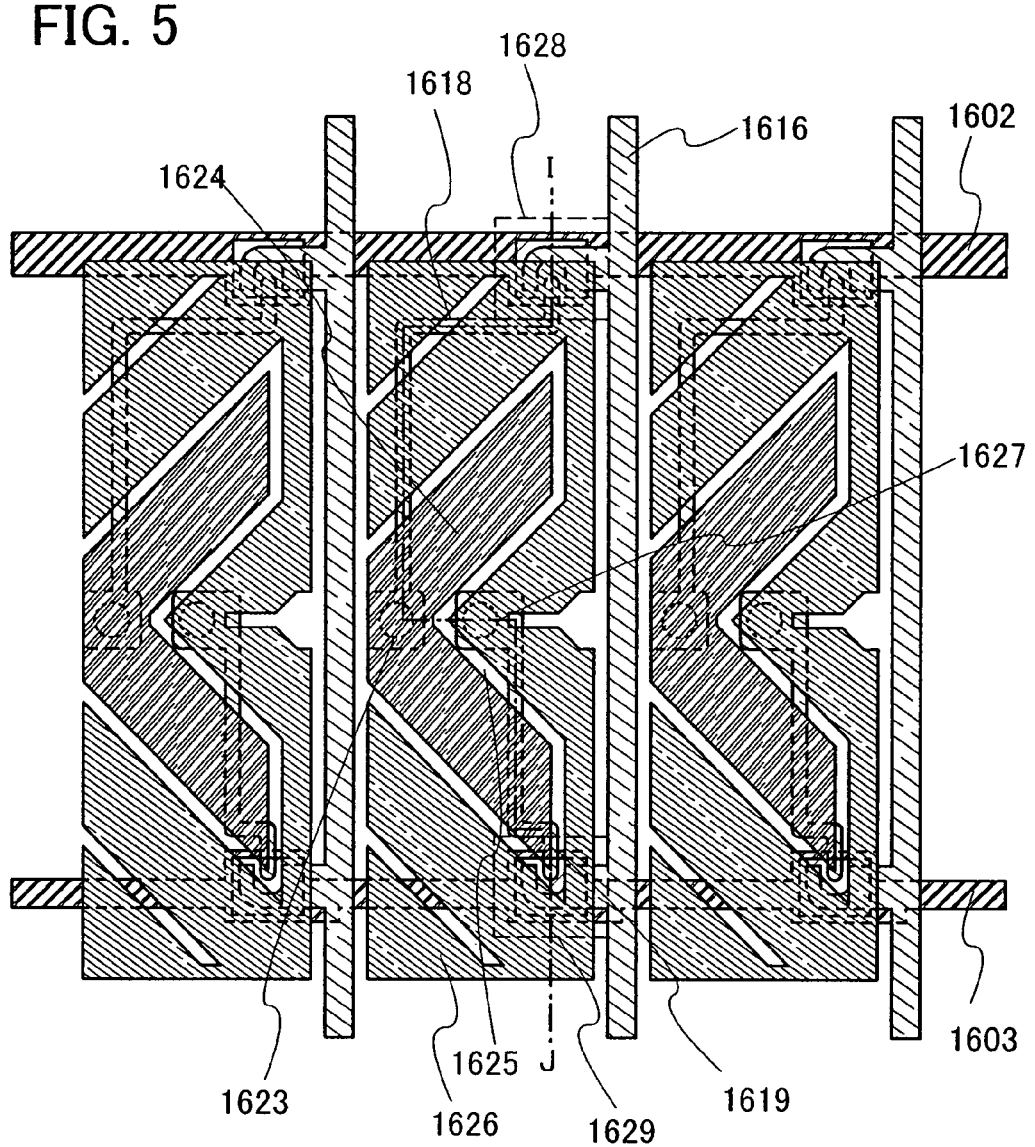
FIG. 5 is a diagram showing a display device of the present invention.
Figure 6:
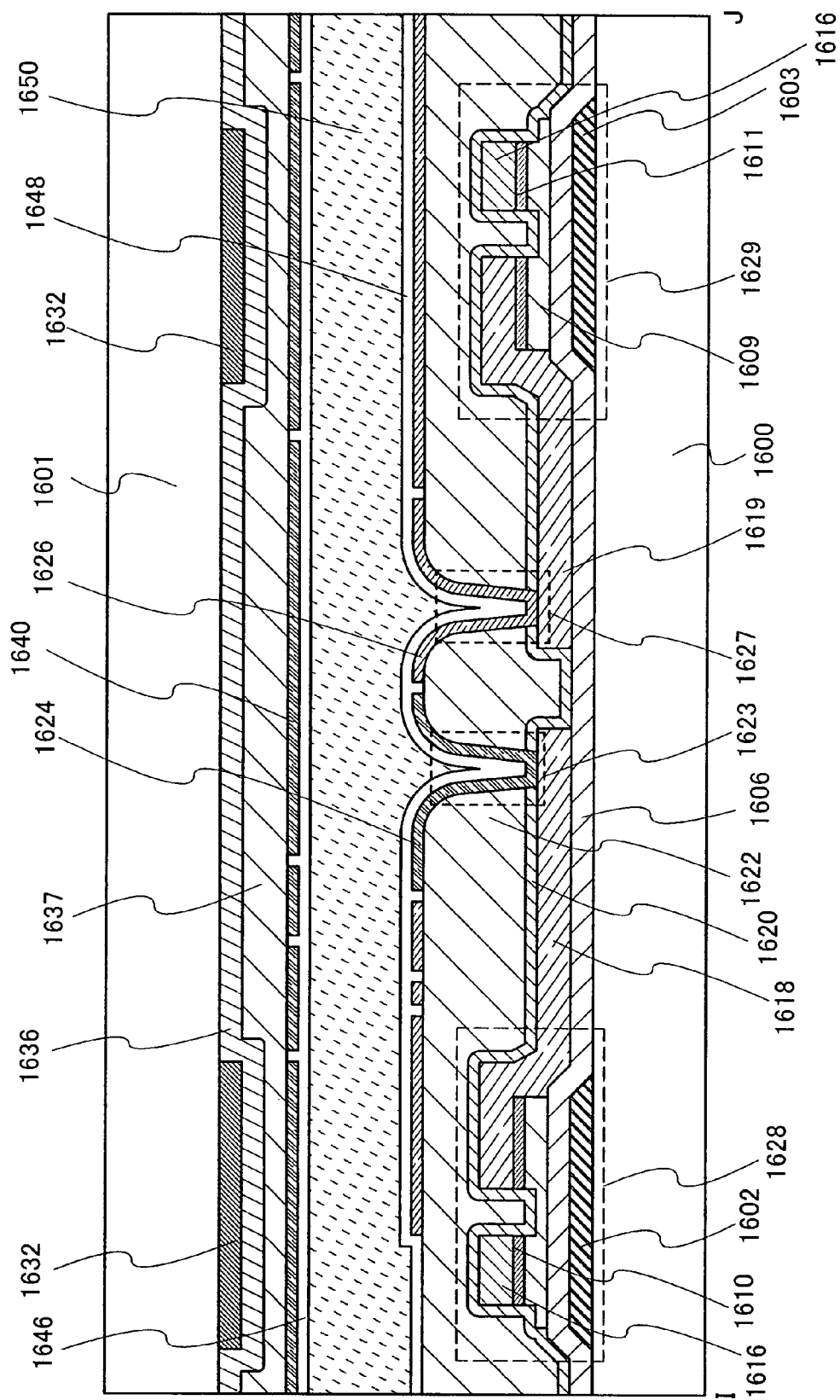
FIG. 6 is a diagram showing a display device of the present invention.

FIGS. 5 and 6 show a pixel structure of a VA liquid crystal panel. FIG. 5 is a plan diagram, and FIG. 6 shows a cross-sectional structure taken along a line I-J in FIG. 5. In the following description, these drawings are used.

In this pixel structure, a plurality of pixel electrodes are provided for one pixel, and each pixel electrode is connected to a TFT. Each TFT is driven by a different gate signal. That is, in a multi-domain pixel, signals applied to pixel electrodes are controlled separately.

A pixel electrode layer 1624 is connected to a TFT 1628 with a wiring layer 1618 in an opening (a contact hole) 1623. In addition, a pixel electrode layer 1626 is connected to a TFT 1629 with a wiring layer 1619 in an opening (a contact hole) 1627. A gate wiring layer 1602 of the TFT 1628 and a gate electrode layer 1603 of the TFT 1629 are separated such that different gate signals are supplied. On the other hand, a wiring layer 1616 functioning as a data line is used in common in the TFTs 1628 and 1629. Here, reference numeral 1600 denotes a substrate, reference numeral 1609 denotes an amorphous semiconductor layer, 1610 and 1611 denote amorphous semiconductor layers having one conductivity type, 1606 shows a gate insulating layer, and 1648 shows an interlayer insulating layer.

Each of the pixel electrode layers 1624 and 1626 may also be formed as follows, as described in Embodiment Mode 3: a conductive light-absorbing film is formed over a transposing substrate, and irradiated with laser light, to be formed selectively over a transposed substrate while being processed into a desired shape. Accordingly, by using the present invention, since the manufacturing process is simplified and loss of materials can be prevented, a display device can be manufactured at low cost with high productivity.

Figure 7:
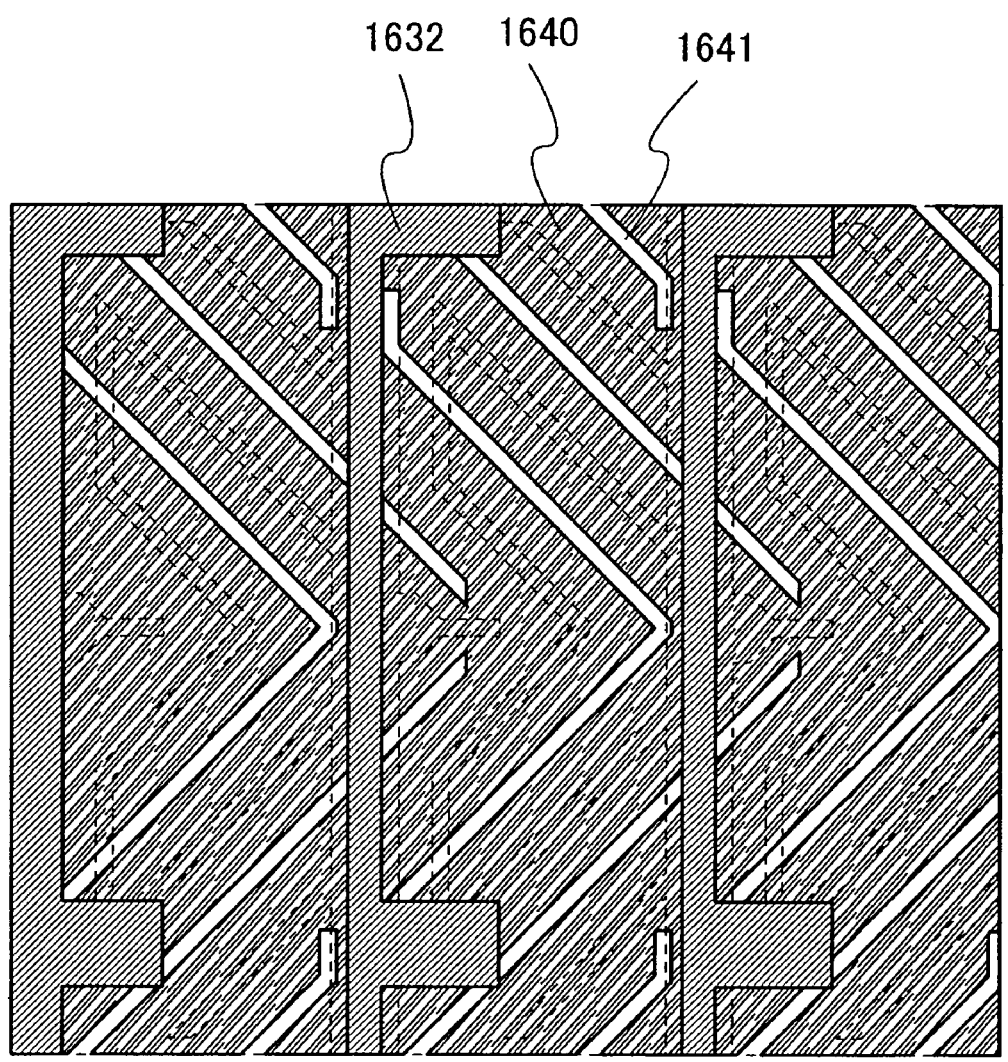
FIG. 7 is a diagram showing a display device of the present invention.
Figure 8A:
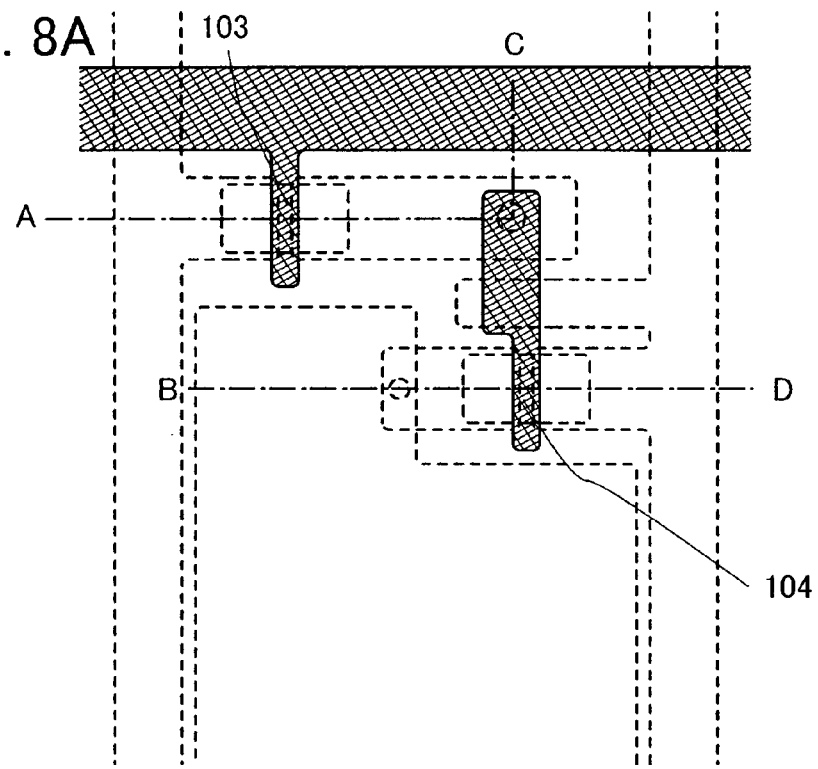
FIGS. 8A to 8C are diagrams showing a method for manufacturing a display device of the present invention.
Figure 8B:
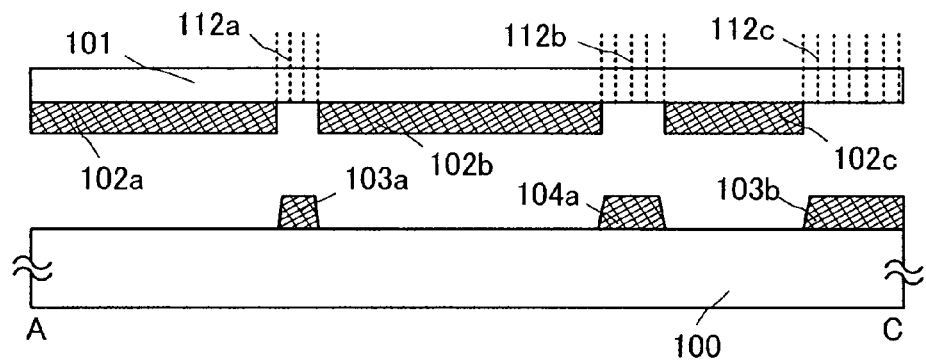
Figure 8C:
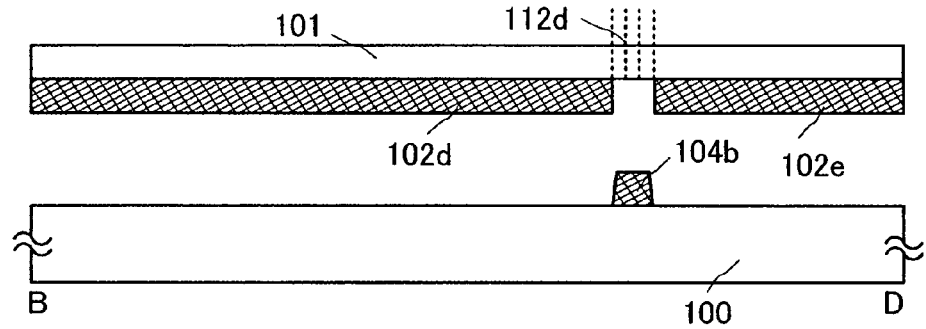

The shapes of the pixel electrode layers 1624 and 1626 are different, and the pixel electrode layers 1624 and 1626 are separated by a slit 1625. The pixel electrode layer 1626 is formed to surround the pixel electrode layer 1624 that spreads out into a V-shape. Timings of application of voltage to the pixel electrode layers 1624 and 1626 are made different in the TFTs 1628 and 1629, thereby controlling alignment of liquid crystals. A light-shielding film 1632, a colored layer 1636, and a counter electrode layer 1640 are provided for a counter substrate 1601. A planarization film 1637 is formed between the colored layer 1636 and the counter electrode layer 1640 so that disordered alignment of liquid crystals is prevented. FIG. 7 shows a structure of the counter substrate side. The counter electrode layer 1640 is used in common for different pixels, and a slit 1641 is formed. The slit 1641 and the slit 1625 on the side of the pixel electrode layers 1624 and 1626 are arranged to interdigitate, so that an oblique electric field can be effectively generated to control alignment of liquid crystals. Accordingly, an alignment direction of the liquid crystals can be varied depending on a position, so that the viewing angle can be widened. Reference numerals 1646 and 1648 denote alignment films and 1650 denotes a liquid crystal layer.

Thus, a liquid crystal panel can be manufactured using a composite material of an organic compound and an inorganic compound as a pixel electrode layer. With the use of such a pixel electrode, it is not necessary to use a transparent conductive film containing indium as its main component and a material bottleneck can be resolved.

This embodiment mode can be freely combined with any of Embodiment Modes 1 to 3 as appropriate.

By the present invention, components such as a wiring included in a display device can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 10

In this embodiment mode, an example of a display device in order to manufacture a display device at low cost through a highly reliable, more simplified process is described. Specifically, a liquid crystal display device using a liquid crystal display element as a display element is described.

Figure 18:
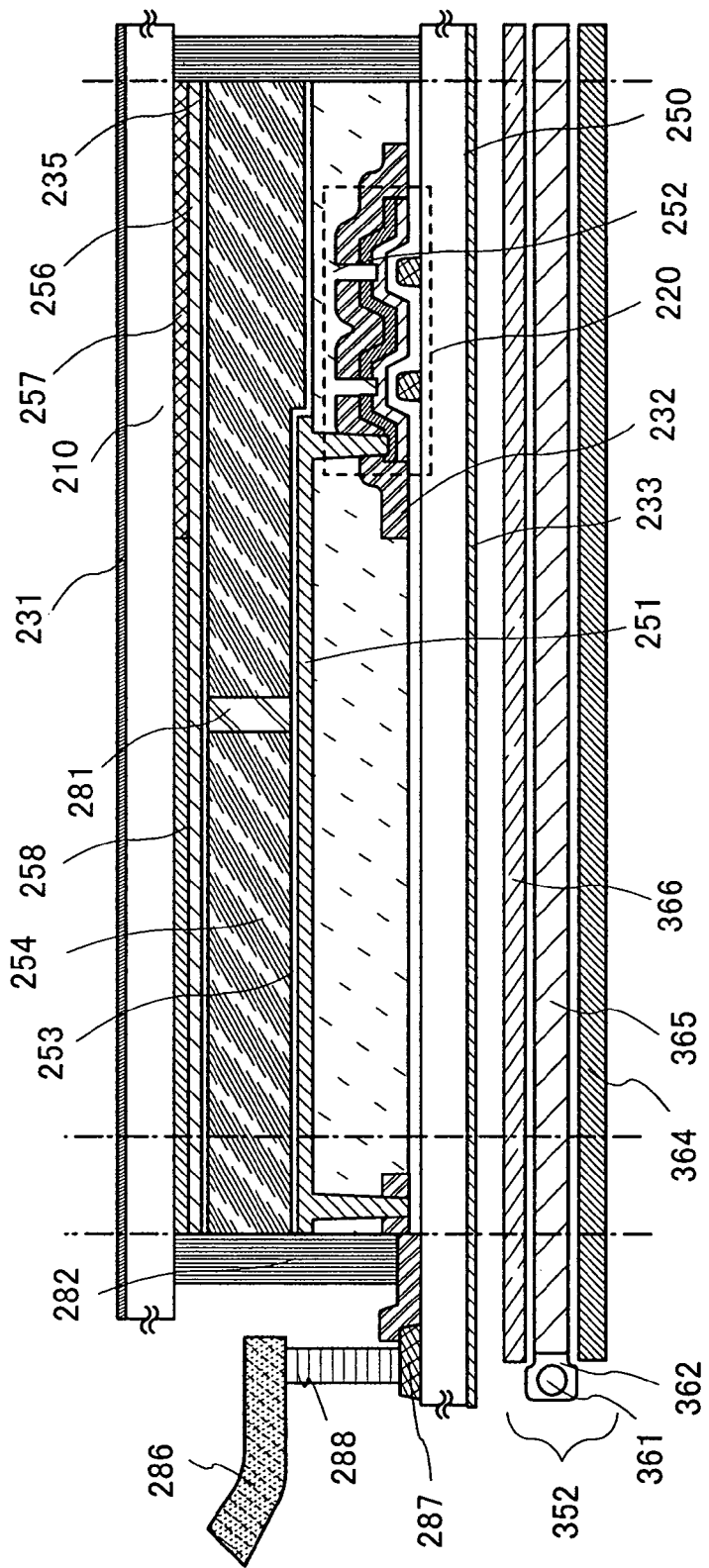
FIG. 18 is a diagram showing a display device of the present invention.

In a display device shown in FIG. 18, a transistor 220 which is an inversely staggered thin film transistor, a pixel electrode layer 251, an insulating layer 252, an insulating layer 253, a liquid crystal layer 254, a spacer 281, an insulating layer 235, a counter electrode layer 256, a color filter 258, a black matrix 257, a counter substrate 210, a polarizing plate (a polarizer) 231, and a polarizing plate (a polarizer) 233 are provided in a pixel region, and a sealing member 282, a terminal electrode layer 287, an anisotropic conductive layer 288, and an FPC 286 are provided in a sealing region, over a substrate 250.

Each of a gate electrode layer, a semiconductor layer, a source electrode layer, a drain electrode layer, and the pixel electrode layer 251 of the transistor 220 which is an inversely staggered thin film transistor formed in this embodiment mode may also be formed as follows, as described in Embodiment Mode 3: a light-absorbing film using a conductive material or a semiconductor material is formed over a transposing substrate, and irradiated with laser light, to be formed selectively over a transposed substrate while being processed into a desired shape. Accordingly, by using the present invention, since the manufacturing process is simplified and loss of materials can be prevented, a display device can be manufactured at low cost with high productivity.

In this embodiment mode, an amorphous semiconductor is used as the semiconductor layer, and the semiconductor layer having one conductivity type may be formed as needed. In this embodiment mode, the semiconductor layer and an amorphous n-type semiconductor layer as the semiconductor layer having one conductivity type are stacked. Further, an NMOS structure of an n-channel thin film transistor can be formed by forming an n-type semiconductor layer, a PMOS structure of a p-channel thin film transistor can be formed by forming a p-type semiconductor layer, or a CMOS structure of an n-channel thin film transistor and a p-channel thin film transistor can be formed.

Further, in order to impart a conductivity type, an element imparting conductivity type may be added by doping to form an impurity region in the semiconductor layer, so that an n-channel thin film transistor or a p-channel thin film transistor can be formed. Instead of forming an n-type semiconductor layer, a conductivity type may be imparted to the semiconductor layer by plasma treatment using a $PH_3$ gas.

In this embodiment mode, the transistor 220 is an n-channel inversely staggered thin film transistor. Alternatively, a channel protective type, inversely staggered thin film transistor in which a protective layer is provided over a channel region of the semiconductor layer may be used.

Next, a structure of a backlight unit 352 is described. The backlight unit 352 includes a cold cathode tube, a hot cathode tube, a light-emitting diode, an inorganic EL, or an organic EL as a light source 361 which emits fluorescence, a lamp reflector 362 for effectively leading fluorescence to a light guide plate 365, the light guide plate 365 for leading light to the entire surface with fluorescence totally reflected, a diffusing plate 366 for reducing variations in brightness, and a reflective plate 364 for reusing light leaked under the light guide plate 365.

A control circuit for adjusting the luminance of the light source 361 is connected to the backlight unit 352. The luminance of the light source 361 can be controlled by a signal supplied from the control circuit.

The source or drain electrode layer of the transistor 220 is electrically connected to the pixel electrode layer 251 in an opening formed in the insulating layer 252. The opening formed in the insulating layer 252 can be formed by irradiation with laser light as described in Embodiment Mode 1. In this embodiment mode, the source or drain electrode layer is formed using a low-melting point metal that is relatively easily evaporated (chromium in this embodiment mode). The source or drain electrode layer is selectively irradiated with laser light from an insulating layer 252 side, so that the insulating layer 252 over an irradiated region of the source or drain electrode layer is removed by the irradiation energy, to form a first opening.

Next, the source or drain electrode layer 232 is removed by etching using the insulating layer 252 having the first opening as a mask, so that a second opening reaching the semiconductor layer having one conductivity type is formed. The etching for forming the second opening may be performed by both of or either one of wet etching and dry etching, and may be performed plural times.

The pixel electrode layer 251 is formed in the second opening where the source or drain electrode layer and the semiconductor layer having one conductivity type are exposed, thereby electrically connecting to the source or drain electrode layer and the semiconductor layer having one conductivity type.

Since the opening can be selectively formed by laser light, it is not necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the insulating layer having the first opening as a mask, the conductive light-absorbing layer (or the conductive layer below the light-absorbing layer) can be exposed in the second opening.

As described above, an opening (a contact hole) which electrically connects conductive layers can be formed in an insulating layer by laser light irradiation without forming a mask layer using a complicated photolithography process.

This embodiment mode can be combined with any of Embodiment Modes 1 to 3 as appropriate.

By the present invention, components such as a wiring included in a display device can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 11

In this embodiment mode, an example of a display device in order to manufacture a display device at low cost through a highly reliable, more simplified process is described.

Figure 21:
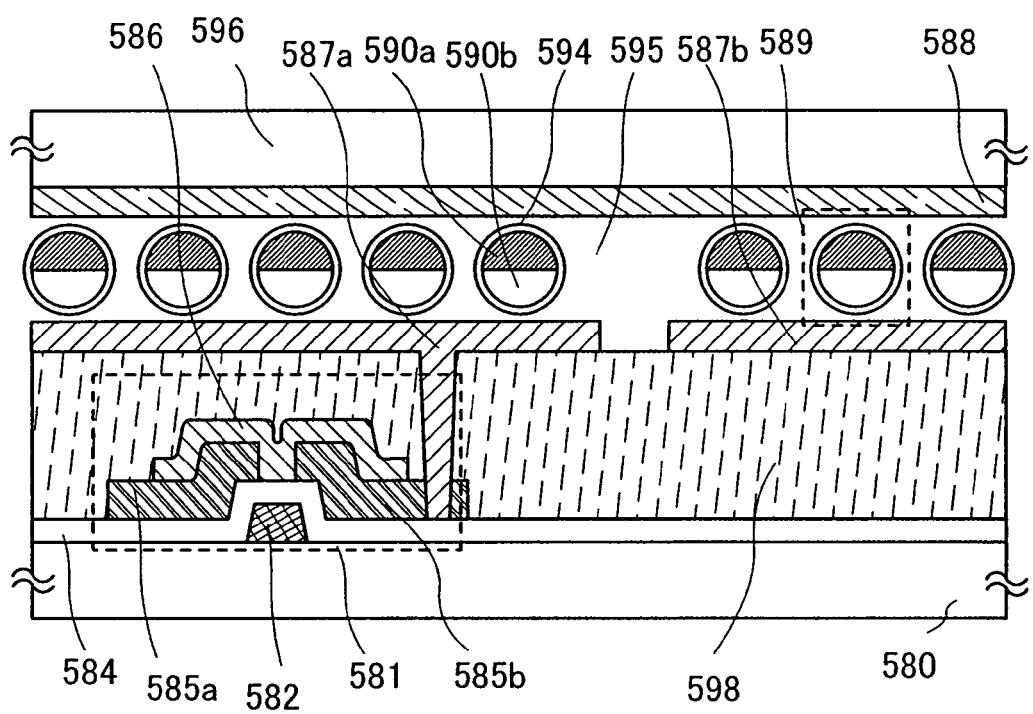
FIG. 21 is a diagram showing a display device of the present invention.

FIG. 21 shows active matrix electronic paper to which the present invention is applied. Although FIG. 21 shows an active matrix type one, the present invention can also be applied to a passive matrix type one.

A twist ball display mode can be used for the electronic paper. A twist ball display mode means a method in which spherical particles each colored in black and white are arranged between a first electrode layer and a second electrode layer, and a potential difference is generated between the first electrode layer and the second electrode layer to control directions of the spherical particles, so that display is performed.

A transistor 581 which is formed over a substrate 580 is an inverse coplanar type thin film transistor, and includes a gate electrode layer 582, a gate insulating layer 584, wiring layers 585a and 585b, and a semiconductor layer 586. In addition, the wiring layer 585b is in contact with and electrically connected to a first electrode layer 587a in an opening formed in an insulating layer 598. Between the first electrode layers 587a and 587b, and a second electrode layer 588, spherical particles 589 each including a black region 590a and a white region 590b, and a cavity 594 filled with liquid around the black and white regions 590a and 590b, are provided, and the space on the periphery of the spherical particles 589 is filled with a filler 595 such as a resin or the like (see FIG. 21).

In this embodiment mode, each of the gate electrode layer, the semiconductor layer, the source electrode layer, the drain electrode layer, and the electrode layer may also be formed as follows, as described in Embodiment Mode 3: a conductive light-absorbing film is formed over a transposing substrate, and irradiated with laser light, to be formed selectively over a transposed substrate while being processed into a desired shape. Accordingly, by using the present invention, since the manufacturing process is simplified and loss of materials can be prevented, cost can be realized.

The wiring layer 585b is electrically connected to the first electrode layer 587a in the opening formed in the insulating layer 598. The opening formed in the insulating layer 598 can be formed by irradiation with laser light as described in Embodiment Mode 1. In this embodiment mode, the wiring layer 585b is formed using a low-melting point metal that is relatively easily evaporated (chromium in this embodiment mode). The wiring layer 585b is selectively irradiated with laser light from an insulating layer 598 side, so that the insulating layer 598 over an irradiated region of the wiring layer 585b is removed by the irradiation energy, to form a first opening reaching the wiring layer 585b.

Next, the wiring layer 585b is removed by etching using the insulating layer 598 having the first opening as a mask, so that a second opening reaching the gate insulating layer 584 is formed. The etching for forming the second opening may be performed by both of or either one of wet etching and dry etching, and may be performed plural times.

The first electrode layer 587a is formed in the opening where the wiring layer 585b is exposed, thereby electrically connecting to the wiring layer 585b.

Since the opening can be selectively formed by laser light, it is not necessary to form a mask layer, so that the number of steps and materials can be reduced. Further, there are advantages in that the light-absorbing layer and the insulating layer can be processed into a predetermined shape with high precision since laser light can be condensed into an extremely small spot, and the region other than the processing region is not heated substantially since heating is performed for a short period of time and instantaneously.

Further, since the opening is formed by using a plurality of steps, that is, thin film removal by laser light irradiation and thin film removal by etching, the opening can be processed into a desired shape (e.g., depth or range with respect to the stacked layer) as appropriate even if the etching selection ratio of the films which are stacked is high. For example, in the case where an insulating film such as an oxide film or a nitride film is formed on a surface of the light-absorbing layer (or the conductive layer below the light-absorbing layer) by the laser light irradiation, electrical connection between the conductive film formed in the opening and the light-absorbing layer cannot be necessarily performed as it is. Even in such a case, by removing the insulating film which is exposed at a bottom surface of the first opening with etching using the insulating layer having the first opening as a mask, the conductive light-absorbing layer (or the conductive layer below the light-absorbing layer) can be exposed in the second opening.

As described above, an opening (a contact hole) which electrically connects conductive layers can be formed in an insulating layer by laser light irradiation without forming a mask layer using a complicated photolithography process.

Instead of the twist ball, an electrophoretic element may be used. A microcapsule having a diameter of 10 to 20 µm in which transparent liquid, positively charged white microparticles, and negatively charged black microparticles are encapsulated is used. In the microcapsule provided between the first electrode layer and the second electrode layer, when an electric field is applied by the first electrode layer and the second electrode layer, the white microparticles and black microparticles move in opposite directions from each other, so that white or black can be displayed. A display element using this principle is an electrophoretic display element and is called electronic paper in general. The electrophoretic display element has higher reflectivity than a liquid crystal display element, and thus an assistant light is unnecessary, power consumption is low, and a display portion can be recognized even in a dim place. Further, even when electric power is not supplied to the display portion, an image which has been displayed once can be stored.

The transistor may employ any structure as long as the transistor can function as a switching element. As the semiconductor layer, various semiconductors such as an amorphous semiconductor, a crystalline semiconductor, a polycrystalline semiconductor, and a microcrystal semiconductor may be used, or an organic transistor may be formed using an organic compound.

Although this embodiment mode specifically describes the case where a structure of a display device is an active matrix type, it is needless to say that the present invention can also be applied to a passive matrix display device. Also in a passive matrix display device, each of a wiring layer, an electrode layer, and the like may be formed as follows: a conductive light-absorbing film is formed over a transposing substrate, and irradiated with laser light, to be formed selectively over a transposed substrate while being processed into a desired shape.

This embodiment mode can be freely combined with any of Embodiment Modes 1 to 3 as appropriate.

By the present invention, components such as a wiring included in a display device can be formed to have a desired shape. Further, a display device can be manufactured through a simplified process with a complicated photolithography process reduced, so that loss of materials and the cost can be reduced. Therefore, high performance and highly reliable display devices can be manufactured with a high yield.

Embodiment Mode 12

Next, modes of mounting a driver circuit on a display panel manufactured in accordance with any of Embodiment Modes 4 to 11 are described.

First, a display device employing a COG method is described with reference to FIG. 26A. The pixel region 2701 for displaying information such as characters, images, or the like is provided over the substrate 2700. A substrate provided with a plurality of driver circuits is divided into rectangles, and each driver circuit (also referred to as a driver IC) 2751 after division is mounted on the substrate 2700. FIG. 26A shows a mode of mounting a plurality of driver ICs 2751 and FPCs 2750 on the tips of the driver ICs 2751. In addition, the size obtained by division may be made almost the same as the length of a side of the pixel region on a signal line side, and a tape may be mounted on the tip of each single driver IC.

Alternatively, a TAB method may be employed. In this case, as shown in FIG. 26B, a plurality of tapes may be attached, and driver ICs may be mounted on the tapes. Similarly to the case of the COG method, a single driver IC may be mounted on a single tape. In this case, a metal piece or the like for fixing the driver IC is preferably attached together for the strength.

As for such a driver IC to be mounted on the display panel, it is preferable to manufacture a plurality of driver ICs over a rectangular substrate having a side of 300 to 1000 mm for improvement in productivity.

That is, a plurality of circuit patterns each including a driver circuit portion and an input/output terminal as one unit may be formed over a substrate and then divided to be taken out. In consideration of the side length of the pixel region or the pixel pitch, the driver IC may be formed to be a rectangle having a long side of 15 to 80 mm and a short side of 1 to 6 mm. Alternatively, the driver IC may be formed to have the side length that is the same as that of the pixel region, or the length obtained by addition of a side length of the pixel region and a side length of each driver circuit.

An advantage of the external dimension of the driver IC over an IC chip is the length of the long side. When the driver IC having a long side length of 15 to 80 mm is used, the number of driver ICs necessary for being mounted in accordance with the pixel region is smaller than that in the case of using an IC chip. Therefore, the yield in manufacturing can be improved. Further, when a driver IC is formed over a glass substrate, there is no limitation on the shape of the substrate used as a base; therefore, productivity is not decreased. This is a great advantage compared to the case where IC chips are taken out of a circular silicon wafer.

Further, in the case where the scan line driver circuit 3702 is formed over the same substrate as the pixel region 3701 as shown in FIG. 25B, a driver IC in which a signal line driver circuit is formed is mounted on a region outside the pixel region 3701. The driver IC is a signal line driver circuit. In order to form a pixel region corresponding to RGB full color display, 3072 signal lines are necessary for an XGA class and 4800 signal lines are necessary for a UXGA class. Such a plurality of signal lines are divided into several blocks at the end portion of the pixel region 3701, thereby forming leading lines, and gathered corresponding to the pitch of output terminals of each driver IC.

The driver IC is preferably formed using a crystalline semiconductor formed over a substrate. The crystalline semiconductor is preferably formed by being irradiated with continuous wave laser light. Therefore, continuous wave solid-state laser or continuous wave gas laser is used for an oscillator for generating the laser light. By using a continuous wave laser, a transistor can be manufactured using a polycrystalline semiconductor layer with few crystal defects and a large grain size. In addition, high-speed driving is possible because mobility and response speed are good, an operating frequency of an element can be improved as compared with a conventional element, and variation in characteristics is small; therefore, high reliability can be obtained. Note that a channel length direction of the transistor and a scanning direction of laser light preferably correspond with each other in order to further improve the operating frequency. This is because the highest mobility can be obtained when a channel length direction of a transistor and a scanning direction of laser light with respect to a substrate are almost parallel to each other (preferably, the angle between them is equal to or larger than −30° and equal to or less than 30°) in a step of laser crystallization with continuous wave laser. Note that the channel length direction corresponds to a direction in which current flows, in other words, a direction in which electric charge moves, in a channel formation region. The transistor thus formed has an active layer including a polycrystalline semiconductor layer in which crystal grains are extended in the channel length direction, and this means that crystal grain boundaries are formed almost along the channel length direction.

In order to perform laser crystallization, it is preferable to significantly narrow laser light, and the shape of the laser light (beam spot) preferably has the width that is the same as a short side of each driver IC, which is equal to or larger than 1 mm and equal to or less than 3 mm. In addition, in order to secure an enough and effective energy density for an object to be irradiated, an irradiated region with laser light preferably has a linear shape. Note that the term "linear" used herein means not a line in a strict sense but a rectangle or an oblong with a large aspect ratio. For example, it refers to a rectangle or an oblong with an aspect ratio of 2 or more (preferably equal to or larger than 10 and equal to or less than 10000). Thus, by setting a width of the laser light shape (beam spot) to be as long as a short side of each driver IC, a method for manufacturing a display device, by which productivity is improved, can be provided.

As shown in FIGS. 26A and 26B, driver ICs may be mounted for both the scan line driver circuit and the signal line driver circuit. In this case, it is preferable to use the driver ICs having different specifications for the scan line driver circuit and the signal line driver circuit.

In the pixel region, signal lines and scan lines intersect to form a matrix, and a transistor is arranged corresponding to each intersection. In the present invention, a TFT including an amorphous semiconductor or a semi-amorphous semiconductor for a channel portion is used as the transistor arranged in the pixel region. The amorphous semiconductor is formed by a method such as a plasma CVD method or a sputtering method. The semi-amorphous semiconductor can be formed by a plasma CVD method at a temperature of 300° C. or lower; for example, a film thickness necessary for forming the transistor is formed in a short time even in the case of using, for example, a non-alkaline glass substrate having an external size of 550 mm×650 mm. The feature of such a manufacturing technique is effective in manufacturing a large-screen display device. Further, a semi-amorphous TFT can obtain field effect mobility of 2 to 10 cm$^2$ V·sec by formation of a channel formation region using an SAS. When the present invention is used, a pattern can be formed into a desired shape with high controllability; therefore, a minute wiring can be stably formed without generation of a defect such as a short circuit. Thus, a display panel where system-on-panel is realized can be manufactured.

The scan line driver circuit can also be formed over the same substrate as the pixel region by using a TFT having a semiconductor layer formed of an SAS. When a TFT having a semiconductor layer formed of an AS is used, driver ICs are preferably mounted for both the scan line driver circuit and the signal line driver circuit.

In the latter case, it is preferable to use driver ICs having different specifications for the scan line driver circuit and the signal line driver circuit. For example, a transistor included in the scan line driver IC is required to withstand a voltage of approximately 30 V and since a drive frequency is less than or equal to 100 kHz, high-speed operation is not relatively required. Therefore, it is preferable to set a channel length (L) of the transistor included in the scan line driver sufficiently long. On the other hand, a transistor of the signal line driver IC is required to withstand a voltage of only approximately 12 V and since a drive frequency is around 65 MHz at 3 V, high-speed operation is required. Therefore, it is preferable to set a channel length and the like of the transistor included in the driver with a micron rule.

A method for mounting each driver IC is not particularly limited, and a COG method, a wire bonding method, or a TAB method can be employed.

By setting the thicknesses of each driver IC and the counter substrate to be equal to each other, there is almost no difference in height between each driver IC and the counter substrate, which contributes to thinning of a display device as a whole. Further, by forming both the substrates of the same material, thermal stress is not generated and characteristics of a circuit including a TFT are not damaged even when a temperature change is caused in the display device. Furthermore, by mounting each driver IC, which has a longer side than an IC chip, for the driver circuit as described in this embodiment mode, the number of driver ICs to be mounted for one pixel region can be reduced.

As described above, each driver circuit can be incorporated into a display panel.

Embodiment Mode 13

Described below is an example in which a semiconductor layer is formed of an amorphous semiconductor or an SAS and a scan line driver circuit is formed over a substrate in each display panel (an EL display panel or a liquid crystal display panel) manufactured in accordance with Embodiment Modes 4 to 11.

Figure 31:
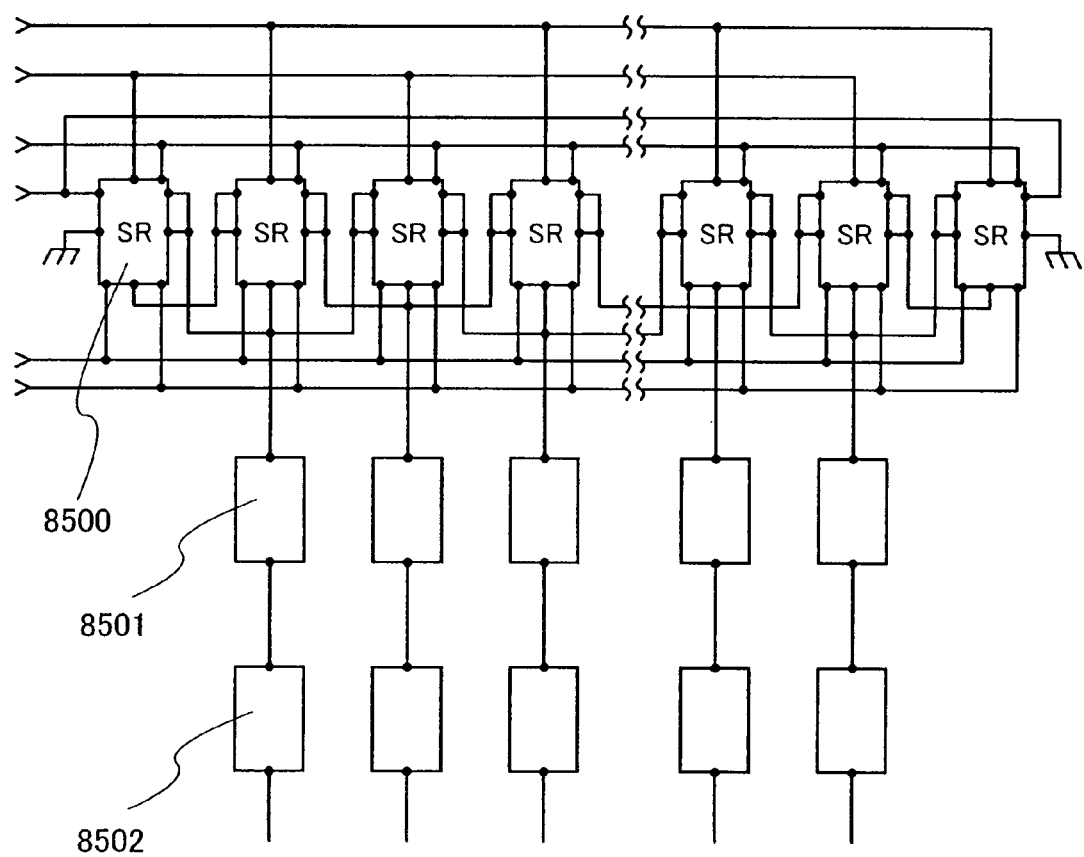
FIG. 31 is a diagram showing a circuit structure in the case where a scan line driver circuit includes a TFT in a display panel of the present invention.

FIG. 31 is a block diagram of a scan line driver circuit including an n-channel TFT which uses an SAS with an electron field-effect mobility of 1 to 15 cm$^2$/V·sec.

In FIG. 31, a block 8500 corresponds to a pulse output circuit for outputting sampling pulses for one stage. A shift register includes n pulse output circuits. Reference numeral 8501 denotes a buffer circuit and a pixel 8502 is connected to the buffer circuit.

Figure 32:
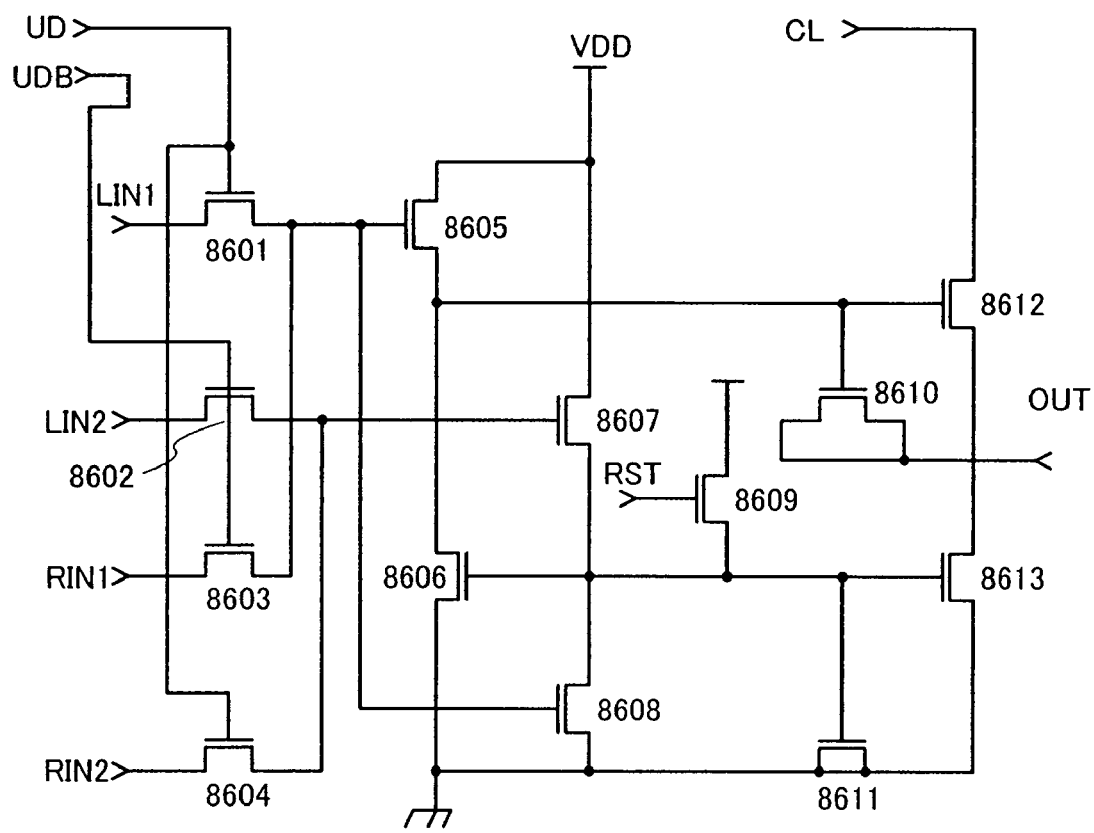
FIG. 32 is a diagram showing a circuit structure in the case where a scan line driver circuit includes a TFT in a display panel of the present invention (a shift register circuit).

FIG. 32 shows a specific structure of the pulse output circuit 8500, which includes n-channel TFTs 8601 to 8613. In this case, the size of each TFT may be determined in consideration of operation characteristics of an n-channel TFT using an SAS. For example, when the channel length is set to be 8 μm, the channel width can be set in the range of 10 to 80 μm.

Figure 33:
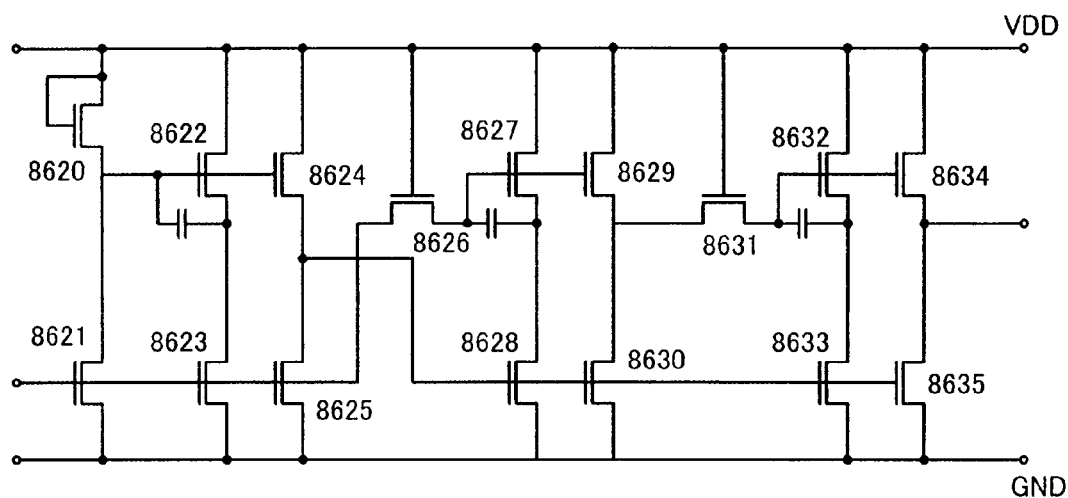
FIG. 33 is a diagram showing a circuit structure in the case where a scan line driver circuit includes a TFT in a display panel of the present invention (a buffer circuit).

Further, a specific structure of the buffer circuit 8501 is shown in FIG. 33. Similarly, the buffer circuit includes n-channel TFTs 8620 to 8635. In this case, the size of each TFT may be determined in consideration of operation characteristics of an n-channel TFT using an SAS. For example, when the channel length is set to be 10 μm, the channel width can be set in the range of 10 to 1800 μm.

In order to realize such a circuit, the TFTs are necessary to be connected to one another with a wiring.

As described above, each driver circuit can be incorporated into a display panel.

Embodiment Mode 14

Figure 16:
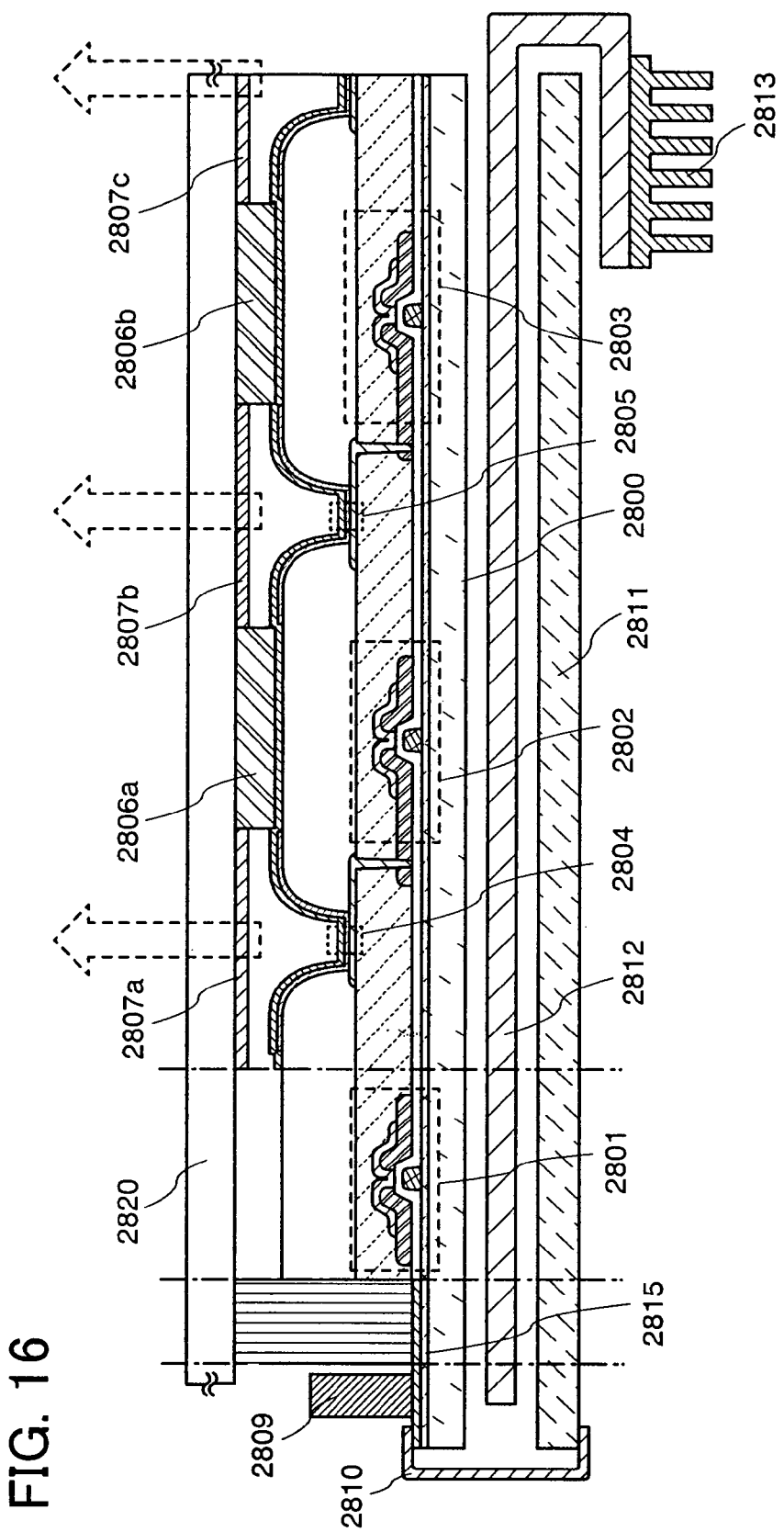
FIG. 16 is a cross-sectional diagram showing a structural example of a display module of the present invention.

This embodiment mode is described with reference to FIG. 16. FIG. 16 shows an example in which an EL display module is formed using a TFT substrate 2800 which is manufactured by the present invention. In FIG. 16, a pixel region including pixels is formed over the TFT substrate 2800.

In FIG. 16, outside the pixel region and between a driver circuit and the pixel region, a protective circuit portion 2801 which is a similar TFT to the pixel region or the TFT functioning like a diode by connection between a gate and one of source and drain thereof, is provided. As a driver circuit 2809, a driver IC formed using a single crystalline semiconductor, a stick driver IC formed using a polycrystalline semiconductor film over a glass substrate, a driver circuit formed using an SAS, or the like is applied.

The TFT substrate 2800 is attached firmly to a sealing substrate 2820 with spacers 2806a and 2806b formed by a droplet discharging method interposed therebetween. The spacers are preferably provided to keep a distance between the two substrates constant even when the substrates are thin and/or an area of the pixel region is increased. A space between the TFT substrate 2800 and the sealing substrate 2820 over light-emitting elements 2804 and 2805 connected to TFTs 2802 and 2803 respectively, may be filled with a resin material having a light-transmitting property against at least visible light, and solidified. Alternatively, the space may be filled with anhydrous nitrogen or an inert gas.

FIG. 16 shows the case where the light-emitting elements 2804 and 2805 are top-emission type and light is emitted in each direction denoted by arrows shown in the drawing. Multicolor display can be performed by making pixels to emit light of different colors of red, green, and blue. At this time, color purity of light emitted to outside can be improved by providing colored layers 2807a, 2807b, and 2807c corresponding to respective colors on a sealing substrate 2820 side. Moreover, pixels formed as white light-emitting elements may be combined with the colored layers 2807a, 2807b, and 2807c.

The driver circuit 2809 which is an external circuit is connected to a scan line or signal line connection terminal which is provided at one end of an external circuit board 2811, by a wiring board 2810. In addition, a heat pipe 2813 which is a highly efficient thermal conductive device with a pipe shape and a heat sink 2812, which are used for radiating heat to the outside of the device, may be provided to be in contact with or adjacent to the TFT substrate 2800 to increase a heat radiation effect.

Note that FIG. 16 shows the top-emission EL module; however, a bottom-emission structure may be employed by changing the structure of each light-emitting element or the arrangement of the external circuit board. It is needless to say that a dual-emission structure in which light is emitted from both of a top surface and a bottom surface may be used. In the case of a top-emission structure, an insulating layer serving as a partition wall may be colored and used as a black matrix. This partition wall can be formed by a droplet discharging method, and it may be formed by mixing a black resin of a pigment material, carbon black, or the like into a resin material such as polyimide, and a stacked layer thereof may also be used as the partition wall.

Further, in an EL display module, reflected light of light entering from outside may be blocked with the use of a retardation film or a polarizing plate. In a top-emission display device, an insulating layer serving as a partition wall may be colored and used as a black matrix. This partition wall can also be formed by a droplet discharging method, and it may be formed by mixing a black resin of carbon black or the like into a black resin of a pigment material, or a resin material such as polyimide, and a stacked layer thereof may also be used as the partition wall. By a droplet discharging method, different materials may be discharged to the same region plural times to form the partition wall. A quarter wave (λ/4) plate or a half wave (λ/2) plate may be used as each retardation film such that light can be controlled. As a structure, there is a structure in which the light-emitting element, the sealing substrate (sealing member), the retardation films (the quarter wave plate (λ/4) and the half wave plate (λ/2)), and the polarizing plate are sequentially provided over a TFT element substrate, and light emitted from the light-emitting element is transmitted therethrough and is emitted to outside from a polarizing plate side. The retardation film or polarizing plate may be provided on a side from which light is emitted or may be provided on both sides in the case of a dual-emission display device in which light is emitted from both the sides. In addition, an anti-reflective film may be provided on the outer side of the polarizing plate. Accordingly, higher-definition and precise images can be displayed.

As for the TFT substrate 2800, a sealing structure may be formed by attaching a resin film using a sealing member or an adhesive resin to the side provide with the pixel region. Although glass sealing using a glass substrate is described in this embodiment mode, various sealing methods such as resin sealing using a resin, plastic sealing using plastics, and film sealing using a film can be employed. A gas barrier film which prevents water vapor from penetrating the resin film is preferably provided on the resin film. By employing a film sealing structure, further reduction in thickness and weight can be achieved.

This embodiment mode can be combined with any of Embodiment Modes 1 to 8, 12, and 13.

Embodiment Mode 15

This embodiment mode is described with reference to FIGS. 20A and 20B. FIGS. 20A and 20B show examples in which a liquid crystal display module is formed using a TFT substrate 2600 manufactured according to the present invention.

FIG. 20A is an example of a liquid crystal display module. The TFT substrate 2600 and a counter substrate 2601 are firmly attached to each other with a sealing member 2602, and a pixel region 2603 and a liquid crystal layer 2604 are provided therebetween to form a display region. A colored layer 2605 is necessary for performing color display, and colored layers corresponding to red, green, and blue respectively are provided for pixels in the case of an RGB mode. A polarizing plate 2606 is provided outside the counter substrate 2601, and a polarizing plate 2607 and a diffusing plate 2613 are provided outside the TFT substrate 2600. A light source includes a cold cathode tube 2610 and a reflective plate 2611, and a circuit substrate 2612 is connected to the TFT substrate 2600 by a flexible wiring board 2609 and includes an external circuit such as a control circuit or a power source circuit. In addition, a retardation film may be interposed between the polarizing plate and the liquid crystal layer.

For the liquid crystal display module, the following can be used: a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like.

FIG. 20B shows an example of an FS-LCD (Field Sequential-LCD) in which an OCB mode is applied to the liquid crystal display module of FIG. 20A. The FS-LCD emits light of red, green, and blue during one frame period and can perform color display by combining images with time division. Since light of each color is emitted by a light-emitting diode, a cold cathode tube, or the like, a color filter is not necessary. Thus, it is not necessary to arrange color filters of three primary colors and restrict the display region of each color, and display of all three colors can be performed in any region. On the other hand, since light of three colors is emitted during one frame period, high-speed response of liquid crystals is necessary. An FLC mode, an OCB mode, or the like using an FS method is employed for a display device of the present invention, so that high performance and high image quality display device and liquid crystal television set can be completed.

A liquid crystal layer of an OCB mode has a so-called π-cell structure. In the π-cell structure, liquid crystal molecules are aligned so that their pretilt angles are plane-symmetric along a center plane between an active matrix substrate and a counter substrate. An orientation state in the π-cell structure is splay orientation when voltage is not applied between the substrates, and then shifts to bend orientation when voltage is applied therebetween. With this bend orientation state, white display is obtained. When voltage is applied further, liquid crystal molecules of bend-orientation get orientated to be perpendicular to both the substrates so that light is not transmitted. Note that by employing the OCB mode, response which is 10 times as rapid as that of a conventional TN mode can be achieved.

Moreover, as a mode for the FS method, an HV (Half-V)-FLC, an SS (Surface Stabilized)-FLC, or the like using a ferroelectric liquid crystal (FLC) capable of high-speed operation may be used. The OCB mode can use a nematic liquid crystal having relatively low viscosity, and the HV-FLC or the SS-FLC can use a smectic liquid crystal having a ferroelectric phase.

Moreover, optical response speed of a liquid crystal display module is increased by narrowing the cell gap of the liquid crystal display module. In addition, the optical response speed can also be increased by decreasing the viscosity of the liquid crystal material. The increase in response speed is particularly effective when a pixel pitch in a pixel region of a TN mode liquid crystal display module is 30 μm or less. Further, further increase in response speed is possible by an overdrive method in which an applied voltage is increased (or decreased) for a moment.

FIG. 20B shows a transmissive liquid crystal display module, in which a red light source 2910a, a green light source 2910b, and a blue light source 2910c are provided as light sources. A control portion 2912 is provided in order to switch on or off of the red light source 2910a, the green light source 2910b, and the blue light source 2910c. The control portion 2912 controls light emission of each color, so that light enters the liquid crystals, and images are combined using time division, thereby color display is performed.

Thus, by using the present invention, a high-definition and highly reliable liquid crystal display module can be manufactured.

This embodiment mode can be combined with any of Embodiment Modes 1 to 3, and 9 to 13.

Embodiment Mode 16

Figure 27:
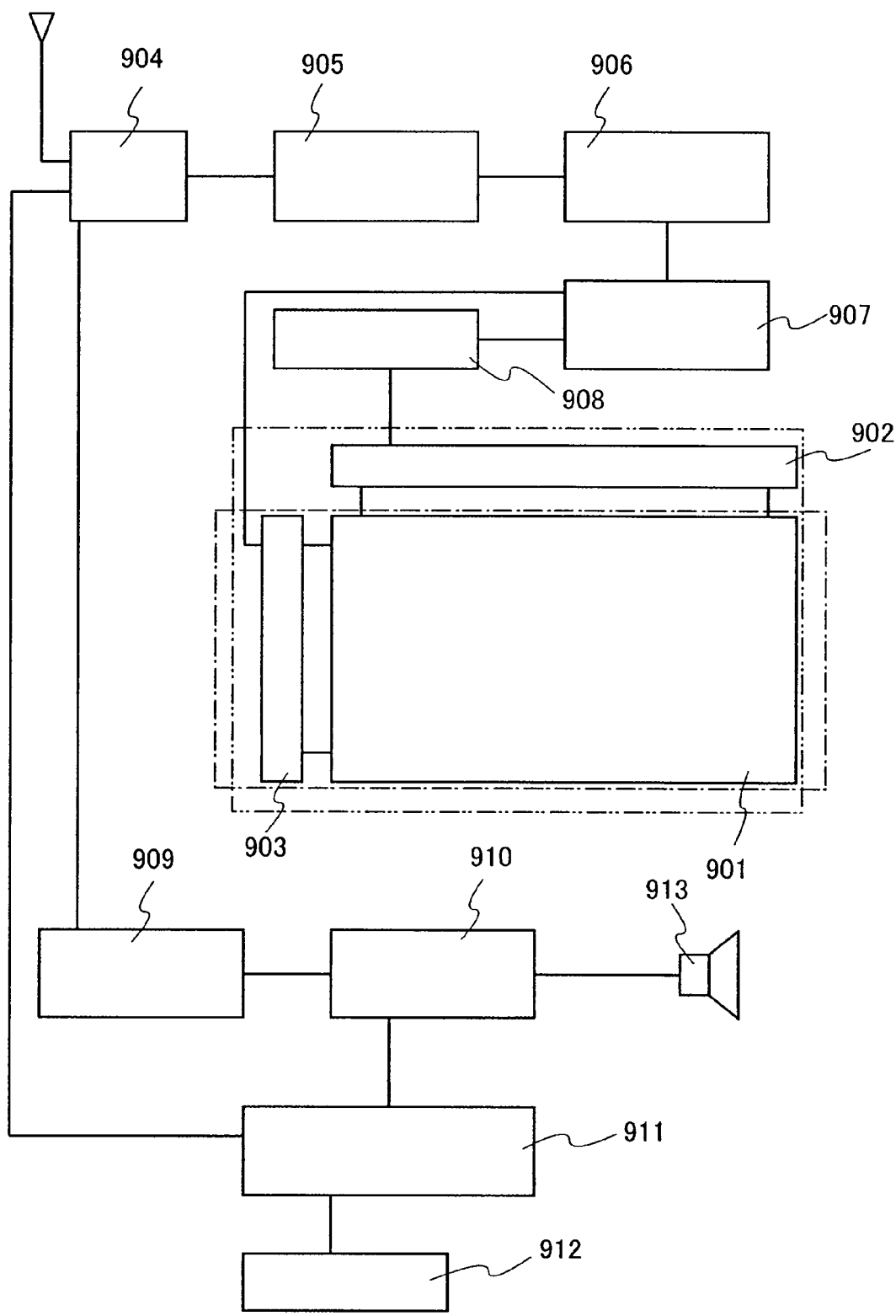
FIG. 27 is a block diagram showing a main structure of an electronic device to which the present invention is applied.

A television set (also called just a TV or a television receiver) can be completed using the display device formed by the present invention. FIG. 27 is a block diagram showing a main structure of a television set.

FIG. 25A is a top diagram showing a structure of a display panel of the present invention, in which the pixel region 2701 in which the pixels 2702 are arranged in matrix, the scan line input terminal 2703, and the signal line input terminal 2704 are formed over the substrate 2700 having an insulating surface. The number of pixels may be set in accordance with various standards: the number of pixels of XGA for RGB full-color display may be 1024×768×3 (RGB), that of UXGA for RGB full-color display may be 1600×1200×3 (RGB), and that corresponding to a full-spec high vision for RGB full-color display may be 1920×1080×3 (RGB).

Scan lines extended from the scan line input terminal 2703 intersect with signal lines extended from the signal line input terminal 2704, and the pixels 2702 are arranged in matrix at the intersections. Each pixel 2702 in the pixel region 2701 is provided with a switching element and a pixel electrode layer connected to the switching element. A typical example of the switching element is a TFT. A gate electrode layer side of the TFT is connected to the scan line, and a source or drain side thereof is connected to the signal line, so that each pixel can be controlled independently by signals inputted from outside.

FIG. 25A shows a structure of the display panel in which signals inputted to the scan lines and signal lines are controlled by an external driver circuit. Alternatively, the driver ICs 2751 may be mounted on the substrate 2700 by a COG (Chip On Glass) method as shown in FIG. 26A. As another mounting mode, a TAB (Tape Automated Bonding) method may be employed as shown in FIG. 26B. Each driver IC may be formed using a single crystalline semiconductor substrate or may be formed using a TFT over a glass substrate. In FIGS. 26A and 26B, each driver IC 2751 is connected to the FPC (Flexible Printed Circuit) 2750.

Further, in the case where the TFT provided in each pixel is formed using a semiconductor having crystallinity, the scan line driver circuit 3702 can also be formed over the substrate 3700 as shown in FIG. 25B. In FIG. 25B, the pixel region 3701 is controlled by an external driver circuit, similarly to that, which is connected to the signal line input terminal 3704, in FIG. 25A. In the case where the TFT provided in each pixel is formed using a polycrystalline (microcrystalline) semiconductor, a single crystalline semiconductor, or the like with high mobility, the pixel region 4701, the scan line driver circuit 4702, and the signal line driver circuit 4704 can be formed over the substrate 4700 as shown in FIG. 25C.

In FIG. 27, a display panel can be formed to have any mode of the following: the structure as shown in FIG. 25A, in which only a pixel region 901 is formed over a substrate, and a scan line driver circuit 903 and a signal line driver circuit 902 are mounted by a TAB method as shown in FIG. 26B or by a COG method as shown in FIG. 26A; the structure as shown in FIG. 25B, in which a TFT is formed, the pixel region 901 and the scan line driver circuit 903 are formed over the substrate, and the signal line driver circuit 902 is separately mounted as a driver IC; the structure as shown in FIG. 25C, in which the pixel region 901, the signal line driver circuit 902, and the scan line driver circuit 903 are formed over the substrate; and the like.

In FIG. 27, as a further structure of the external circuit, a video signal amplifier circuit 905 for amplifying a video signal among signals received by a tuner 904, a video signal processing circuit 906 for converting signals outputted from the video signal amplifier circuit 905 into chrominance signals corresponding to colors of red, green, and blue respectively, a control circuit 907 for converting the video signal to be inputted to each driver IC, and the like are provided on a video signal input side. The control circuit 907 outputs signals to both the scan line side and the signal line side. In the case of digital driving, a signal dividing circuit 908 may be provided on the signal line side and an input digital signal may be divided into m signals to be supplied.

Among signals received by the tuner 904, an audio signal is transmitted to an audio signal amplifier circuit 909, and an output of the audio signal amplifier circuit 909 is supplied to a speaker 913 through an audio signal processing circuit 910. A control circuit 911 receives control information on a receiving station (receiving frequency) or sound volume from an input portion 912 and transmits signals to the tuner 904 and the audio signal processing circuit 910.

Figure 28A:
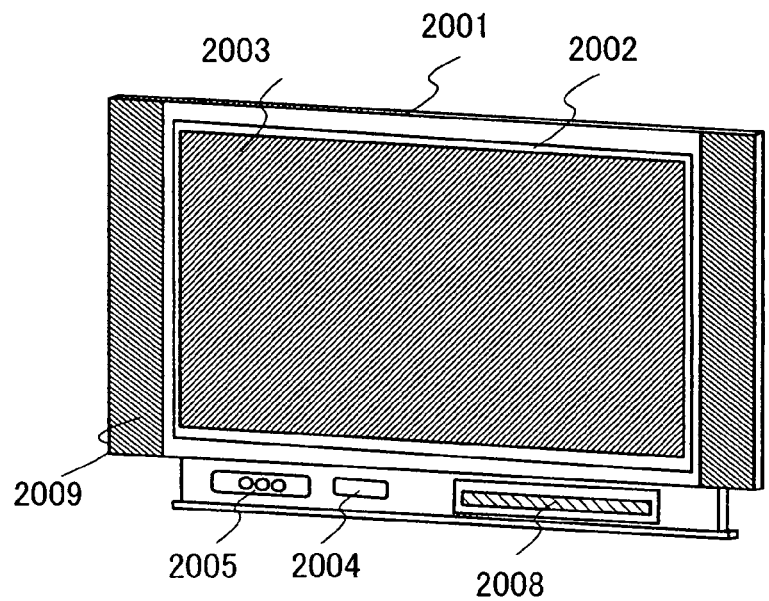
FIGS. 28A and 28B are diagrams each showing an electronic device to which the present invention is applied.
Figure 28B:
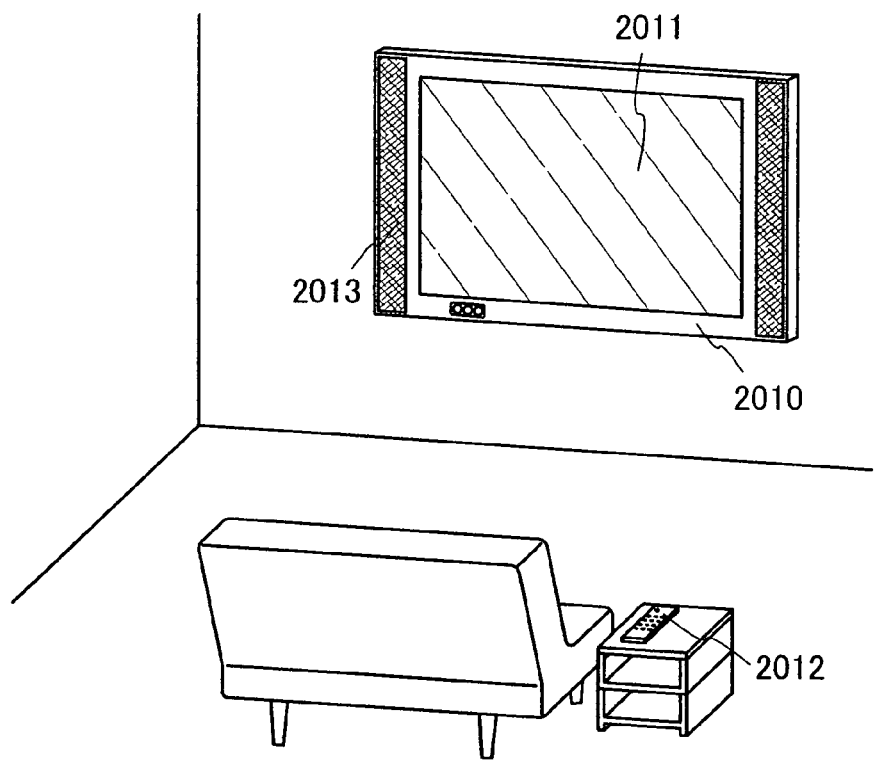

A television set can be completed by incorporating the display module into a chassis as shown in FIGS. 28A and 28B. When a liquid crystal display module is used as the display module, a liquid crystal television set can be manufactured. When an EL display module is used, an EL television set can be manufactured. Further, a plasma television, electronic paper, or the like can be manufactured. In FIG. 28A, a main screen 2003 is formed using the display module, and a speaker portion 2009, an operation switch, and the like are provided as its accessory equipment. Thus, a television set can be completed by the present invention.

A display panel 2002 is incorporated in a chassis 2001. With the use of a receiver 2005, in addition to reception of general TV broadcast, communication of information can also be performed either in one way (from a transmitter to a receiver) or in two ways (between a transmitter and a receiver or between receivers) by connection to a wired or wireless communication network through a modem 2004. The television set can be operated by switches incorporated in the chassis or by a remote control device 2006 separated from the main body. A display portion 2007 that displays information to be outputted may also be provided in this remote control device.

Further, in the television set, a structure for displaying a channel, sound volume, or the like may be additionally provided by providing a subscreen 2008 using a second display panel in addition to the main screen 2003. In this structure, the main screen 2003 and the subscreen 2008 can be formed using the liquid crystal display panel of the present invention, or the main screen 2003 may be formed using an EL display panel superior in viewing angle whereas the subscreen 2008 may be formed using a liquid crystal display panel capable of displaying with low power consumption. Further, in order to prioritize low power consumption, a structure in which the main screen 2003 is formed using a liquid crystal display panel, the subscreen 2008 is formed using an EL display panel, and the sub-screen is able to flash on and off may be employed. By the present invention, a highly reliable display device can be manufactured even when such a large substrate and many TFTs and electronic components are used.

FIG. 28B shows a television set having a large display portion, e.g., a 20-inch to 80-inch display portion, which includes a chassis 2010, a display portion 2011, a remote control device 2012 which is an operation portion, a speaker portion 2013, and the like. The present invention is applied to manufacture the display portion 2011. The television set shown in FIG. 28B is a wall-hanging type, and does not need a wide space.

It is necessary to say that the present invention is not limited to the television set and is also applicable to various uses as a display medium having a large area, such as a monitor of a personal computer, an information display board at a train station, an airport, or the like, or an advertisement display board on the street.

This embodiment mode can be freely combined with any of Embodiment Modes 1 to 15 as appropriate.

Embodiment Mode 17

Electronic devices of the present invention include a television set (also simply called a TV or a television receiver), a camera such as a digital camera or a digital video camera, a mobile phone set (also simply called a mobile phone), a portable information terminal such as a PDA, a portable game machine, a monitor for a computer, a computer, an audio reproducing device such as a car audio set, an image reproducing device provided with a recording medium, such as a home-use game machine, and the like. Specific examples thereof are described with reference to FIGS. 29A to 29E.

Figure 29A:
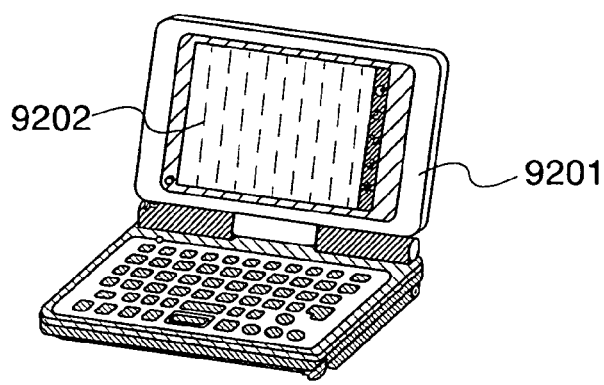
FIGS. 29A to 29E are diagrams each showing an electronic device to which the present invention is applied.

A portable information terminal shown in FIG. 29A includes a main body 9201, a display portion 9202, and the like. The display device of the present invention can be applied to the display portion 9202. Accordingly, since manufacturing through a simplified process at low cost is possible, a highly reliable portable information terminal can be provided at low cost.

Figure 29B:
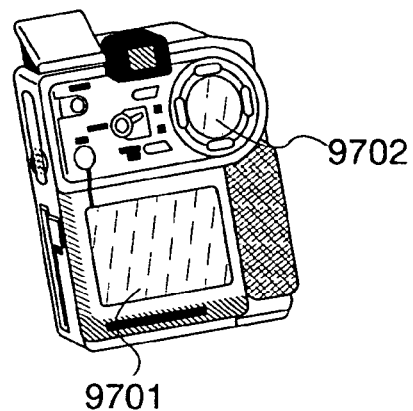

A digital video camera shown in FIG. 29B includes a display portion 9701, a display portion 9702, and the like. The display device of the present invention can be applied to the display portion 9701. Accordingly, since manufacturing through a simplified process at low cost is possible, a highly reliable digital video camera can be provided at low cost.

Figure 29C:
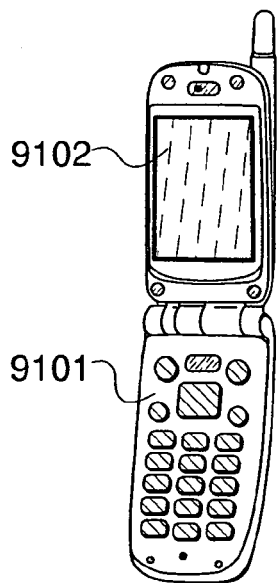

A mobile phone shown in FIG. 29C includes a main body 9101, a display portion 9102, and the like. The display device of the present invention can be applied to the display portion 9102. Accordingly, since manufacturing through a simplified process at low cost is possible, a highly reliable mobile phone can be provided at low cost.

Figure 29D:
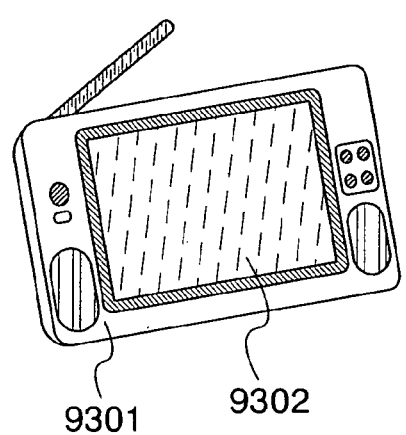

A portable television set shown in FIG. 29D includes a main body 9301, a display portion 9302, and the like. The display device of the present invention can be applied to the display portion 9302. Accordingly, since manufacturing through a simplified process at low cost is possible, a highly reliable television set can be provided at low cost. Further, the display device of the present invention can be applied to various types of television sets including a small-sized one mounted on a portable terminal such as a mobile phone, a medium-sized one that is portable, and a large-sized (e.g., 40-inch or larger) one.

Figure 29E:
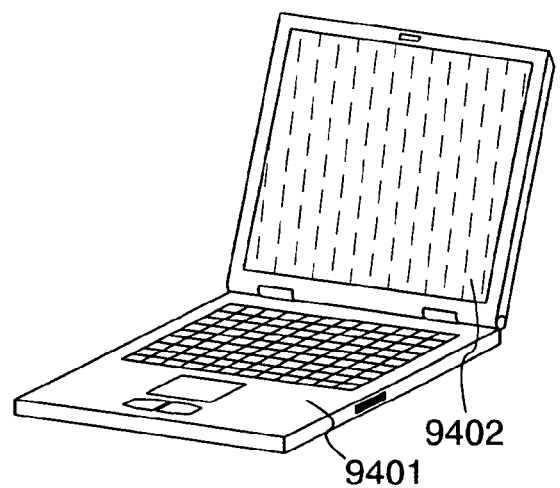

A portable computer shown in FIG. 29E includes a main body 9401, a display portion 9402, and the like. The display device of the present invention can be applied to the display portion 9402. Accordingly, since manufacturing through a simplified process at low cost is possible, a highly reliable computer can be provided at low cost.

As described above, by using the display device of the present invention, a high-performance electronic device that can display a high quality image with excellent visibility can be provided.

This embodiment mode can be freely combined with any of Embodiment Modes 1 to 16 as appropriate.

This application is based on Japanese Patent Application serial no. 2006-205711 filed in Japan Patent Office on Jul. 28, 2006, the entire contents of which are hereby incorporated by reference.

What is claimed is:

1. A method for manufacturing a display device, comprising the steps of:
   forming a light-absorbing layer over an insulating surface;
   forming an insulating layer over the light-absorbing layer;
   selectively irradiating the light-absorbing layer and the insulating layer with laser light to remove an irradiated region of the insulating layer and form a first opening in the insulating layer so that a portion of the light-absorbing layer is exposed;
   selectively removing the portion of the light-absorbing layer by using the insulating layer having the first opening as a mask and forming a second opening in the insulating layer and the light-absorbing layer so that a portion of the insulating surface is exposed; and
   forming a conductive layer in the second opening, the conductive layer being in contact with the light-absorbing layer,
   wherein the light-absorbing layer comprises a conductive material.

2. A method for manufacturing a display device, comprising the steps of:
   forming a first conductive layer over an insulating surface;
   forming a light-absorbing layer over the first conductive layer;
   forming an insulating layer over the light-absorbing layer;
   selectively irradiating the light-absorbing layer and the insulating layer with laser light to remove an irradiated region of the light-absorbing layer and an irradiated region of the insulating layer and form a first opening in the light-absorbing layer and the insulating layer so that a portion of the first conductive layer is exposed;
   selectively removing the portion of the first conductive layer by using the light-absorbing layer and the insulating layer having the first opening as a mask and forming a second opening in the insulating layer, the light-absorbing layer, and the first conductive layer so that a portion of the insulating surface is exposed; and
   forming a second conductive layer in the second opening, the second conductive layer being in contact with the light-absorbing layer, the second conductive layer,
   wherein the light-absorbing layer comprises a conductive material.

3. The method for manufacturing the display device, according to claim 2, wherein the first conductive layer is also irradiated with the laser light so that an irradiated region of the first conductive layer is removed when the light-absorbing layer and the insulating layer are irradiated.

4. The method for manufacturing the display device according to claim 1, wherein the light-absorbing layer comprises at least one selected from the group consisting of chromium, tantalum, silver, molybdenum, nickel, titanium, cobalt, copper, and aluminum.

5. The method for manufacturing the display device according to claim 2, wherein the light-absorbing layer comprises at least one selected from the group consisting of chromium, tantalum, silver, molybdenum, nickel, titanium, cobalt, copper, and aluminum.

6. The method for manufacturing the display device according to claim 1, wherein the insulating layer transmits the laser light.

7. The method for manufacturing the display device according to claim 2, wherein the insulating layer transmits the laser light.

8. The method for manufacturing the display device according to claim 1, wherein the display device is incorporated in one selected from the group consisting of a television set, a portable information terminal, a camera, a mobile phone, and a computer.

9. The method for manufacturing the display device according to claim 2, wherein the display device is incorporated in one selected from the group consisting of a television set, a portable information terminal, a camera, a mobile phone, and a computer.

10. A method for manufacturing a display device, comprising the steps of:
    forming a first conductive layer over an insulating surface;
    forming a light-absorbing layer over the first conductive layer;
    forming an insulating layer over the light-absorbing layer;
    selectively irradiating the light-absorbing layer and the insulating layer with laser light to remove an irradiated region of the light-absorbing layer and an irradiated region of the insulating layer and form a first opening in the light-absorbing layer and the insulating layer so that a portion of the first conductive layer is exposed;
    selectively removing the portion of the first conductive layer by using the light-absorbing layer and the insulating layer having the first opening as a mask and forming a second opening in the insulating layer, the light-absorbing layer, and the first conductive layer so that a portion of the insulating surface is exposed; and
    forming a second conductive layer in the second opening, the second conductive layer being in contact with the light-absorbing layer and the second conductive layer,
    wherein the light-absorbing layer comprises a metal.

11. The method for manufacturing the display device, according to claim 10, wherein the first conductive layer is also irradiated with the laser light so that an irradiated region of the first conductive layer is removed when the light-absorbing layer and the insulating layer are irradiated.

12. The method for manufacturing the display device according to claim 10, wherein the light-absorbing layer comprises at least one selected from the group consisting of chromium, tantalum, silver, molybdenum, nickel, titanium, cobalt, copper, and aluminum.

13. The method for manufacturing the display device according to claim 10, wherein the insulating layer transmits the laser light.

14. The method for manufacturing the display device according to claim 10, wherein the display device is incorporated in one selected from the group consisting of a television set, a portable information terminal, a camera, a mobile phone, and a computer.

15. A method for manufacturing a display device, comprising the steps of:
forming a first conductive layer over an insulating surface;
forming a light-absorbing layer over the first conductive layer;
forming an insulating layer over the light-absorbing layer;
selectively irradiating the light-absorbing layer and the insulating layer with laser light to remove an irradiated region of the light-absorbing layer and an irradiated region of the insulating layer and form a first opening in the light-absorbing layer and the insulating layer so that a portion of the first conductive layer is exposed;
selectively removing the portion of the first conductive layer by using the light-absorbing layer and the insulating layer having the first opening as a mask and forming a second opening in the insulating layer, the light-absorbing layer, and the first conductive layer so that a portion of the insulating surface is exposed; and
forming a second conductive layer in the second opening, the second conductive layer being in contact with the light-absorbing layer and the second conductive layer,
wherein the first conductive layer comprises a first metal, and
wherein the light-absorbing layer comprises a second metal having a melting point lower than a melting point of the first metal.

16. The method for manufacturing the display device, according to claim 15, wherein the first conductive layer is also irradiated with the laser light so that an irradiated region of the first conductive layer is removed when the light-absorbing layer and the insulating layer are irradiated.

17. The method for manufacturing the display device according to claim 15, wherein the light-absorbing layer comprises at least one selected from the group consisting of chromium, tantalum, silver, molybdenum, nickel, titanium, cobalt, copper, and aluminum.

18. The method for manufacturing the display device according to claim 15, wherein the insulating layer transmits the laser light.

19. The method for manufacturing the display device according to claim 15, wherein the display device is incorporated in one selected from the group consisting of a television set, a portable information terminal, a camera, a mobile phone, and a computer.

20. A method for manufacturing a semiconductor device, comprising the steps of:
forming a first metal layer over an insulating surface;
forming a second metal layer over the first metal layer, the first metal layer having a higher melting point than the first metal layer;
forming an insulating layer over the second metal layer;
directing laser light to a selected portion of the insulating layer to remove at least the selected portion of the insulating layer and a portion of the second metal layer below the selected portion of the insulating layer, thereby, forming a first opening through the insulating layer and the second metal layer so that a portion of the first metal layer is exposed;
selectively removing the portion of the first metal layer by supplying an etching material into the first opening, thereby, forming a second opening in at least the first metal layer so that a portion of the insulating surface is exposed; and
forming a conductive layer over the insulating layer so that the conductive layer contacts the first metal layer in the second opening.

21. The method for manufacturing the semiconductor device according to claim 20, wherein the first metal layer is a wiring.

22. The method for manufacturing the semiconductor device according to claim 20, wherein the first metal layer comprises a material selected from the group consisting of tungsten, tantalum, titanium and molybdenum.

23. The method for manufacturing the semiconductor device according to claim 20, wherein the second metal layer comprises a material selected from the group consisting of chromium, tantalum, silver, molybdenum, nickel, titanium, cobalt, copper, and aluminum.

24. The method for manufacturing the semiconductor device according to claim 20, wherein the etching material is supplied as a gas.

25. The method for manufacturing the semiconductor device according to claim 20, wherein the etching material is supplied as a liquid.

26. A method for manufacturing a semiconductor device, comprising the steps of:
forming a wiring over an insulating surface;
forming an insulating layer on the wiring;
irradiating a selected region of the wiring through the insulating layer so that a portion of the insulating layer over the selected region of the wiring is removed, thereby, forming a first opening through the insulating layer so that a portion of the wiring is exposed;
selectively removing the portion of the wiring by supplying an etching material into the first opening, thereby, forming a second opening at least in the wiring so that a portion of the insulating surface is exposed; and
forming a conductive layer over the insulating layer so that the conductive layer contacts the wiring in the second opening.

27. The method for manufacturing the semiconductor device according to claim 26, wherein the wiring comprises a material selected from the group consisting of chromium, tantalum, silver, molybdenum, nickel, titanium, cobalt, copper, and aluminum.

28. The method for manufacturing the semiconductor device according to claim 26, wherein the etching material is supplied as a gas.

29. The method for manufacturing the semiconductor device according to claim 26, wherein the etching material is supplied as a liquid.

30. The method for manufacturing the display device according to claim 1,
wherein an insulating film is formed at a surface of the portion of the light-absorbing layer by the irradiation of laser light, and
wherein the insulating film is removed in the step of selectively removing the portion of the light-absorbing layer.

31. The method for manufacturing the display device according to claim 2, wherein an insulating film is formed at a surface of the portion of the first conductive layer by the irradiation of laser light, and wherein the insulating film is removed in the step of selectively removing the portion of the first conductive layer.

32. The method for manufacturing the display device according to claim 10, wherein an insulating film is formed at a surface of the portion of the first conductive layer by the irradiation of laser light, and wherein the insulating film is removed in the step of selectively removing the portion of the first conductive layer.

33. The method for manufacturing the display device according to claim 15, wherein an insulating film is formed at a surface of the portion of the first conductive layer by the irradiation of laser light, and wherein the insulating film is removed in the step of selectively removing the portion of the first conductive layer.

34. The method for manufacturing the semiconductor device according to claim 20, wherein the selected portion of the insulating layer and the portion of the second metal layer below the selected portion of the insulating layer is irradiated by the step of directing laser light to the selected portion of the insulating layer, wherein an insulating film is formed at a surface of the portion of the first metal layer by the irradiation of laser light, and wherein the insulating film is removed in the step of selectively removing the portion of the first metal layer.

35. The method for manufacturing the semiconductor device according to claim 26, wherein an insulating film is formed at a surface of the portion of the wiring by the irradiation of laser light, and wherein the insulating film is removed in the step of selectively removing the portion of the wiring.

* * * * *

UNITED STATES PATENT AND TRADEMARK OFFICE
CERTIFICATE OF CORRECTION

PATENT NO. : 8,183,067 B2
APPLICATION NO. : 11/881233
DATED : May 22, 2012
INVENTOR(S) : Shunpei Yamazaki et al.

It is certified that error appears in the above-identified patent and that said Letters Patent is hereby corrected as shown below:

In the Specification:

Column 31, Line 3; Change "R, Q and B" to --R, G and B--.

Column 33, Line 52; Change "getting)" to --(jetting)--.

Column 33, Line 55; Change "betted)" to --(jetted)--.

Column 50, Lines 36-37; Change "R, Q and B" to --R, G and B--.

Column 71, Line 58; Change "In the n-cell structure" to --In the $\pi$-cell structure--.

Signed and Sealed this
Eleventh Day of September, 2012

David J. Kappos
*Director of the United States Patent and Trademark Office*